(12) United States Patent
Sweetland

(10) Patent No.: US 7,125,281 B2
(45) Date of Patent: Oct. 24, 2006

(54) SYSTEMS AND METHODS FOR CONNECTING ELECTRICAL COMPONENTS

(75) Inventor: Matthew Sweetland, Bedford, MA (US)

(73) Assignee: Tribotek, Inc., Burlington, MA (US)

( * ) Notice: Subject to any disclaimer, the term of this patent is extended or adjusted under 35 U.S.C. 154(b) by 0 days.

(21) Appl. No.: 11/170,283

(22) Filed: Jun. 29, 2005

(65) Prior Publication Data

US 2005/0239329 A1    Oct. 27, 2005

Related U.S. Application Data

(62) Division of application No. 10/619,210, filed on Jul. 14, 2003.

(51) Int. Cl.
*H01R 12/24* (2006.01)
(52) U.S. Cl. .......................................... 439/495; 439/67
(58) Field of Classification Search ................ 439/495, 439/775, 492, 499, 595–596, 66–67, 329, 439/591, 482, 930; 361/218; 174/117 M; 29/705

See application file for complete search history.

(56) References Cited

U.S. PATENT DOCUMENTS

| | | | |
|---|---|---|---|
| 2,904,771 | A | 9/1959 | Burtt et al. |
| 3,257,500 | A | 6/1966 | Rusch, Jr. et al. |
| 3,447,120 | A | 5/1969 | Rask et al. |
| 3,476,870 | A | 11/1969 | Ross |
| 3,495,025 | A | 2/1970 | Ross |
| 3,631,298 | A | 12/1971 | Davis |
| 3,639,978 | A | 2/1972 | Schurman |

(Continued)

FOREIGN PATENT DOCUMENTS

EP    0512714    11/1992

(Continued)

*Primary Examiner*—J. F. Duverne
(74) *Attorney, Agent, or Firm*—Wilmer Cutler Pickering Hale and Dorr LLP

(57) ABSTRACT

The present disclosure is directed to methods and devices that use a contact interface for establishing an electrical connection with an electrical component. In certain exemplary embodiments, the contact interface of a device includes at least one loading fiber and at least one conductor having at least one contact point. The conductor(s) is coupled to a loading fiber so that an electrical connection can be established between the contact point(s) of the conductor(s) and the electrical component when the device is engaged with the electrical component. In certain exemplary embodiments, a conductor is woven with, or wound around, a loading fiber. In some exemplary embodiments, the conductor is comprised of a shaped contact and a conductive lead.

The present disclosure is also directed to methods and devices for testing the electrical integrity or functionality of an electrical component. In certain exemplary embodiments, the device includes a plurality of loading fibers, a plurality of conductors and a plurality of tensioning guides. Each conductor can be coupled to at least one loading fiber. The tensioning guides can be disposed on at least one side of each said conductor. In such embodiments, electrical connections can be established between at least a portion of the plurality of conductors and the electrical component when the device is engaged with the electrical component. At least a portion of the plurality of loading fibers may come into contact with the plurality of tensioning guides when the device is engaged with the electrical component. In one exemplary embodiment, the device comprises a burn-in socket device. In another exemplary embodiment, the device comprises a test socket device.

12 Claims, 45 Drawing Sheets

U.S. PATENT DOCUMENTS

| | | | |
|---|---|---|---|
| 3,654,381 A | 4/1972 | Copp | |
| 3,676,923 A | 7/1972 | Reimer | |
| 3,702,895 A | 11/1972 | de Sio | |
| 3,909,508 A | 9/1975 | Ross | |
| 3,927,284 A | 12/1975 | Andersson | |
| 4,082,423 A | 4/1978 | Glista et al. | |
| 4,123,899 A | 11/1978 | Windelbandt et al. | |
| 4,128,293 A | 12/1978 | Paoli | |
| 4,206,958 A | 6/1980 | Hall et al. | |
| 4,218,581 A | 8/1980 | Suzuki | |
| 4,462,657 A | 7/1984 | Snowdon et al. | |
| 4,463,323 A | 7/1984 | Piper | |
| 4,508,401 A | 4/1985 | Casciotti et al. | |
| 4,568,138 A | 2/1986 | McKenzie | |
| 4,639,054 A | 1/1987 | Kersbergen | |
| 4,651,163 A | 3/1987 | Sutera et al. | |
| 4,664,185 A | 5/1987 | Barnard | |
| 4,710,594 A | 12/1987 | Walling et al. | |
| 4,741,707 A | 5/1988 | Mondor, III | |
| 4,753,616 A | 6/1988 | Molitor | |
| 4,755,422 A | 7/1988 | Headrick et al. | |
| 4,778,950 A | 10/1988 | Lee et al. | |
| 4,813,881 A | 3/1989 | Kirby | |
| 4,820,170 A | 4/1989 | Redmond et al. | |
| 4,820,207 A | 4/1989 | Zic | |
| 4,940,426 A | 7/1990 | Redmond et al. | |
| 4,956,524 A | 9/1990 | Karkow | |
| 5,015,197 A | 5/1991 | Redmond et al. | |
| 5,070,605 A | 12/1991 | Daglow et al. | |
| 5,073,124 A | 12/1991 | Powell | |
| 5,109,596 A | 5/1992 | Driller et al. | |
| 5,163,837 A | 11/1992 | Rowlette, Sr. | |
| 5,176,535 A | 1/1993 | Redmond et al. | |
| 5,190,471 A | 3/1993 | Barile et al. | |
| 5,273,438 A | 12/1993 | Bradley et al. | |
| 5,281,160 A | 1/1994 | Walkup et al. | |
| 5,447,442 A | 9/1995 | Swart | |
| 5,468,164 A | 11/1995 | DeMissy | |
| 5,469,072 A | 11/1995 | Williams et al. | |
| 5,533,693 A | 7/1996 | Abildskov | |
| 5,564,931 A | 10/1996 | Fabian et al. | |
| 5,565,654 A | 10/1996 | Zell et al. | |
| 5,635,677 A | 6/1997 | Wood et al. | |
| 5,645,459 A | 7/1997 | Fitting | |
| 5,676,571 A | 10/1997 | Matthews | |
| 5,880,402 A | 3/1999 | Nugent | |
| 5,899,755 A | 4/1999 | Kline | |
| 5,899,766 A | 5/1999 | DeFeo | |
| 6,086,432 A | 7/2000 | Frinker et al. | |
| 6,102,246 A | 8/2000 | Goulet et al. | |
| 6,102,746 A | 8/2000 | Nania et al. | |
| 6,135,783 A | 10/2000 | Rathburn | |
| 6,210,771 B1 | 4/2001 | Post et al. | |
| 6,250,966 B1 | 6/2001 | Hashimoto et al. | |
| 6,264,476 B1 | 7/2001 | Li et al. | |
| 6,313,523 B1 | 11/2001 | Morris et al. | |
| 6,386,890 B1 | 5/2002 | Bhatt et al. | |
| 6,388,885 B1 | 5/2002 | Alexander et al. | |
| 6,439,894 B1 | 8/2002 | Li | |
| 6,471,555 B1 | 10/2002 | Creze | |
| 6,598,290 B1 | 7/2003 | Hembree et al. | |
| 6,666,690 B1 | 12/2003 | Ishizuka et al. | |
| 6,722,893 B1 | 4/2004 | Li et al. | |
| 6,762,941 B1 | 7/2004 | Roth | |
| 6,852,395 B1 | 2/2005 | Dhawan et al. | |

FOREIGN PATENT DOCUMENTS

| | | |
|---|---|---|
| EP | 0901191 | 3/1999 |
| EP | 0932172 | 7/1999 |
| JP | 61185818 | 8/1986 |
| JP | 06176624 | 6/1994 |
| JP | 06251819 | 9/1994 |
| JP | 07037433 | 2/1995 |
| JP | 08106939 | 4/1996 |
| WO | WO-95/08910 | 3/1995 |
| WO | WO-01/75788 | 10/2001 |

No Particle Traps

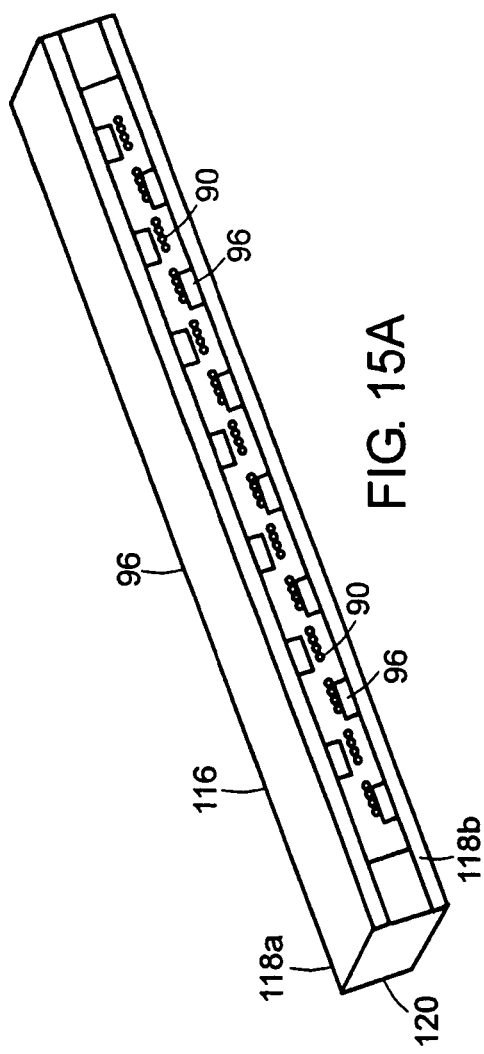
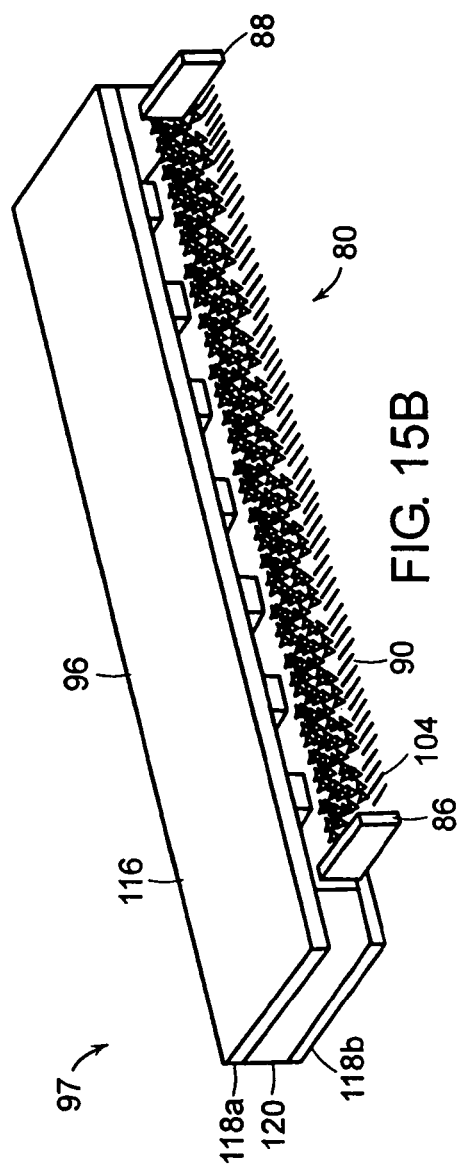

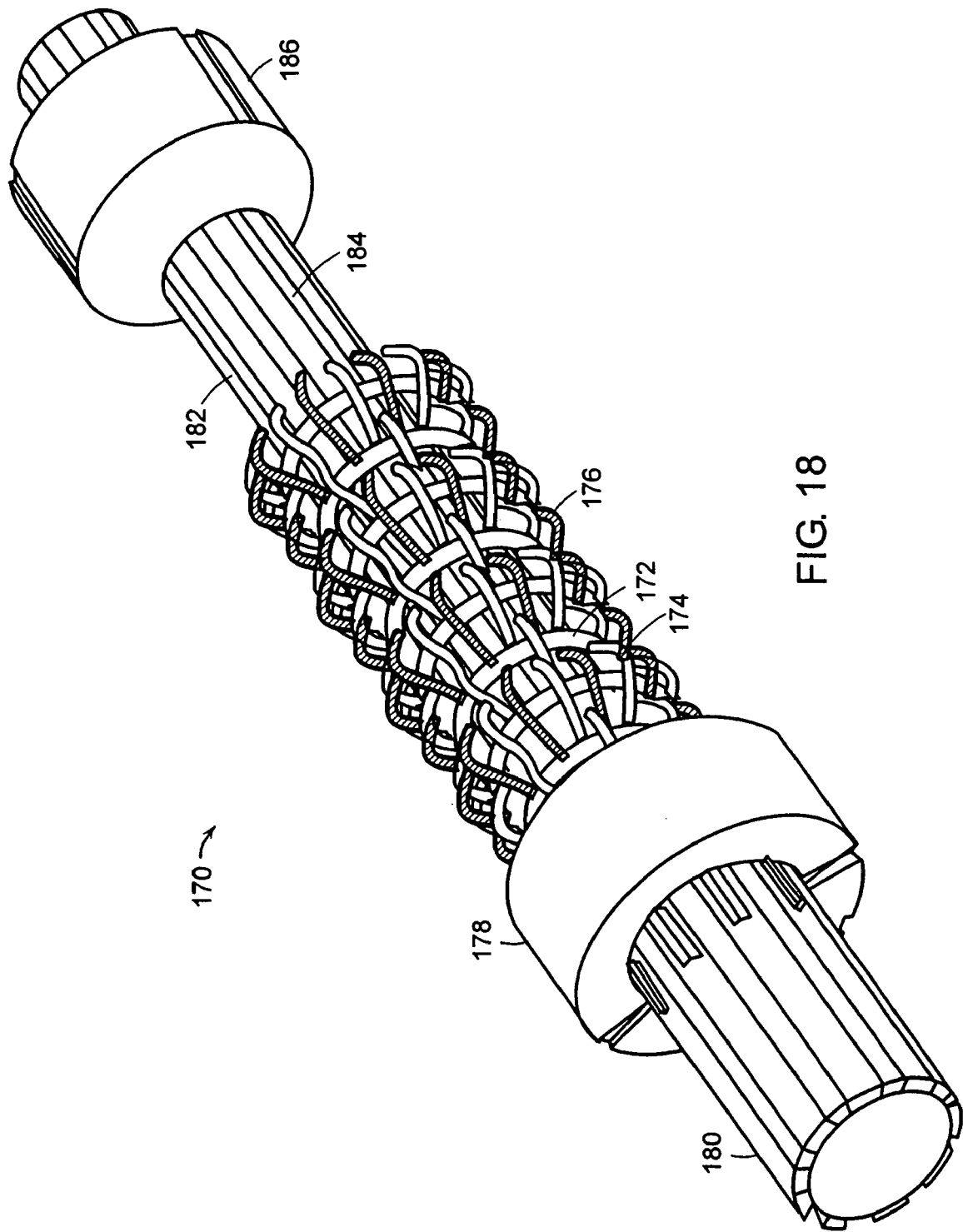

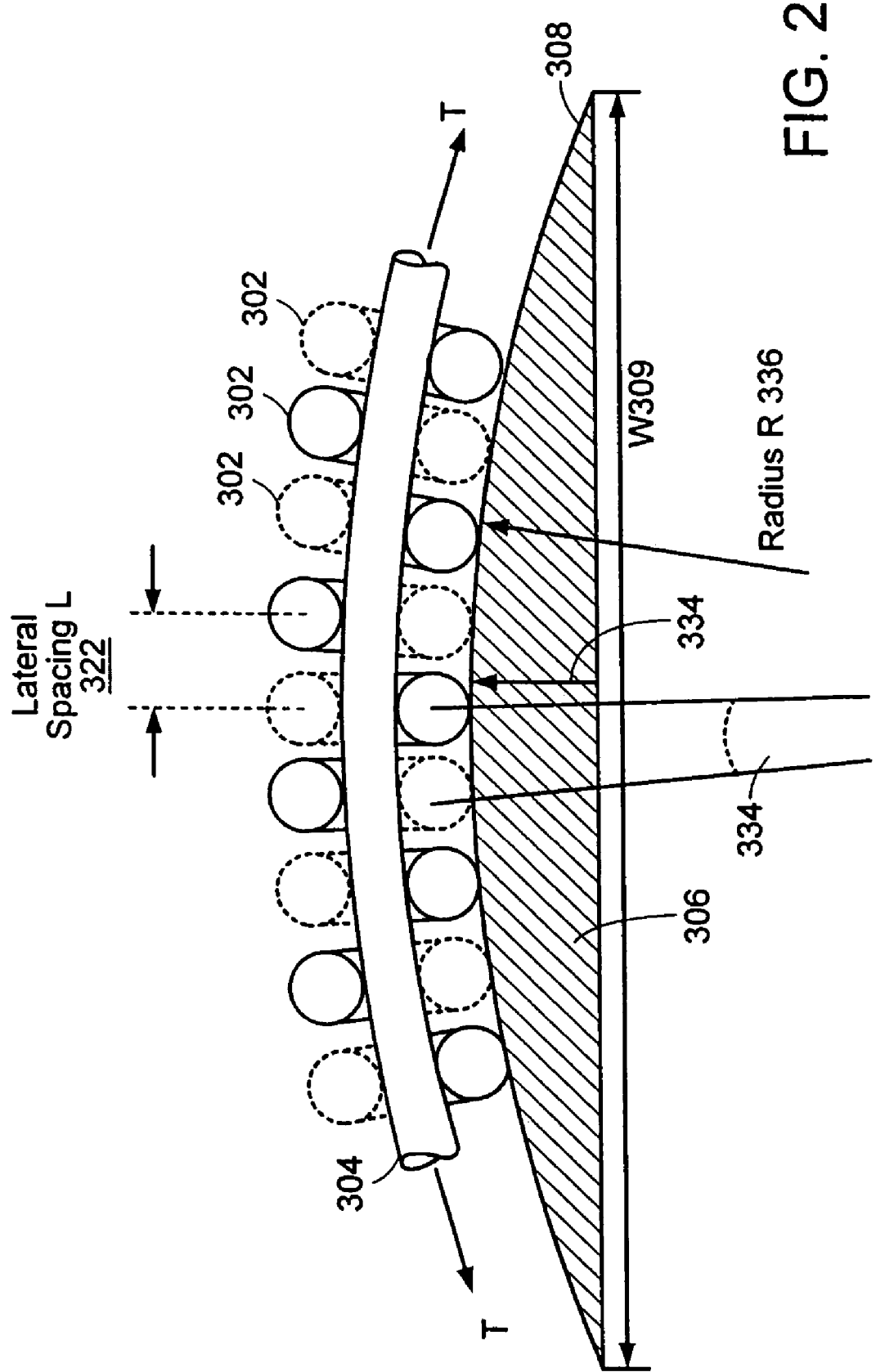

Arrows indicate allowed motion

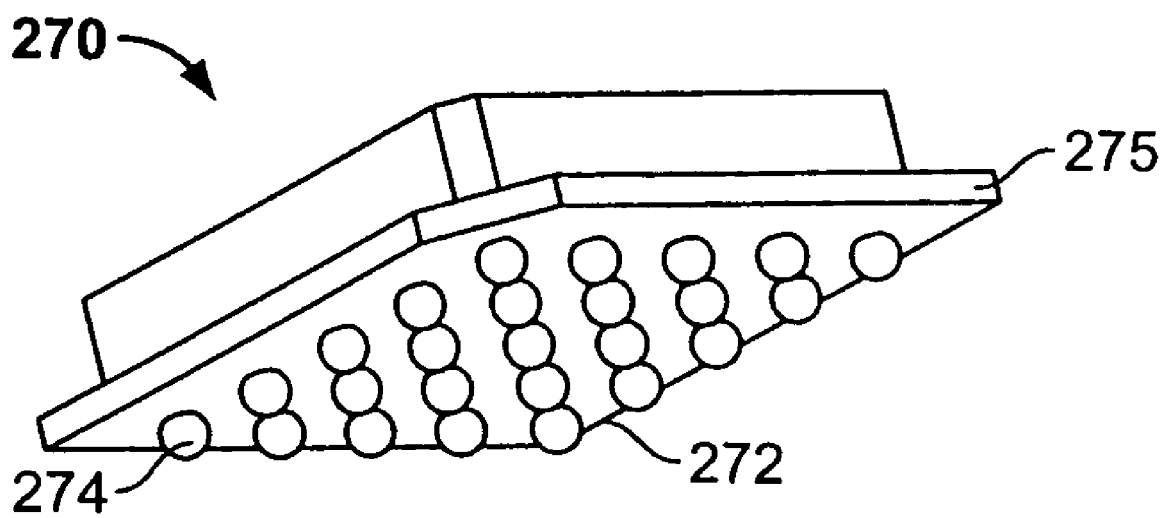
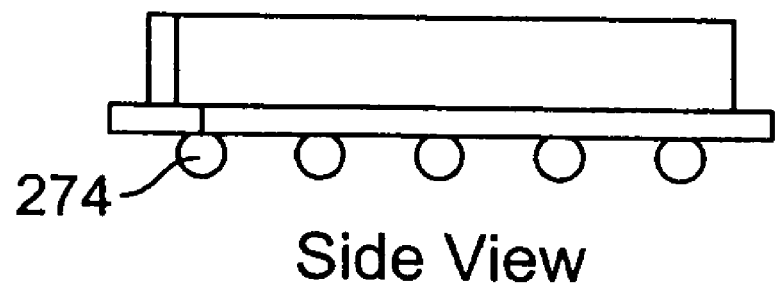
Side View
FIG. 38

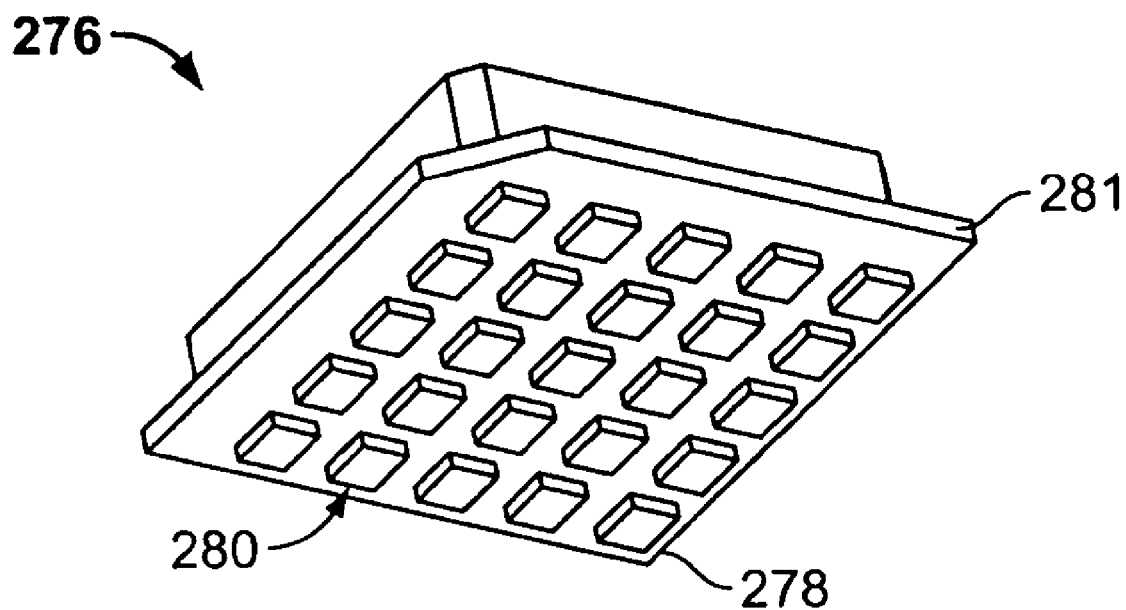
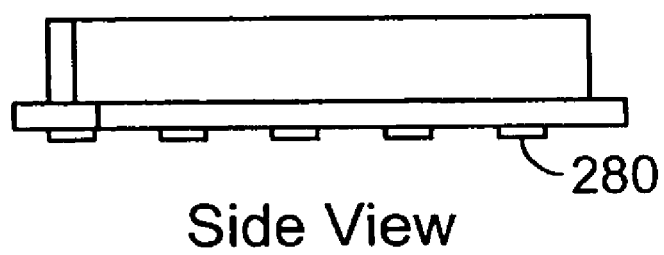
Side View
FIG. 39

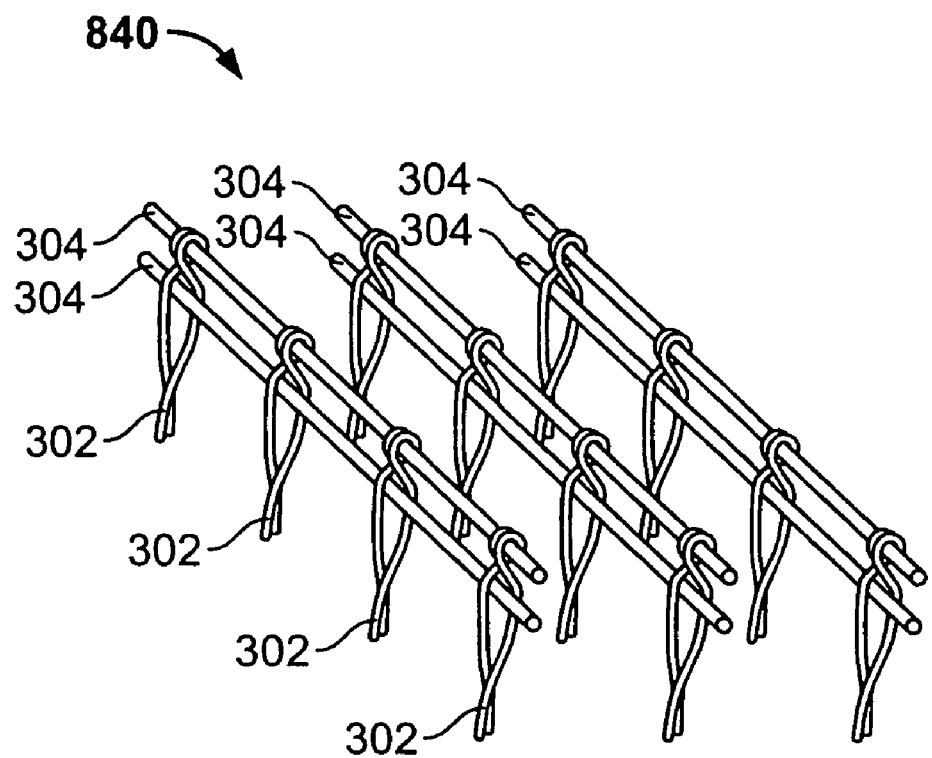
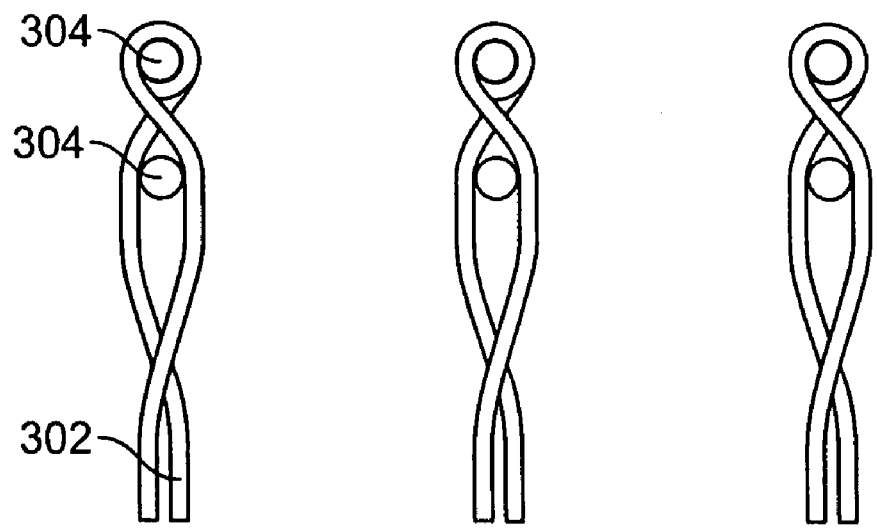
End View
FIG. 46

SYSTEMS AND METHODS FOR CONNECTING ELECTRICAL COMPONENTS

CROSS-REFERENCE TO RELATED APPLICATION

This application is a divisional of U.S. patent application Ser. No. 10/619,210, filed Jul. 14, 2003, which is hereby incorporated by reference herein in its entirety.

FIELD OF THE INVENTION

The present disclosure is directed to systems and methods for connecting one electrical component to another electrical component, and in particular to systems and methods having contact interfaces which utilize tensioned loading fibers.

DISCUSSION OF RELATED ART

Components of electrical systems sometimes need to be interconnected using electrical connectors to provide an overall, functioning system. These components may vary in size and complexity, depending on the type of system. For example, referring to FIG. 1, a system may include a backplane assembly comprising a backplane or motherboard 30 and a plurality of daughter boards 32 that may be interconnected using a connector 34, which may include an array of many individual pin connections for different traces etc., on the boards. For example, in telecommunications applications where the connector connects a daughter board to a backplane, each connector may include as many as 2000 pins or more. Alternatively, the system may include components that may be connected using a single-pin coaxial or other type of connector, and many variations in-between. Regardless of the type of electrical system, advances in technology have led electronic circuits and components to become increasingly smaller and more powerful. However, individual connectors are still, in general, relatively large compared to the sizes of circuit traces and components.

Referring to FIGS. 2a and 2b, there are illustrated perspective views of the backplane assembly of FIG. 1. FIG. 2a also illustrates an enlarged section of the male portion of connector 34, including a housing 36 and a plurality of pins 38 mounted within the housing 36. FIG. 2b illustrates an enlarged section of the female portion of connector 34 including a housing 40 that defines a plurality of openings 42 adapted to receive the pins 38 of the male portion of the connector.

A portion of the connector 34 is shown in more detail in FIG. 3a. Each contact of the female portion of the connector includes a body portion 44 mounted within one of the openings (FIG. 2b, 42). A corresponding pin 38 of the male portion of the connector is adapted to mate with the body portion 44. Each pin 38 and body portion 44 includes a termination contact 48. As shown in FIG. 3b, the body portion 44 includes two cantilevered arms 46 adapted to provide an "interference fit" for the corresponding pin 38. In order to provide an acceptable electrical connection between the pin 38 and the body portion 44, the cantilevered arms 46 are constructed to provide a relatively high clamping force. Thus, a high normal force is required to mate the male portion of the connector with the female portion of the connector. This may be undesirable in many applications, as will be discussed in more detail below.

When the male portion of the conventional connector is engaged with the female portion, the pin 38 performs a "wiping" action as it slides between the cantilevered arms 46, requiring a high normal force to overcome the clamping force of the cantilevered arms and allow the pin 38 to be inserted into the body portion 44. There are three components of friction between the two sliding surfaces (the pin and the cantilevered arms) in contact, namely asperity interactions, adhesion and surface plowing. Surfaces, such as the pin 38 and cantilevered arms 46, that appear flat and smooth to the naked eye are actually uneven and rough under magnification. Asperity interactions result from interference between surface irregularities as the surfaces slide over each other. Asperity interactions are both a source of friction and a source of particle generation. Similarly, adhesion refers to local welding of microscopic contact points on the rough surfaces that results from high stress concentrations at these points. The breaking of these welds as the surfaces slide with respect to one another is a source of friction.

In addition, particles may become trapped between the contacting surfaces of the connector. For example, referring to FIG. 4a, there is illustrated an enlarged portion of the conventional connector of FIG. 3b, showing a particle 50 trapped between the pin 38 and cantilevered arm 46 of connector 34. The clamping force 52 exerted by the cantilevered arms must be sufficient to cause the particle to become partially embedded in one or both surfaces, as shown in FIG. 4b, such that electrical contact may still be obtained between the pin 38 and the cantilevered arm 46. If the clamping force 52 is insufficient, the particle 50 may prevent an electrical connection from being formed between the pin 38 and the cantilevered arm 46, which results in failure of the connector 34. However, the higher the clamping force 52, the higher must be the normal force required to insert the pin 38 into the body portion 44 of the female portion of the connector 34. When the pin slides with respect to the arms, the particle cuts a groove in the surface(s). This phenomenon is known as "surface plowing" and is a third component of friction.

Referring to FIG. 5, there is illustrated an enlarged portion of a contact point between the pin 38 and one of the cantilevered arms 46, with a particle 50 trapped between them. When the pin slides with respect to the cantilevered arm, as indicated by arrow 54, the particle 50 plows a groove 56 into the surface 58 of the cantilevered arm and/or the surface 60 of the pin. The groove 56 causes wear of the connector, and may be particularly undesirable in gold-plated connectors where, because gold is a relatively soft metal, the particle may plow through the gold-plating, exposing the underlying substrate of the connector. This accelerates wear of the connector because the exposed connector substrate, which may be, for example, copper, can easily oxidize. Oxidation can lead to more wear of the connector due to the presence of oxidized particles, which are very abrasive. In addition, oxidation leads to degradation in the electrical contact over time, even if the connector is not removed and re-inserted.

One conventional solution to the problem of particles being trapped between surfaces is to provide one of the surface with "particle traps." Referring to FIGS. 6a–c, a first surface 62 moves with respect to a second surface 64 in a direction shown by arrow 66. When the surface 64 is not provided with particle traps, a process called agglomeration causes small particles 68 to combine as the surfaces move and form a large agglomerated particle 70, as illustrated in the sequence of FIGS. 6a–6c. This is undesirable, as a larger particle means that the clamping force required to break through the particle, or cause the particle to become embedded in one or both of the surfaces, so that an electrical connection can be established between surface 62 and surface 64 is very high. Therefore, the surface 64 may be provided with particle traps 72, as illustrated in FIGS. 6d–6g, which are small recesses in the surface as shown. When surface 62 moves over surface 64, the particle 68 is pushed into the particle trap 72, and is thus no longer available to cause plowing or to interfere with the electrical connection between surface 62 and surface 64. However, a disadvantage of these conventional particle traps is that it is significantly more difficult to machine surface 64 with traps than without, which adds to the cost of the connector. The particle traps also produce features that are prone to increased stress and fracture, and thus the connector is more likely to suffer a catastrophic failure than if there were no particle traps present.

Another class of electrical connections is sockets. Sockets are differentiated by the fact that there is very little sliding action between the two contacting surfaces in the insertion/removal process, which results in very little wiping action. Sockets are typically used for making temporary connections between circuit boards and electrical components, although they may also be used for board to board, board to device, device to device and cable to board connections. Sockets generally fall into two different categories: (1) sockets that facilitate the testing an electrical component (or device); and (2) sockets that are used in end applications for connecting one electrical component (or device) to another electrical component (or device). Sockets for testing an electrical component, such as Test Sockets and Burn-in Sockets, for example, can be used for making connections to devices, or electrical components, so that functionality or electrical integrity tests of the device can be performed. These types of sockets are generally designed for high-cycle counts (i.e., have design lives which allow them to be engaged and disengaged with a great number of devices before failure) with only short-term connections (e.g., no more than a couple of days for each inserted device). Sockets are also used for device mounting in end application uses such as personal computers and servers. Sockets used in this end applications make electrical connection between electrical components, where at least one of the components may need to be replaced or upgraded during the product life. Use of sockets in this case enables the easy removal of one component without the need for expensive or time consuming desoldering processes.

Current socket technology is based on pogo pins, springs arms, cam actuated devices, and in some cases conductive compressible polymers. Pogo pins use a small spring mounted within a barrel to produce a normal force on a contacting pin when the system is compressed. Spring arms use cantilevered beams to produce a normal force upon deflection from the default position. Both of these systems develop problems when trying to continue the miniaturization process. It becomes very hard and expensive to make smaller and smaller springs for pogo pins, and the barrels and pins become hard to manufacture at very small sizes. Spring arms suffer from excessively tight tolerance stack-up issues as they are made smaller and smaller. To account for variations in the contacting interfaces (i.e. different height pins in a pin grid array or non-planarity of some devices), multiple contact points should be able to handle large deflections with low forces. The miniaturization of spring beams has disadvantages because when the beam is made smaller, the deflection for a given load correspondingly decreases. When combining multiple beams over a large array, the tolerance stack up requirement for small beams can become excessive, resulting in light contact at one point and very heavy contact at another point which may cause damage to that contact point. Cam actuated devices use a cam motion to force contact between the socket and device. These can be very complicated with a number of moving parts that are expensive and hard to keep making smaller to keep up with device technology. Conductive polymers can require very high compressive stresses to make contact across the interface and it can be very difficult to obtain repeatable and stable electrical characteristics such as impedance and resistance. With compressible polymers, there is always potential for shorting across contacts.

SUMMARY OF THE INVENTION

The present disclosure is directed to methods and devices that use a contact interface for establishing an electrical connection with an electrical component. In certain exemplary embodiments, the contact interface of a device includes at least one loading fiber and at least one conductor having at least one contact point. The conductor(s) is coupled to a loading fiber so that an electrical connection can be established between the contact point(s) of the conductor(s) and the electrical component when the device is engaged with the electrical component. In certain exemplary embodiments, a conductor is woven with, or wound around, a loading fiber. In some exemplary embodiments, the conductor is comprised of a shaped contact and a conductive lead.

In one exemplary embodiment, the device comprises a burn-in socket device. In another exemplary embodiment, the device comprises a test socket device. In yet another exemplary embodiment, the device comprises a circuit board. In further exemplary embodiments, the device comprises a processing unit, a memory unit or an expansion card.

In certain exemplary embodiments, electrical connections can be established between the device and a plurality of electrical components.

In another exemplary embodiment, the contact interface of a device can include first and second conductors, a loading fiber and a tensioning guide. The first and second conductors can be coupled to the loading fiber, and the tensioning guide can be disposed between the first and second conductors so that the loading fiber comes into contact with the tensioning guide when the device is engaged with the electrical component. The tensioning guide can be a solid or hollow support column, or can be part of a faceplate.

In one exemplary embodiment, a plurality of loading fibers form a grid having a plurality of intersections where the conductor(s) can be coupled to at least one loading fiber at or near an intersection of the grid.

In an alternative exemplary embodiment, a plurality of loading fibers form an array having at least two layers of loading fibers where at least one conductor can be coupled to a loading fiber of a first layer and to a loading fiber of a second layer.

The contact interface of certain exemplary embodiments further includes a tensioning spring where an end of a conductor can be coupled to the tensioning spring.

In some exemplary embodiments, an exemplary device can further include a high-frequency modulator that is coupled to the loading fiber(s) where the high-frequency modulator is capable of exciting the loading fiber(s) at a fundamental frequency.

In certain exemplary embodiments, the contact interface of a device includes a plurality of loading fibers and a plurality of conductors, wherein each conductor is coupled to at least one loading fiber so that electrical connections can be established between at least a portion of the plurality of conductors and the electrical component when the device is engaged with the electrical component. In many exemplary embodiments, the electrical component comprises a plurality of contacts wherein electrical connections can be established between at least a portion of the plurality of conductors of the contact interface and the plurality of contacts of the electrical component when the device is engaged with the electrical component. The certain exemplary embodiments, the plurality of contacts of the electrical component can comprise a ball grid array, a surface mount array or a pin grid array.

The present disclosure is also directed to methods and devices for testing the electrical integrity or functionality of an electrical component. In certain exemplary embodiments, the device includes a plurality of loading fibers, a plurality of conductors and a plurality of tensioning guides. Each conductor can be coupled to at least one loading fiber. The tensioning guides can be disposed on at least one side of each said conductor. In such embodiments, electrical connections can be established between at least a portion of the plurality of conductors and the electrical component when the device is engaged with the electrical component. At least a portion of the plurality of loading fibers may come into contact with the plurality of tensioning guides when the device is engaged with the electrical component.

In one exemplary embodiment, the device comprises a burn-in socket device. In another exemplary embodiment, the device comprises a test socket device.

BRIEF DESCRIPTION OF THE DRAWINGS

The foregoing and other features and advantages of the present invention will be apparent from the following non-limiting discussion of various embodiments and aspects thereof with reference to the accompanying drawings, in which like reference numerals refer to like elements throughout the different figures. The drawings are provided for the purposes of illustration and explanation, and are not intended to limit the breadth of the present disclosure.

FIG. 3b is an enlarged cross-sectional view of a single connection of the conventional connector of FIG. 3a;

FIG. 15a is a perspective view of the connector of FIG. 7, mated with a mating connector element;

FIG. 15b is a perspective view of the connector of FIG. 7, mated with a mating connector element;

FIG. 17b is a perspective view of the connector of FIG. 17a;

FIG. 18 is a perspective view of another embodiment of a woven connector according to aspects of the present disclosure;

FIG. 29 is an enlarged cross-sectional view of a woven connector embodiment having a convex contact mating surface;

FIG. 38 depicts a device having a typical ball grid array;

FIG. 39 depicts a device having typical surface mount pads;

FIG. 46 depicts yet another exemplary device in accordance with the teachings of the present disclosure.

DETAILED DESCRIPTION

Figure 1:
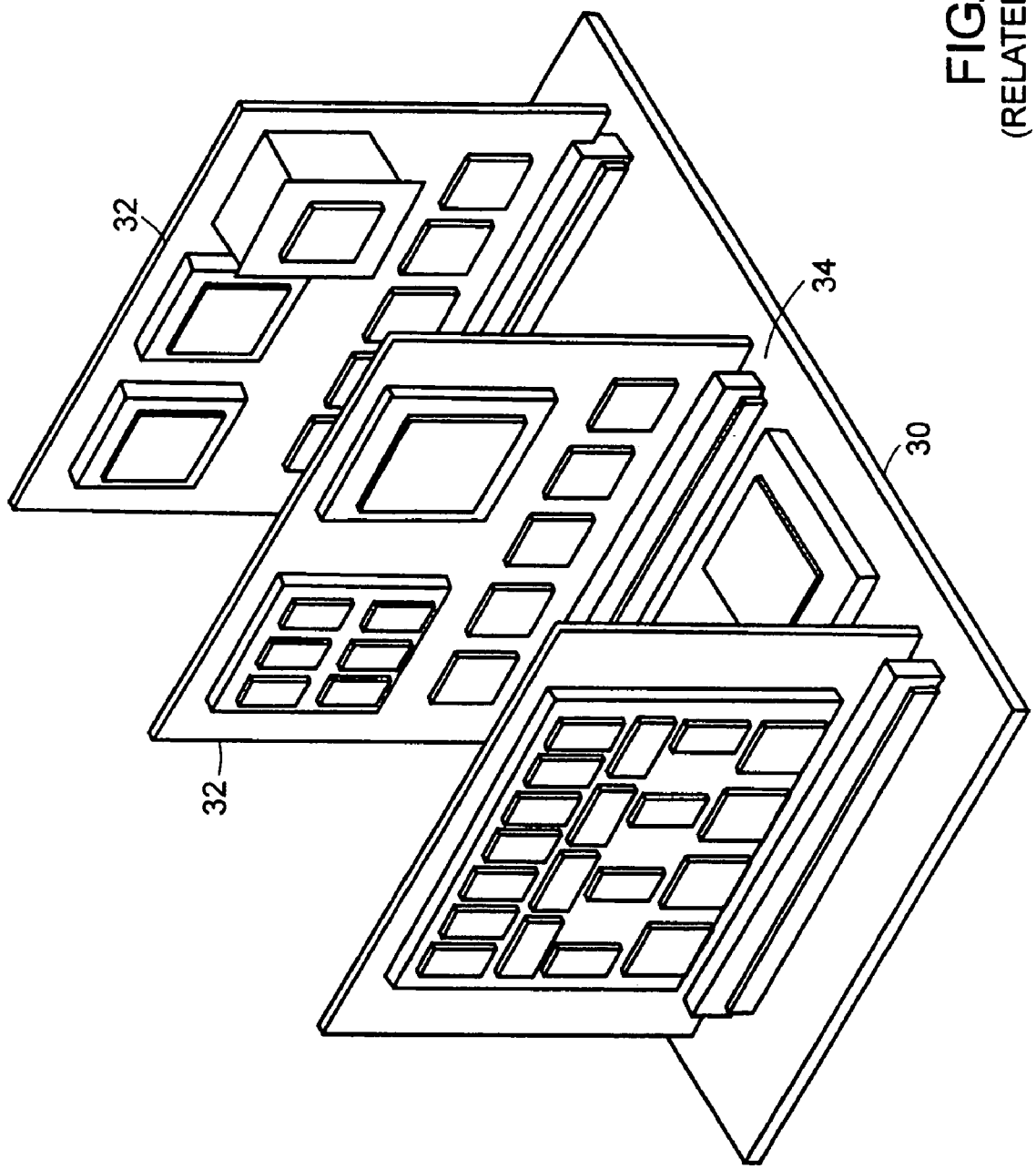
FIG. 1 is a perspective view of a conventional backplane assembly.
Figure 2A:
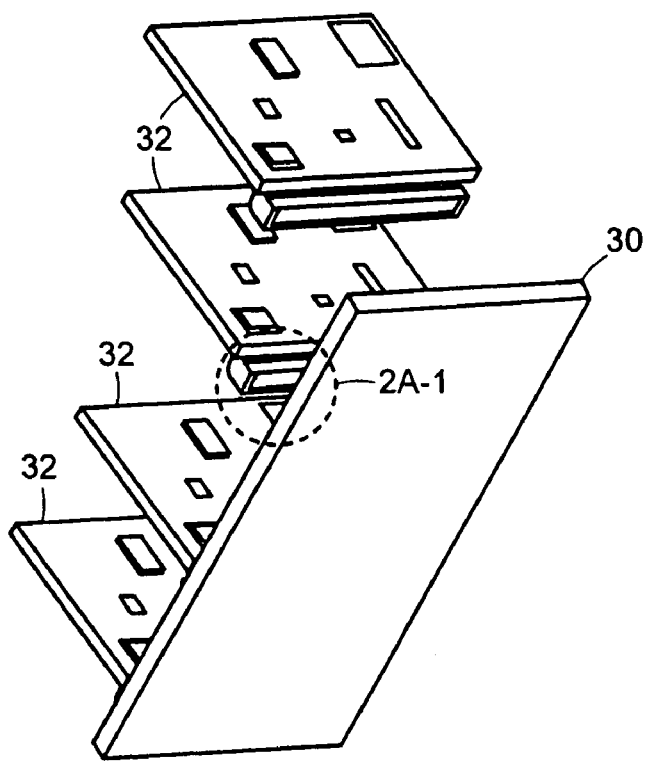
FIG. 2a is a perspective view of a conventional backplane assembly showing an enlarged portion of a conventional male connector element.
Figures 1, 2A:
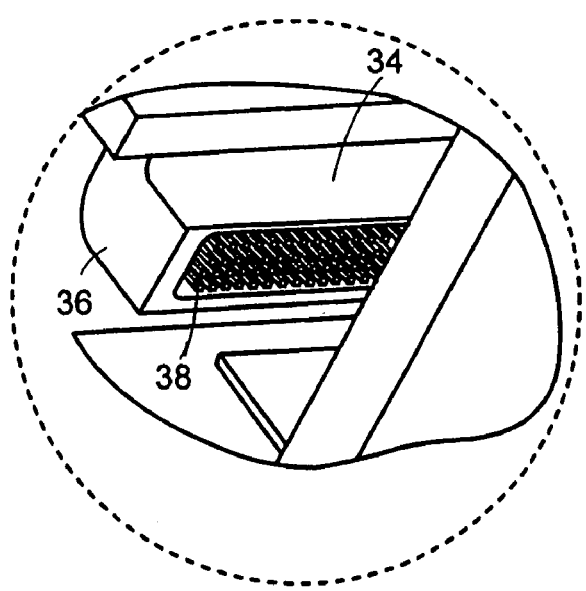
Figure 2B:
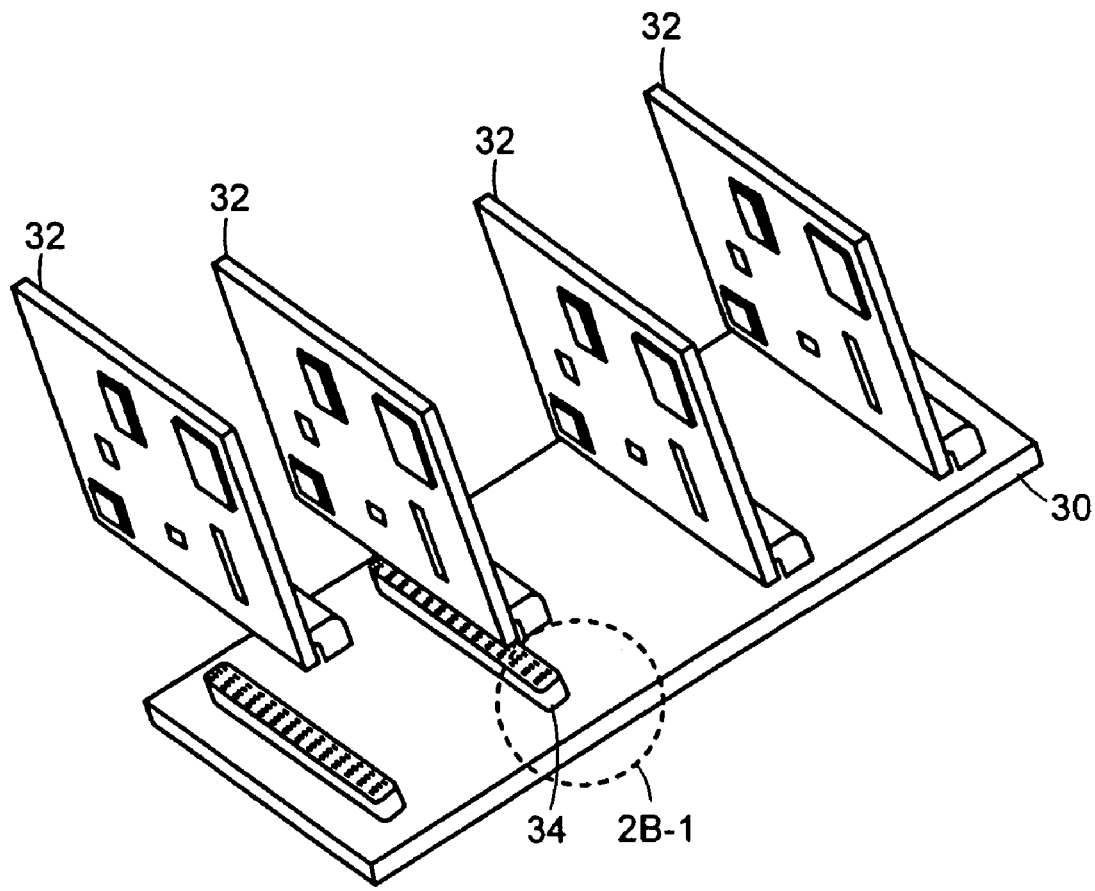
FIG. 2b is a perspective view of a conventional backplane assembly showing an enlarged portion of a conventional female connector element.
Figures 1, 2B:
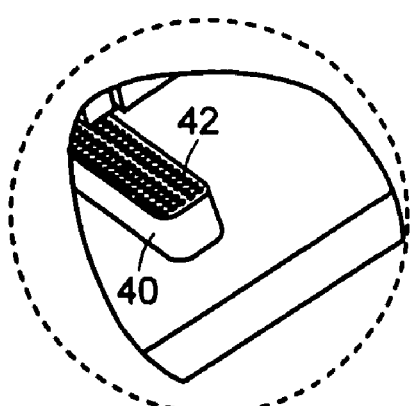

The present invention provides an electrical connector that may overcome the disadvantages of prior art connectors. The invention comprises an electrical connector capable of very high density and using only a relatively low normal force to engage a connector element with a mating connector element. It is to be understood that the invention is not limited in its application to the details of construction and the arrangement of components set forth in the following description or illustrated in the drawings. Other embodiments and manners of carrying out the invention are possible. Also, it is to be understood that the phraseology and terminology used herein is for the purpose of description and should not be regarded as limiting. The use of "including," "comprising," or "having" and variations thereof is meant to encompass the items listed thereafter and equivalents thereof as well as additional items. In addition, it is to be appreciated that the term "connector" as used herein refers to each of a plug and jack connector element and to a combination of a plug and jack connector element, as well as respective mating connector elements of any type of connector and the combination thereof. It is also to be appreciated that the term "conductor" refers to any electrically conducting element, such as, but not limited to, wires, conductive fibers, metal strips, metal or other conducting cores, etc.

Figure 7:
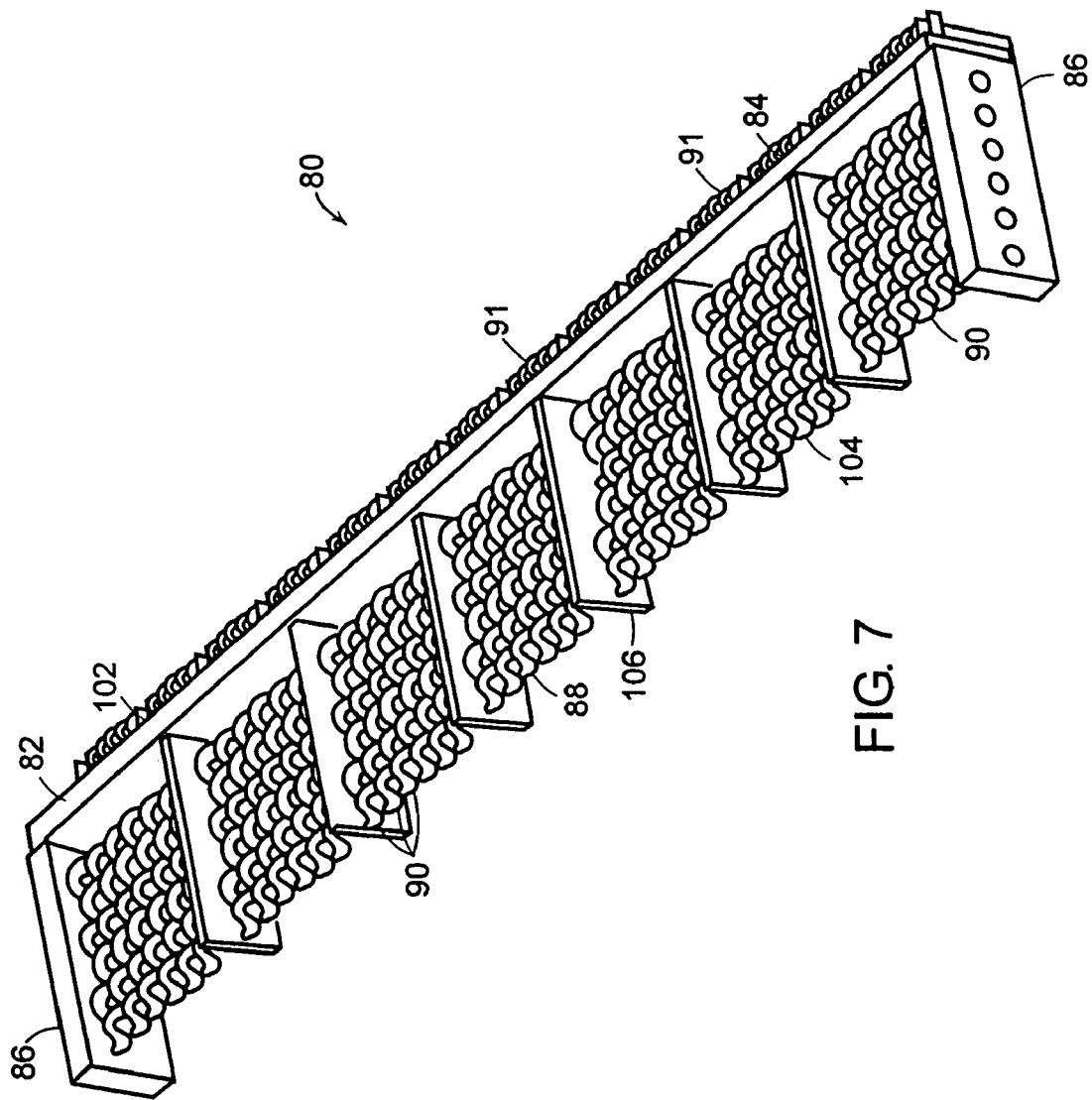
FIG. 7 is a perspective view of one embodiment of a woven connector according to aspects of the present disclosure.

Referring to FIG. 7, there is illustrated one embodiment of a connector according to aspects of the invention. The connector 80 includes a housing 82 that may include a base member 84 and two end walls 86. A plurality of non-conductive fibers 88 may be disposed between the two end walls 86. A plurality of conductors 90 may extend from the base member 84, substantially perpendicular to the plurality of non-conductive fibers 88. The plurality of conductors 90 may be woven with the plurality of non-conductive fibers so as to form a plurality of peaks and valleys along a length of each of the plurality of conductors, thereby forming a woven connector structure. Resulting from the weave, each conductor may have a plurality of contact points positioned along the length of each of the plurality of conductors, as will be discussed in more detail below.

In one embodiment, a number of conductors 90a, for example, four conductors, may together form one electrical contact. However, it is to be appreciated that each conductor may alone form a separate electrical contact, or that any number of conductors may be combined to form a single electrical contact. The connector of FIG. 7 may be include termination contacts 91 which may be permanently or removably connected to, for example, a backplane or daughter board. In the illustrated example, the termination contacts 91 are mounted to a plate 102 that may be mounted to the base member 84 of housing 82. Alternatively, the termination may be connected directly to the base member 84 of the housing 82. The base member 84 and/or end walls 86 may also be used to secure the connector 80 to the backplane or daughter board. The connector of FIG. 7 may be adapted to engage with one or more mating connector elements, as discussed below.

Figure 8:
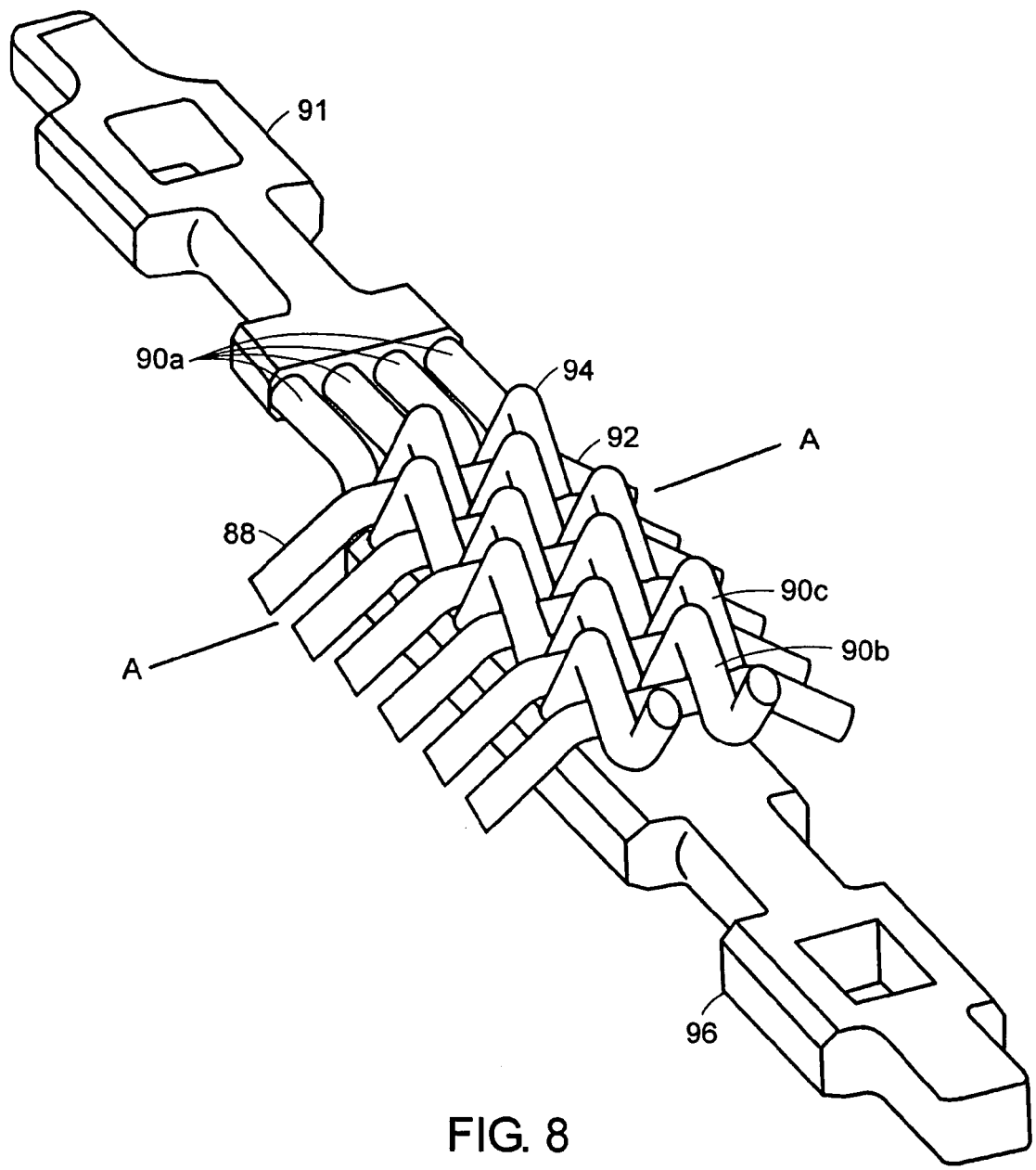
FIG. 8 is a perspective view of an example of an enlarged portion of the woven connector of FIG. 7.

FIG. 8 illustrates an example of an enlarged portion of the connector 80, illustrating one electrical contact comprising the four conductors 90a. The four conductors 90a may be connected to a common termination contact 91. It is to be appreciated that the termination contact 91 need not have the shape illustrated, but may have any suitable configuration for termination to, for example, a semiconductor device, a circuit board, a cable, etc. According to one example, the plurality of conductors 90a may include a first conductor 90b and a second conductor 90c located adjacent the first conductor 90b. The first and second conductors may be woven with the plurality of nonconductive fibers 88 such that a first one of the non-conductive fibers 88 passes over a valley 92 of the first conductor 90b and under a peak 94 of the second conductor 90c. Thus, the plurality of contact points along the length of the conductors may be provided by either the valleys or the peaks, depending on where a contacting mating connector is located. A mating contact 96, illustrated in FIG. 8, may form part of a mating connector element 97 that may be engaged with the connector 80, as illustrated in FIG. 15b. As shown in FIG. 8, at least some of the valleys of the conductors 90a provide the plurality of contact points between the conductors 90a and the mating contact 96. It is also to be appreciated that the mating contact need not have the shape illustrated, but may have any suitable configuration for termination to, for example, a semiconductor device, a circuit board, a cable, etc.

According to one embodiment, tension in the weave of the connector 80 may provide a contact force between the conductors of the connector 80 and the mating connector 96. In one example, the plurality of non-conductive fibers 88 may comprise an elastic material. The elastic tension that may be generated in the non-conductive fibers 88 by stretching the elastic fibers, may be used to provide the contact force between the connector 80 and the mating contact 96. The elastic non-conductive fibers may be prestretched to provide the elastic force, or may be mounted to tensioning mounts, as will be discussed in more detail below.

Figure 9A:
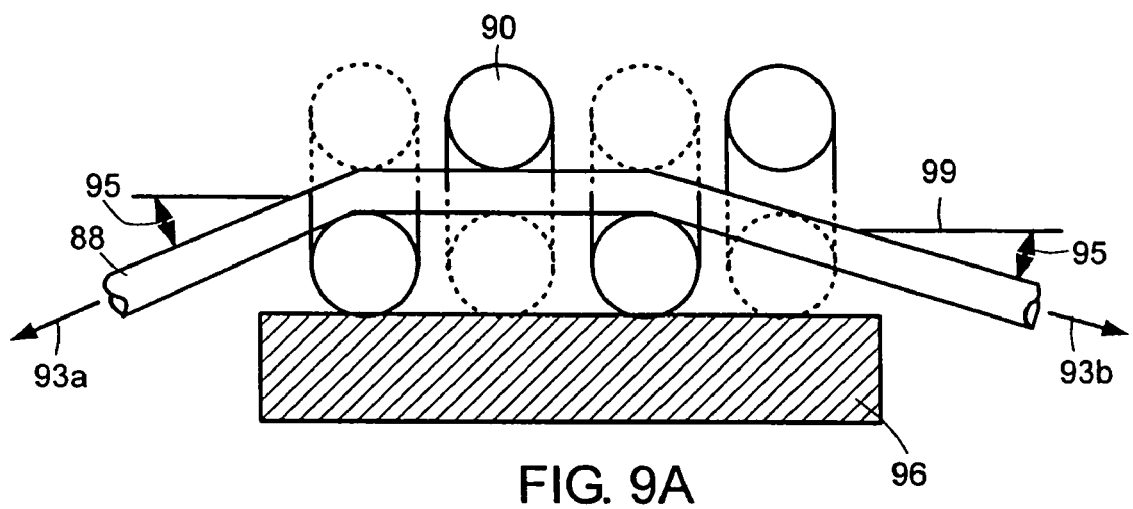
FIGS. 9a and 9b are enlarged cross-sectional views of a portion of the connector of FIG. 8.
Figure 9B:
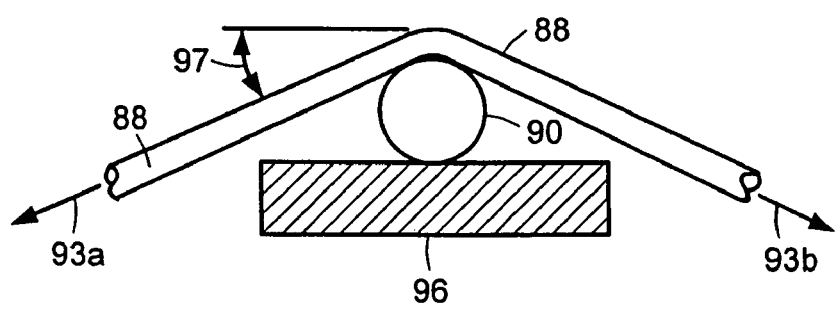

Referring to FIG. 9a, there is illustrated an enlarged cross-sectional view of the connector of FIG. 8, taken along line A—A in FIG. 8. The elastic non-conductive fiber 88 may be tensioned in the directions of arrows 93a and 93b, to provide a predetermined tension in the non-conductive fiber, which in turn may provide a predetermined contact force between the conductors 90 and the mating contact 96. In the example illustrated in FIG. 9a, the non-conductive fiber 88 may be tensioned such that the non-conductive fiber 88 makes an angle 95 with respect to a plane 99 of the mating conductor 96, so as to press the conductors 90 against the mating contact 96. In this embodiment, more than one conductor 90 may be making contact with the mating conductor 96. Alternatively, as illustrated in FIG. 9b, a single conductor 90 may be in contact with any single mating conductor 96, providing the electrical contact as discussed above. Similar to the previous example, the non-conductive fiber 88 is tensioned in the directions of the arrows 93a and 93b, and makes an angle 97 with respect to the plane of the mating contact 96, on either side of the conductor 90.

Figure 10:
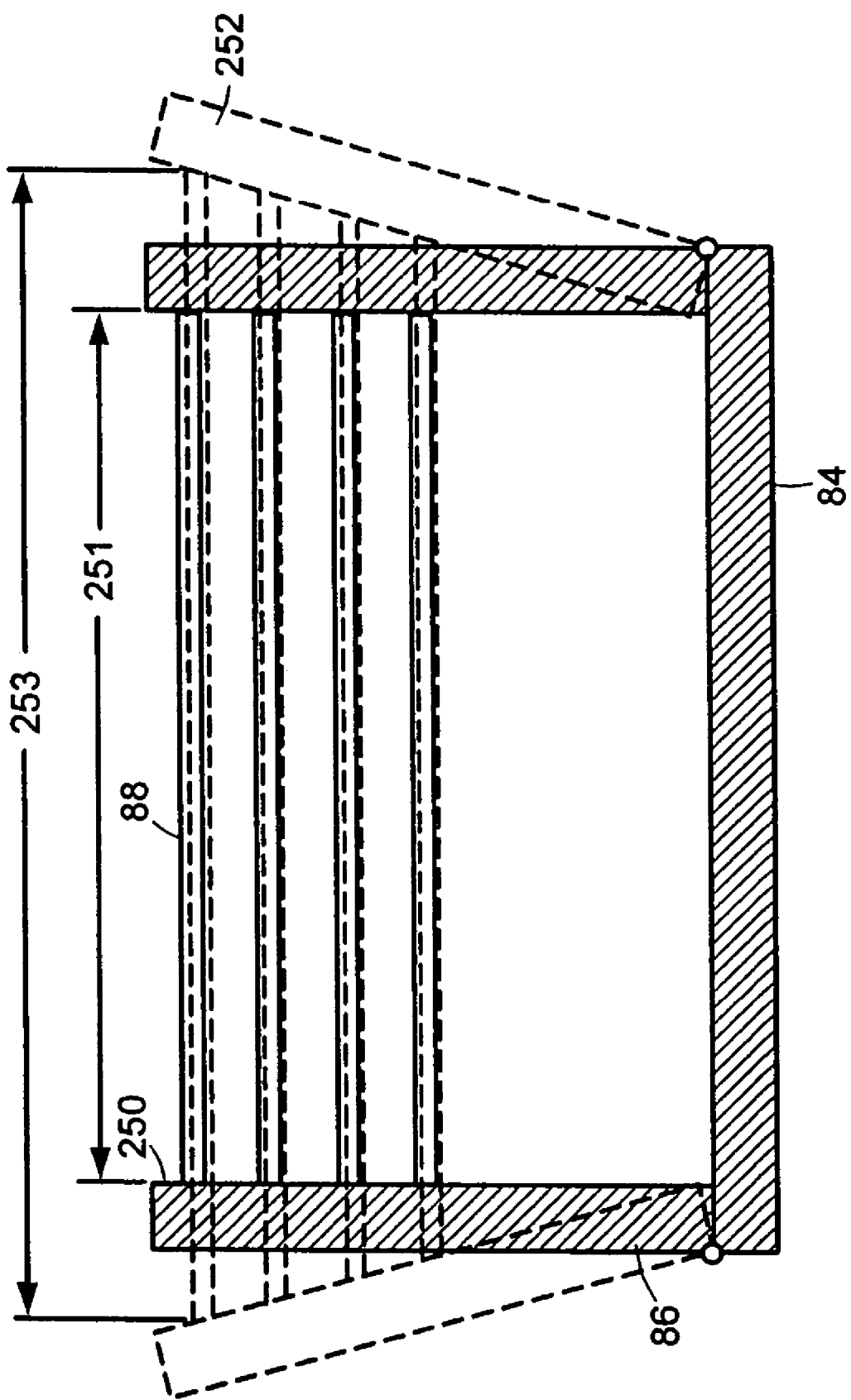
FIG. 10 is a simplified cross-sectional view of the connector of FIG. 7 with movable, tensioning end walls.

As discussed above, the elastic non-conductive fibers 88 may be attached to tensioning mounts. For example, the end walls 86 of the housing may act as tensioning mounts to provide a tension in the non-conductive fibers 88. This may be accomplished, for example, by constructing the end walls 86 to be movable between a first, or rest position 250 and a second, or tensioned, position 252, as illustrated in FIG. 10. Movement of the end walls 86 from the rest position 250 to the tensioned position 252 causes the elastic non-conductive fibers 88 to be stretched, and thus tensioned. As illustrated, the length of the non-conductive fibers 88 may be altered between a first length 251 of the fibers when the tensioning mounts are in the rest position 250, (when no mating connector is engaged with the connector 80), and a second length 253 when the tensioning mounts are in the tensioned position 252 (when a mating connector is engaged with the connector 80). This stretching and tensioning of the non-conductive fibers 88 may in turn provide contact force between the conductive weave (not illustrated in FIG. 10 for clarity), and the mating contact, when the mating connector is engaged with the connector element.

Figure 11:
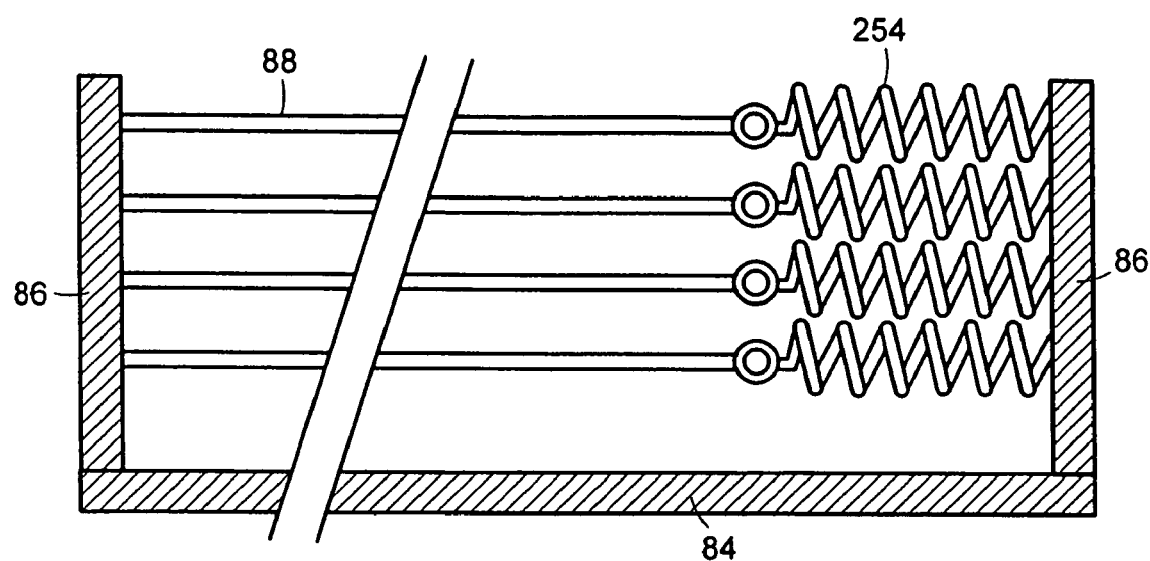
FIG. 11 is a simplified cross-sectional view of the connector of FIG. 7 including spring members attaching the non-conductive weave fibers to the end walls.
Figure 12:
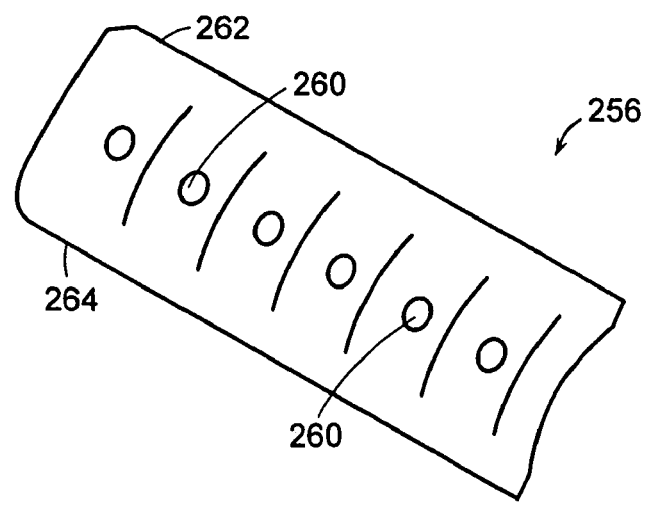
FIG. 12 is a perspective view of another example of a tensioning mount.

According to another example, illustrated in FIG. 11, springs 254 may be provided connected to one or both ends of the non-conductive fibers 88 and to a corresponding one or both of the end walls 86, the springs providing the elastic force. In this example, the non-conductive fibers 88 may be non-elastic, and may include an inelastic material such as, for example, a polyamid fiber, a polyaramid fiber, and the like. The tension in the non-conductive weave may be provided by the spring strength of the springs 254, the tension in turn providing contact force between the conductive weave (not illustrated for clarity) and conductors of a mating connector element. In yet another example, the non-conductive fibers 88 may be elastic or inelastic, and may be mounted to tensioning plates 256 (see FIG. 12), which may in turn be mounted to the end walls 86, or may be the end walls 86. The tensioning plates may comprise a plurality of spring members 262, each spring member defining an opening 260, and each spring member 262 being separated from adjacent spring members by a slot 264. Each non-conductive fiber may be threaded through a corresponding opening 260 in the tensioning plate 256, and may be mounted to the tensioning plate, for example, glued to the tensioning plate, or tied such that an end portion of the non-conductive fiber can not be unthreaded though the opening 260. The slots 264 may enable each spring member 262 to act independent of adjacent spring members, while allowing a plurality of spring members to be mounted on a common tensioning mount 256. Each spring member 262 may allow a small amount of motion, which may provide tension in the non-conductive weave. In one example, the tensioning mount 256 may have an arcuate structure, as illustrated in FIG. 12.

Figure 3A:
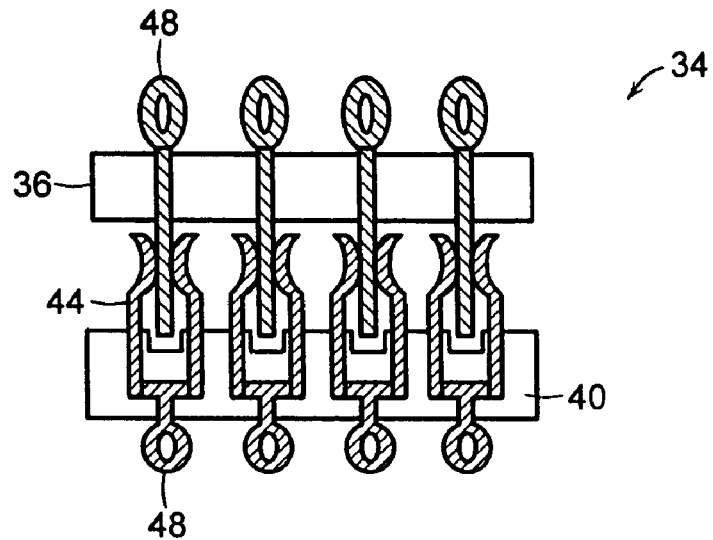
FIG. 3a is a cross-sectional view of a conventional connector as may be used with the backplane assemblies of FIGS. 1, 2a, and 2b.
Figure 3B:
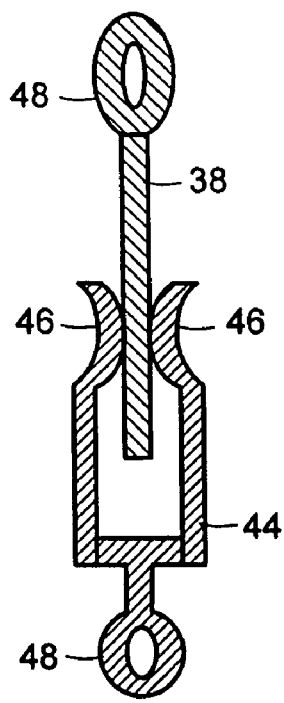
Figure 4A:
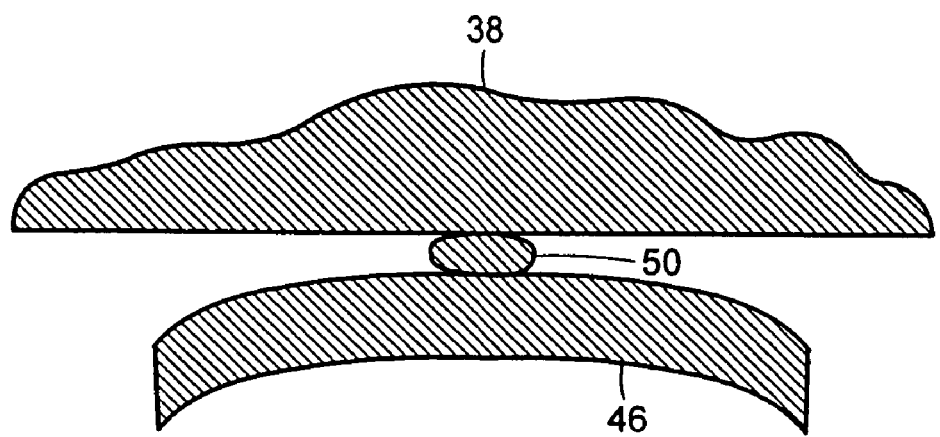
FIG. 4a is an illustration of an enlarged portion of the conventional connector of FIG. 3b, showing a trapped particle.
Figure 4B:
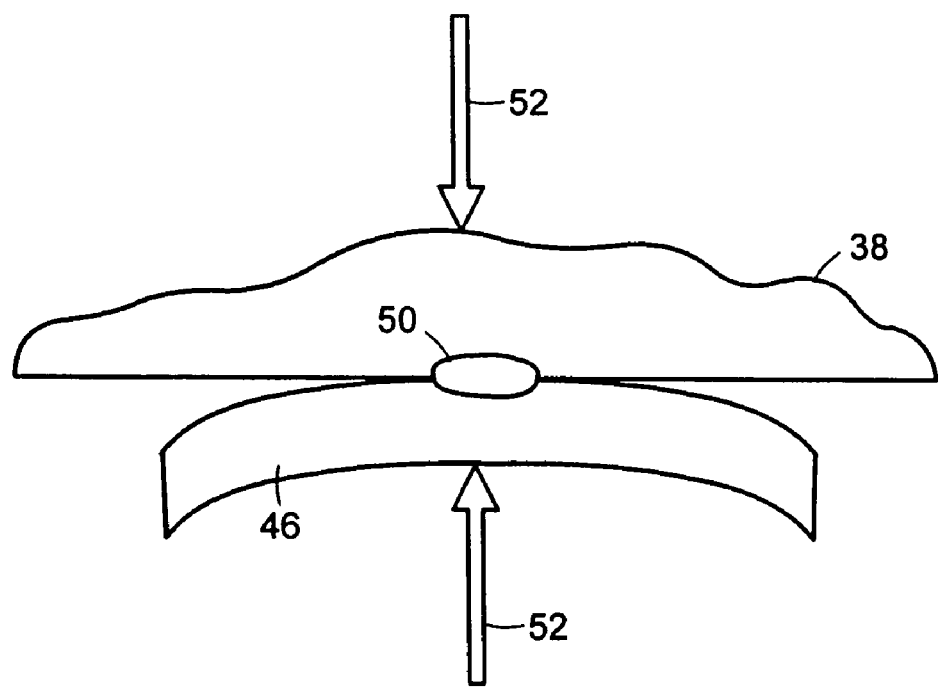
FIG. 4b is an illustration of the enlarged connector portion of FIG. 4a, with the particle embedded into a surface of the connector.
Figure 5:
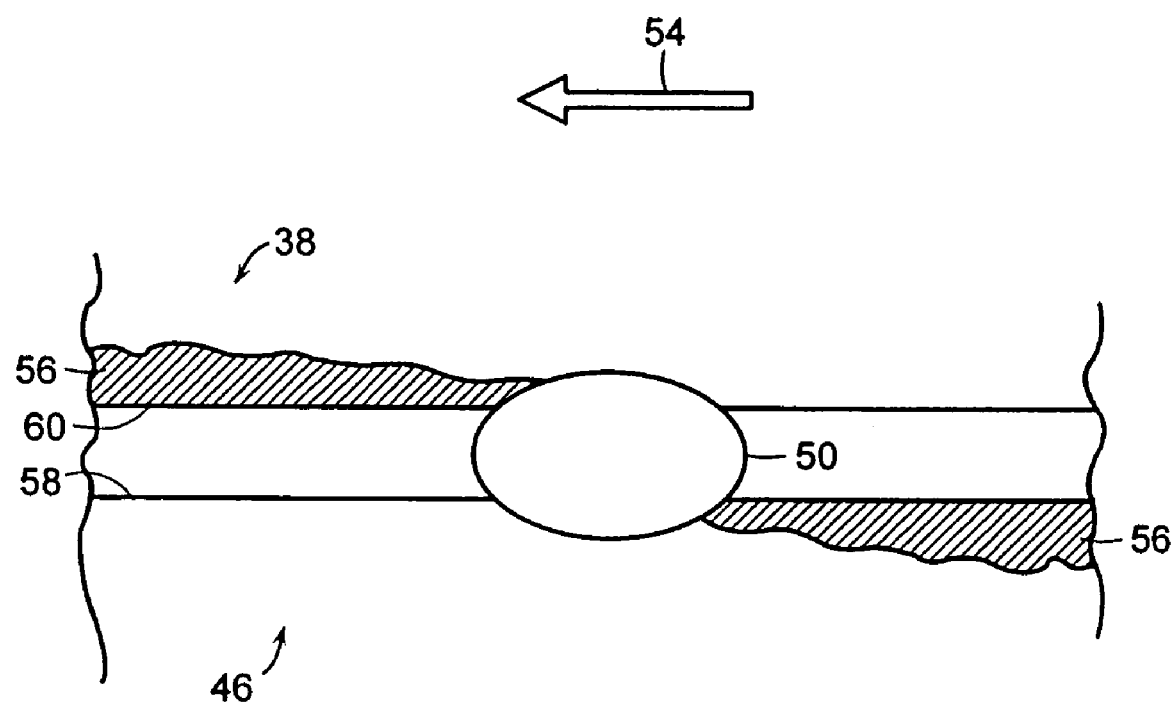
FIG. 5 is a diagrammatic representation of an example of the plowing phenomenon.
Figure 6A:
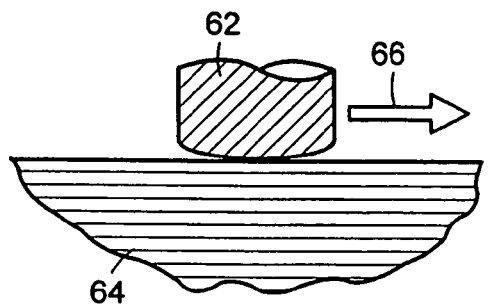
FIGS. 6a–g are diagrammatic representations of particle agglomeration, with and without particle traps present in a connector.
Figure 6D:
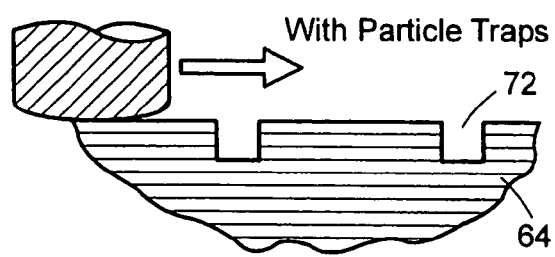
Figure 6B:
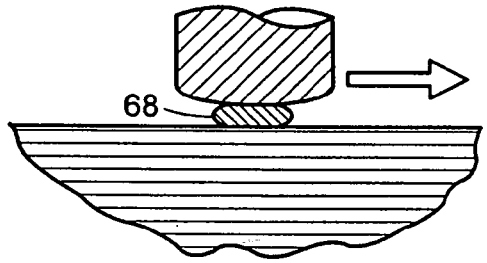
Figure 6E:
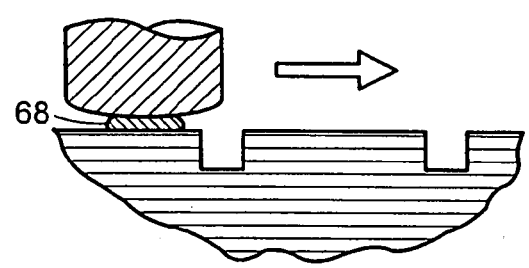
Figure 6C:
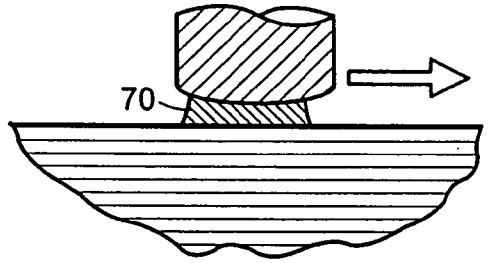
Figure 6F:
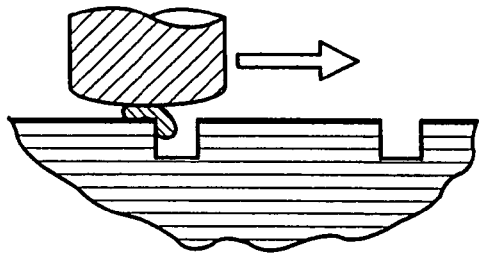
Figure 6G:
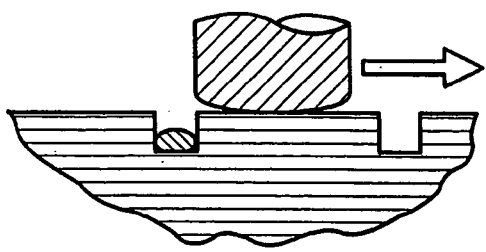
Figure 13A:
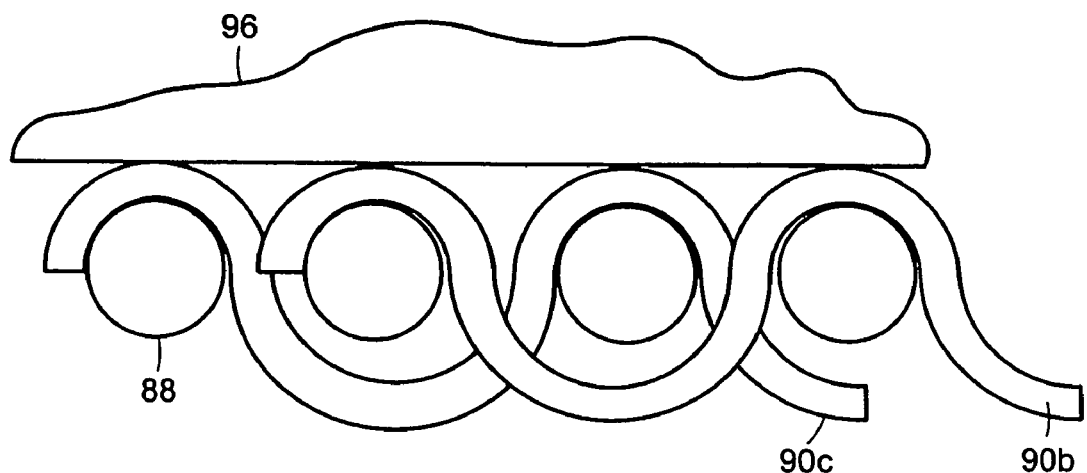
FIG. 13a is an enlarged cross-sectional view of the woven connector of FIGS. 7 and 8.
Figure 13B:
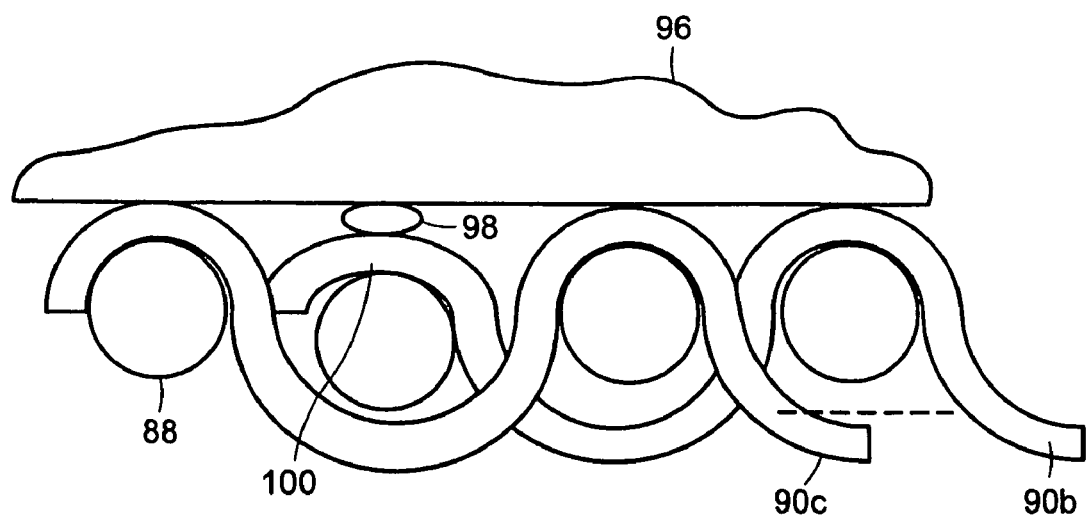
FIG. 13b is an enlarged cross-sectional view of the woven connector of FIGS. 7 and 8 with a particle.

According to one aspect of the invention, providing a plurality of discrete contact points along the length of the connector and mating connector may have several advantages over the single continuous contact of conventional connectors (as illustrated in FIGS. 3a, 3b and 4). For example, when a particle becomes trapped between the surfaces of a conventional connector, as shown in FIG. 4, the particle can prevent an electrical connection from being made between the surfaces, and can cause plowing which may accelerate wear of the connector. The applicants have discovered that plowing by trapped particles is a significant source of wear of conventional connectors. The problem of plowing, and resulting lack of a good electrical connection being formed, may be overcome by the woven connectors of the present invention. The woven connectors have the feature of being "locally compliant," which herein shall be understood to mean that the connectors have the ability to conform to a presence of small particles, without affecting the electrical connection being made between surfaces of the connector. Referring to FIGS. 13a and 13b, there are illustrated enlarged cross-sectional views of the connector of FIGS. 7 and 8, showing the plurality of conductors 90a providing a plurality of discrete contact points along the length of the mating connector element 96. When no particle is present, each peak/valley of conductors 90a may contact the mating contact 96, as shown in FIG. 13a. When a particle 98 becomes trapped between the connector surfaces, the peak/valley 100 where the particle is located, conforms to the presence of the particle, and can be deflected by the particle and not make contact with the mating contact 96, as shown in FIG. 13b. However, the other peaks/valleys of the conductors 90a remain in contact with the mating contact 96, thereby providing an electrical connection between the conductors and the mating contact 96. With this arrangement, very little force may be applied to the particle, and thus when the woven surface of the connector moves with respect to the other surface, the particle does not plow a groove in the other surface, but rather, each contact point of the woven connector may be deflected as it encounters a particle. Thus, the woven connectors may prevent plowing from occurring, thereby reducing wear of the connectors and extending the useful life of the connectors.

Figure 14:
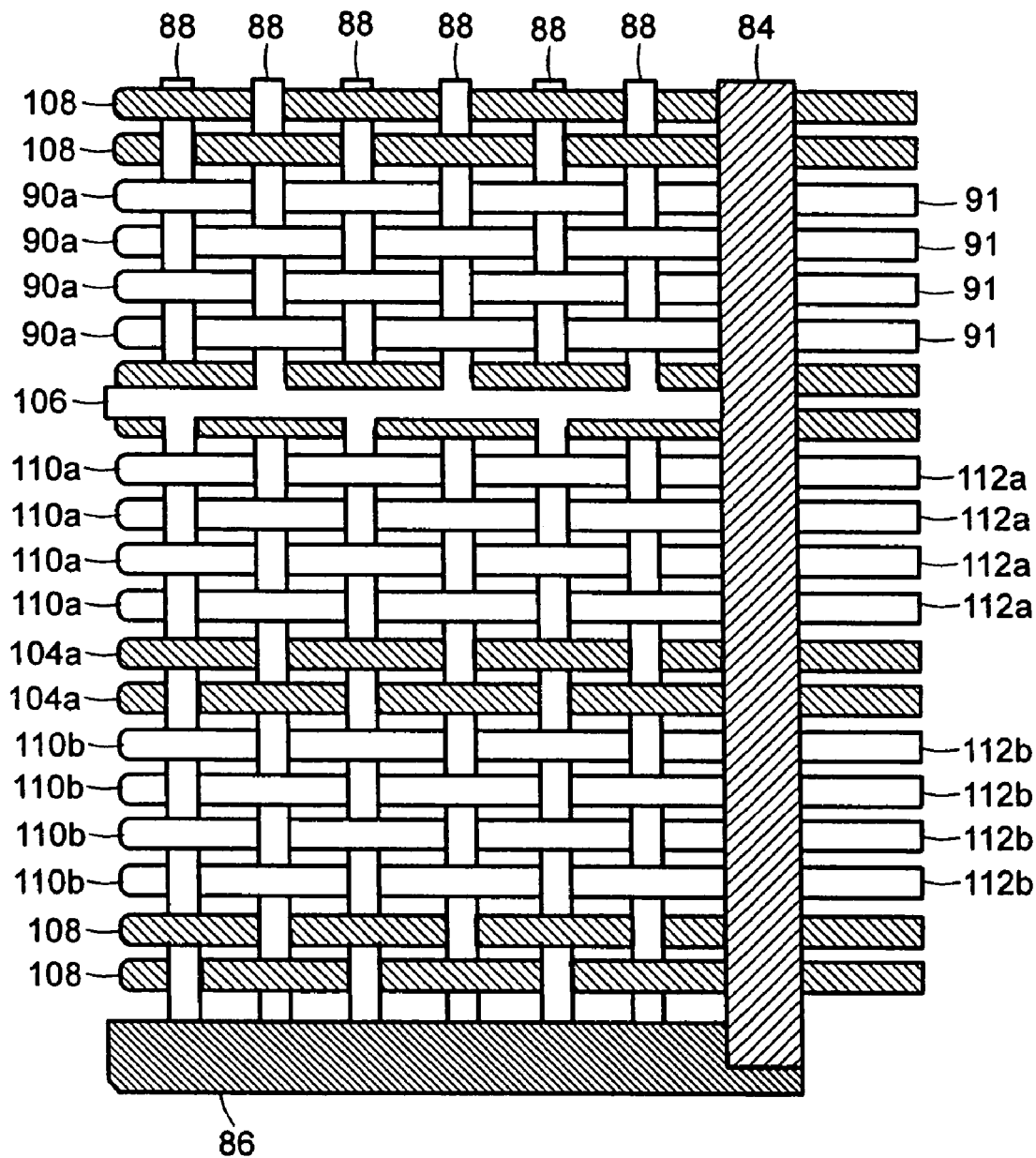
FIG. 14 is plan view of an enlarged portion of the woven connector of FIG. 7.

Referring again to FIG. 7, the connector 80 may further comprise one or more insulating fibers 104 that may be woven with the plurality of non-conductive fibers 88 and may be positioned between sets of conductors that together form an electrical contact. The insulating fibers 104 may serve to electrically isolate one electrical contact from another, preventing the conductors of one electrical contact from coming into contact with the conductors of the other electrical contact and causing an electrical short between the contacts. An enlarged portion of an example of connector 80 is illustrated in FIG. 14. As shown, the connector 80 may include a first plurality of conductors 110a and a second plurality of conductors 110b, separated by one or more insulating fibers 104a and woven with the plurality of non-conductive fibers 88. As discussed above, the first plurality of conductors 110a may be connected to a first termination contact 112a, forming a first electrical contact. Similarly, the second plurality of conductors 110b may be connected to a second termination contact 112*b*, forming a second electrical contact. In one example, the termination contacts 112*a* and 112*b* may together form a differential signal pair of contacts. Alternatively, each termination contact may form a single, separate electrical signal contact. According to another example, the connector 80 may further comprise an electrical shield member 106, that may be positioned, as shown in FIG. 7, to separate differential signal pair contacts from one another. Of course, it is to be appreciated that an electrical shield member may also be included in examples of the connector 80 that do not have differential signal pair contacts.

FIGS. 15*a* and 15*b* illustrate the connector 80 in combination with a mating connector 97. The mating connector 97 may include one or more mating contacts 96 (see FIG. 8), and may also include a mating housing 116 that may have top and bottom plate members 118*a* and 118*b*, separated by a spacer 120. The mating contacts 96 may be mounted to the top and/or bottom plate members 118*a* and 118*b*, such that when the connector 80 is engaged with the mating connector 97, at least some of the contact points of the plurality of conductors 90 contact the mating contacts 96, providing an electrical connection between the connector 80 and mating connector 97. In one example, the mating contacts 96 may be alternately spaced along the top and bottom plate members 118*a* and 118*b* as illustrated in FIG. 15*a*. The spacer 120 may be constructed such that a height of the spacer 120 is substantially equal to or slightly less than a height of the end walls 86 of connector 80, so as to provide an interference fit between the connector 80 and the mating connector 97 and so as to provide contact force between the mating conductors and the contact points of the plurality of conductors 90. In one example, the spacer may be constructed to accommodate movable tensioning end walls 86 of the connector 80, as described above.

It is to be appreciated that the conductors and non-conductive and insulating fibers making up the weave may be extremely thin, for example having diameters in a range of approximately 0.0001 inches to approximately 0.020 inches, and thus a very high density connector may be possible using the woven structure. Because the woven conductors are locally compliant, as discussed above, little energy may be expended in overcoming friction, and thus the connector may require only a relatively low normal force to engage a connector with a mating connector element. This may also increase the useful life of the connector as there is a lower possibility of breakage or bending of the conductors occurring when the connector element is engaged with the mating connector element. Pockets or spaces present in the weave as a natural consequence of weaving the conductors and insulating fibers with the non-conductive fibers may also act as particle traps. Unlike conventional particle traps, these particle traps may be present in the weave without any special manufacturing considerations, and do not provide stress features, as do conventional particle traps.

Figure 16A:
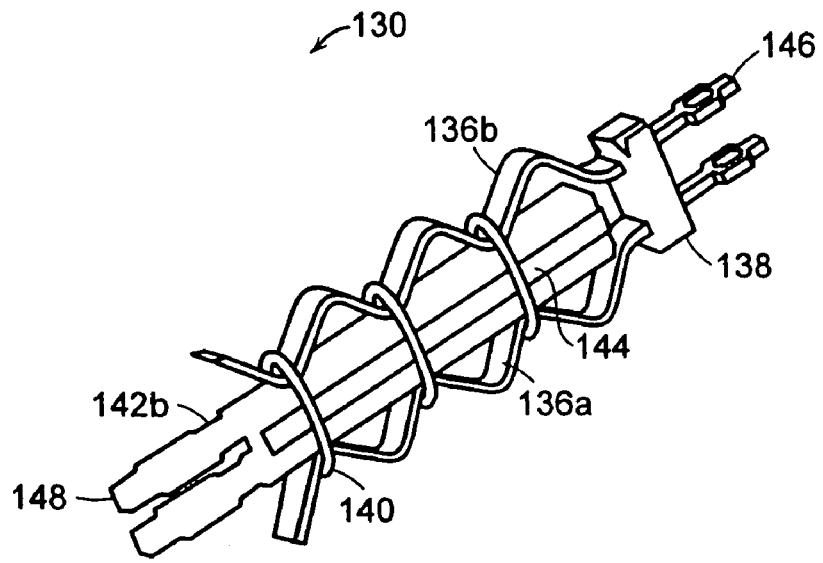
FIG. 16a is a perspective view of another embodiment of a connector according to aspects of the present disclosure.
Figure 16B:
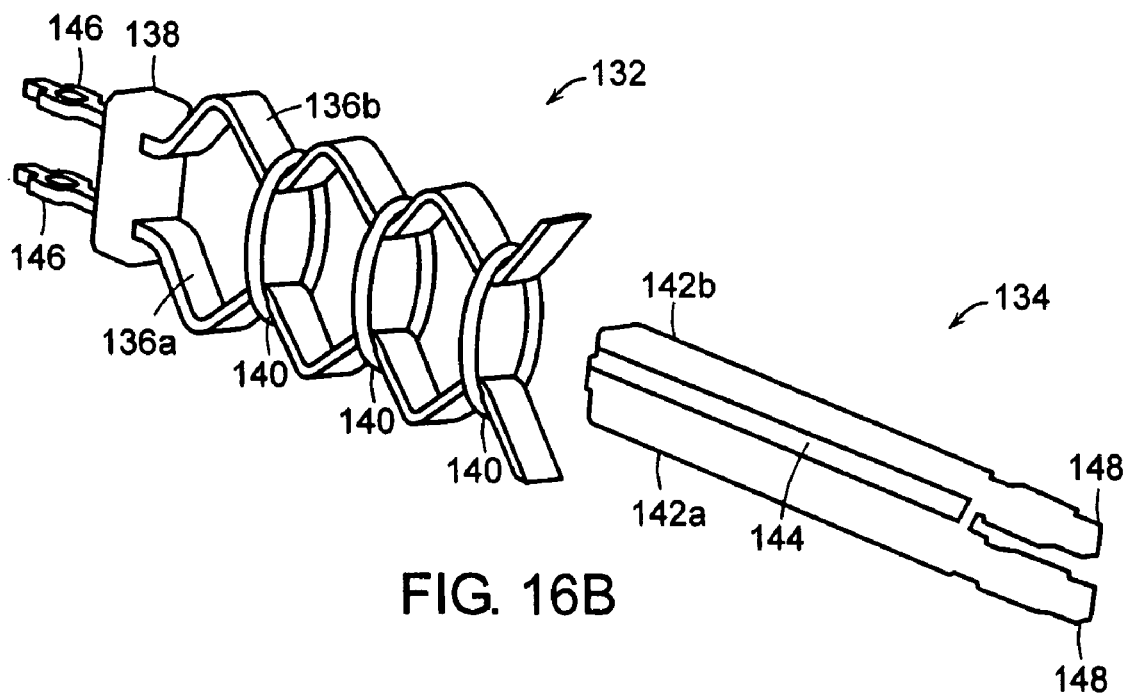
FIG. 16b is a perspective view of the connector of FIG. 16a with mating connector element disengaged.

Referring to FIGS. 16*a* and 16*b*, there is illustrated another embodiment of a woven connector according to aspects of the invention. In this embodiment, a connector 130 may include a first connector element 132 and a mating connector element 134. The first connector element may comprise first and second conductors 136*a* and 136*b* that may be mounted to an insulating housing block 138. It is to be appreciated that although in the illustrated example the first connector element includes two conductors, the invention is not so limited and the first connector element may include more than two conductors. The first and second conductors may have an undulating form along a length of the first and second conductors, as illustrated, so as to include a plurality of contact points 139 along the length of the conductors. In one example of this embodiment, the weave is provided by a plurality of elastic bands 140 that encircle the first and second conductors 136*a* and 136*b*. According to this example, a first elastic band may pass under a first peak of the first conductor 136*a* and over a first valley of the second conductor 136*b*, so as to provide a woven structure having similar advantages and properties to that described with respect to the connector 80 (FIGS. 7–15*b*) above. The elastic bands 140 may include an elastomer, or may be formed of another insulating material. It is also to be appreciated that the bands 140 need not be elastic, and may include an inelastic material. The first and second conductors of the first connector element may be terminated in corresponding first and second termination contacts 146, which may be permanently or removably connected to, for example, a backplane, a circuit board, a semiconductor device, a cable, etc.

As discussed above, the connector 130 may further comprise a mating connector element (rod member) 134, which may comprise third and fourth conductors 142*a*, 142*b* separated by an insulating member 144. When the mating connector element 134 is engaged with the first connector element 132, at least some of the contact points 139 of the first and second conductors may contact the third and fourth conductors, and provide an electrical connection between the first connector element and the mating connector element. Contact force may be provided by the tension in the elastic bands 140. It is to be appreciated that the mating connector element 134 may include additional conductors adapted to contact any additional conductors of the first connector element, and is not limited to having two conductors as illustrated. The mating connector element 134 may similarly include termination contacts 148 that may be permanently or removably connected to, for example, a backplane, a circuit board, a semiconductor device, a cable, etc.

Figure 17B:
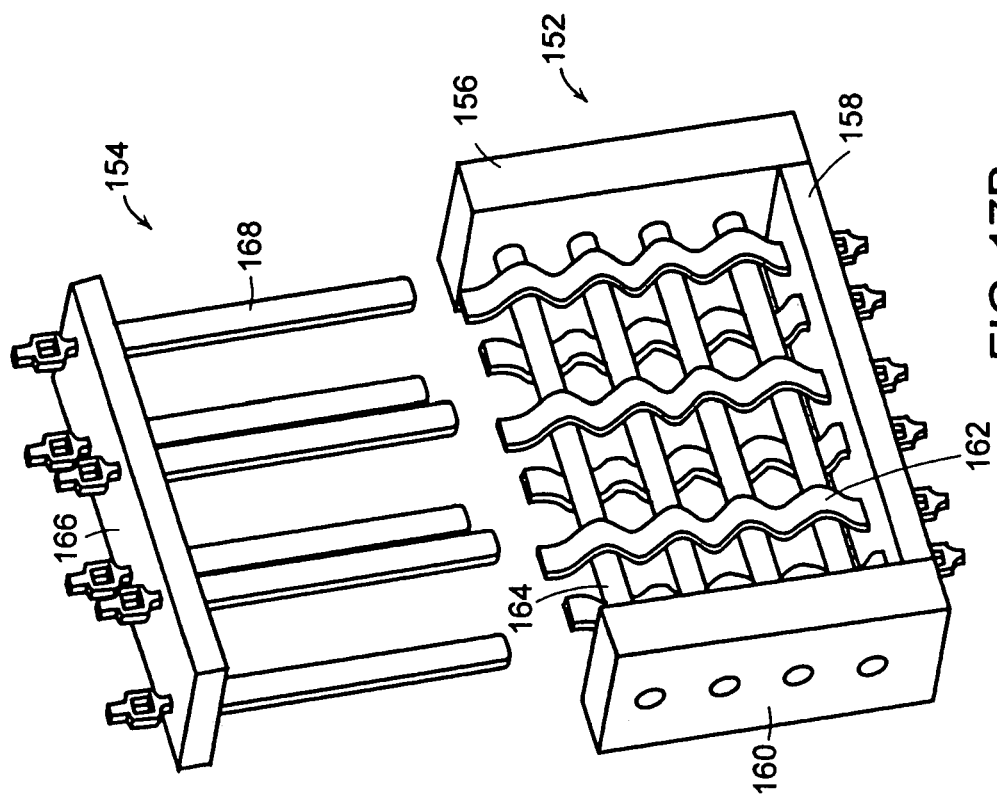
Figure 17A:
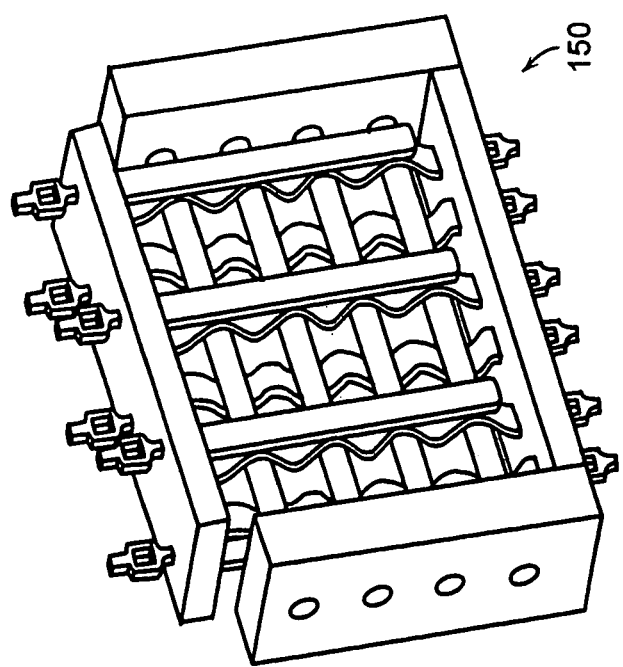
FIG. 17a is a perspective view of another embodiment of a connector according to aspects of the present disclosure.

An example of another woven connector according to aspects of the invention is illustrated in FIGS. 17*a* and 17*b*. In this embodiment, a connector 150 may include a first connector element 152 and a mating connector element 154. The first connector element 152 may comprise a housing 156 that may include a base member 158 and two opposing end walls 160. The first connector element may include a plurality of conductors 162 that may be mounted to the base member and may have an undulating form along a length of the conductors, similar to the conductors 136*a* and 136*b* of connector 130 described above. The undulating form of the conductors may provide a plurality of contact points along the length of the conductors. A plurality of non-conductive fibers 164 may be disposed between the two opposing end walls 160 and woven with the plurality of conductors 162, forming a woven connector structure. The mating connector element 154 may include a plurality of conductors 168 mounted to an insulating block 166. When the mating connector element 154 is engaged with the first connector element 152, as illustrated in FIG. 17*a*, at least some of the plurality of contact points along the lengths of the plurality of conductors of the first connector element may contact the conductors of the mating connector element to provide an electrical connection therebetween. In one example, the plurality of non-conductive fibers 164 may be elastic and may provide a contact force between the conductors of the first connector element and the mating connector element, as described above with reference to FIGS. 9*a* and 9*b*. Furthermore, the connector 150 may include any of the other tensioning structures described above with reference to FIGS. 10a 12. This connector 150 may also have the advantages described above with respect to other embodiments of woven connectors. In particular, connector 150 may prevent trapped particles from plowing the surfaces of the conductors in the same manner described in reference to FIG. 13.

Referring to FIG. 18, there is illustrated yet another embodiment of a woven connector according to the invention. The connector 170 may include a woven structure including a plurality of non-conductive fibers (bands) 172 and at least one conductor 174 woven with the plurality of non-conductive fibers 172. In one example, the connector may include a plurality of conductors 174, some of which may be separated from one another by one or more insulating fibers 176. The one or more conductors 174 may be woven with the plurality of non-conductive fibers 172 so as to form a plurality of peaks and valleys along a length of the conductors, thereby providing a plurality of contact points along the length of the conductors. The woven structure may be in the form of a tube, as illustrated, with one end of the weave connected to a housing member 178. However, it is to be appreciated that the woven structure is not limited to tubes, and may have any shape as desired. The housing member 178 may include a termination contact 180 that may be permanently or removably connected to, for example, a circuit board, backplane, semiconductor device, cable, etc. It is to be appreciated that the termination contact 180 need not be round as illustrated, but may have any shape suitable for connection to devices in the application in which the connector is to be used.

The connector 170 may further include a mating connector element (rod member) 182 to be engaged with the woven tube. The mating connector element 182 may have a circular cross-section, as illustrated, but it is to be appreciated that the mating connector element need not be round, and may have another shape as desired. The mating connector element 182 may comprise one or more conductors 184 that may be spaced apart circumferentially along the mating connector element 182 and may extend along a length of the mating connector element 182. When the mating connector element 182 is inserted into the woven tube, the conductors 174 of the weave may come into contact with the conductors 184 of the mating connector element 182, thereby providing an electrical connection between the conductors of the weave and the mating connector element. According to one example, the mating connector element 182 and/or the woven tune may include registration features (not illustrated) so as to align the mating connector element 182 with the woven tube upon insertion.

Figure 19:
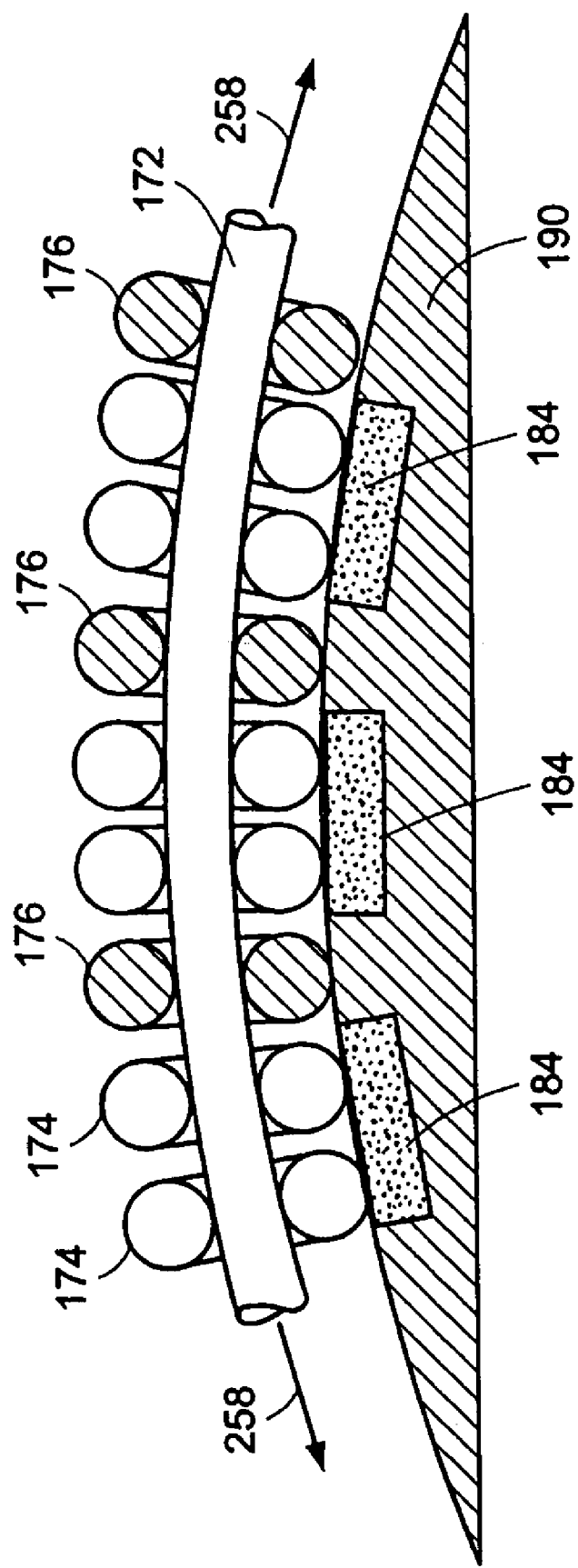
FIG. 19 is an enlarged cross-sectional view of a portion of the connector of FIG. 18.

In one example, the non-conductive fibers 172 may be elastic and may have a circumference substantially equal to or slightly smaller than a circumference of the mating connector element 182 so as to provide an interference fit between the mating connector element and the woven tube. Referring to FIG. 19, there is illustrated an enlarged cross-sectional view of a portion of the connector 170, illustrating that the nonconductive fibers 172 may be tensioned in directions of arrows 258. The tensioned nonconductive fibers 172 may provide contact force that causes at least some of the plurality of contact points along the length of the conductors 174 of the weave to contact the conductors 184 of the mating connector element. In another example, the non-conductive fibers 172 may be inelastic and may include spring members (not shown), such that the spring members allow the circumference of the tube to expand when the mating connector element 182 is inserted. The spring members may thus provide the elastic/tension force in the woven tube which in turn may provide contact force between at least some of the plurality of contact points and the conductors 184 of the mating connector element 182.

As discussed above, the weave is locally compliant, and may also include spaces or pockets between weave fibers that may act as particle traps. Furthermore, one or more conductors 174 of the weave may be grouped together (in the illustrated example of FIGS. 18 and 19, the conductors 174 are grouped in pairs) to provide a single electrical contact. Grouping the conductors may further improve the reliability of the connector by providing more contact points per electrical contact, thereby decreasing the overall contact resistance and also providing capability for complying with several particles without affecting the electrical connection.

Figure 20A:
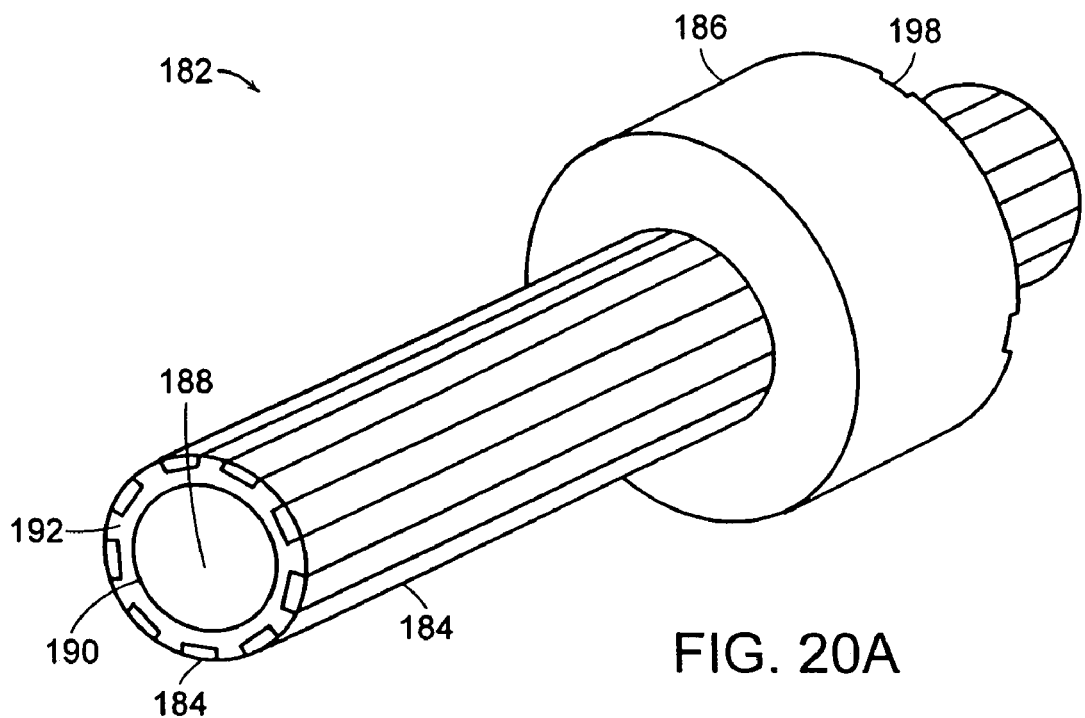
FIG. 20a is a perspective view of an example of a mating connector element.
Figure 20B:
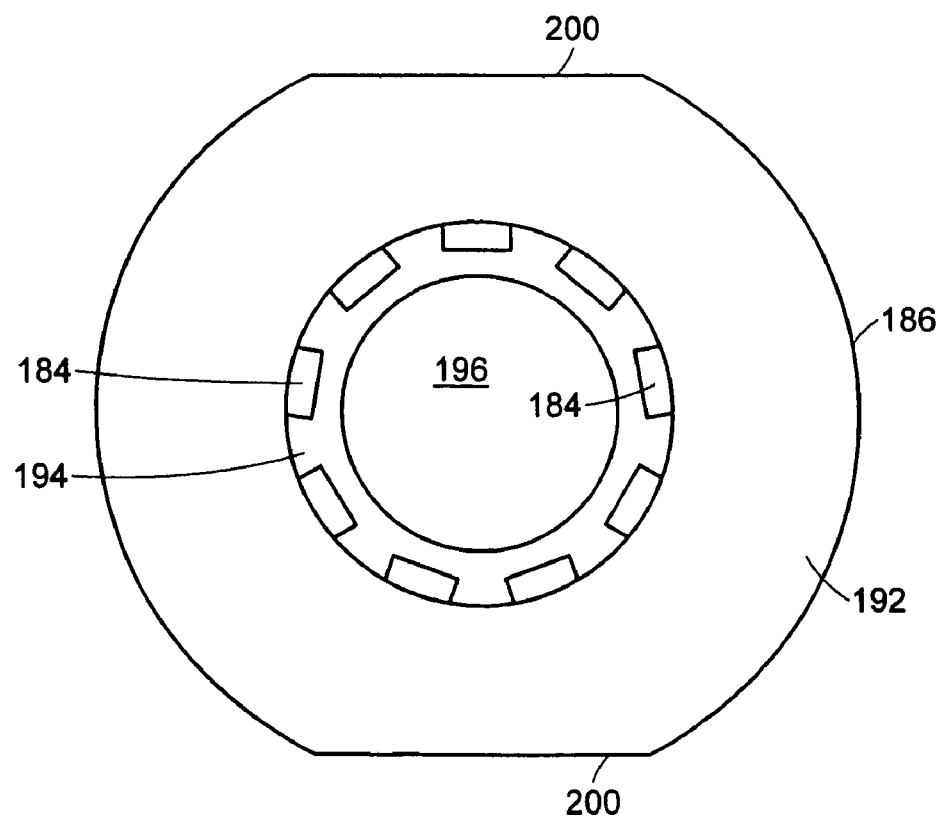
FIG. 20b is a cross-sectional view of another example of a the mating connector element.

Referring to FIGS. 20a and 20b, there are illustrated in perspective view and cross-section, respectively, two examples of a mating connector element 182 that may be used with the connector 170. According to one example, illustrated in FIG. 20a, the mating connector element 182 may include a dielectric or other non-conducting core 188 surrounded, or at least partially surrounded, by a conductive layer 190. The conductors 184 may be separated from the conductive layer 190 by insulating members 192. The insulating members may be separate for each conductor 184 as illustrated, or may comprise an insulating layer at least partially surrounding the conductive layer 190. The mating connector element may further include an insulating housing block 186.

According to another example, illustrated in FIG. 20b, a mating connector element 182 may comprise a conductive core 194 that may define a cavity 196 therein. Any one or more of an optical fiber, a strength member to increase the overall strength and durability of the rod member, and a heat transfer member that may serve to dissipate heat built up in the connector from the electrical signals propagating in the conductors, may be located within the cavity 196. In one example, a drain wire may be located within the cavity and may be connected to the conductive core to serve as a grounding wire for the connector. As illustrated in FIG. 20a, the housing block 186 may be round, increasing the circumference of the mating connector element, and may include one or more notches 198 that may serve as registration points for the connector to assist in aligning the mating connector element with the conductors of the woven tube. Alternatively, the housing block may include flattened portions 200, as illustrated in FIG. 20b, that may serve as registration guides. It is further to be appreciated that the housing block may have another shape, as desired and may include any form of registration known to, or developed by, one of skill in the art.

Figure 21:
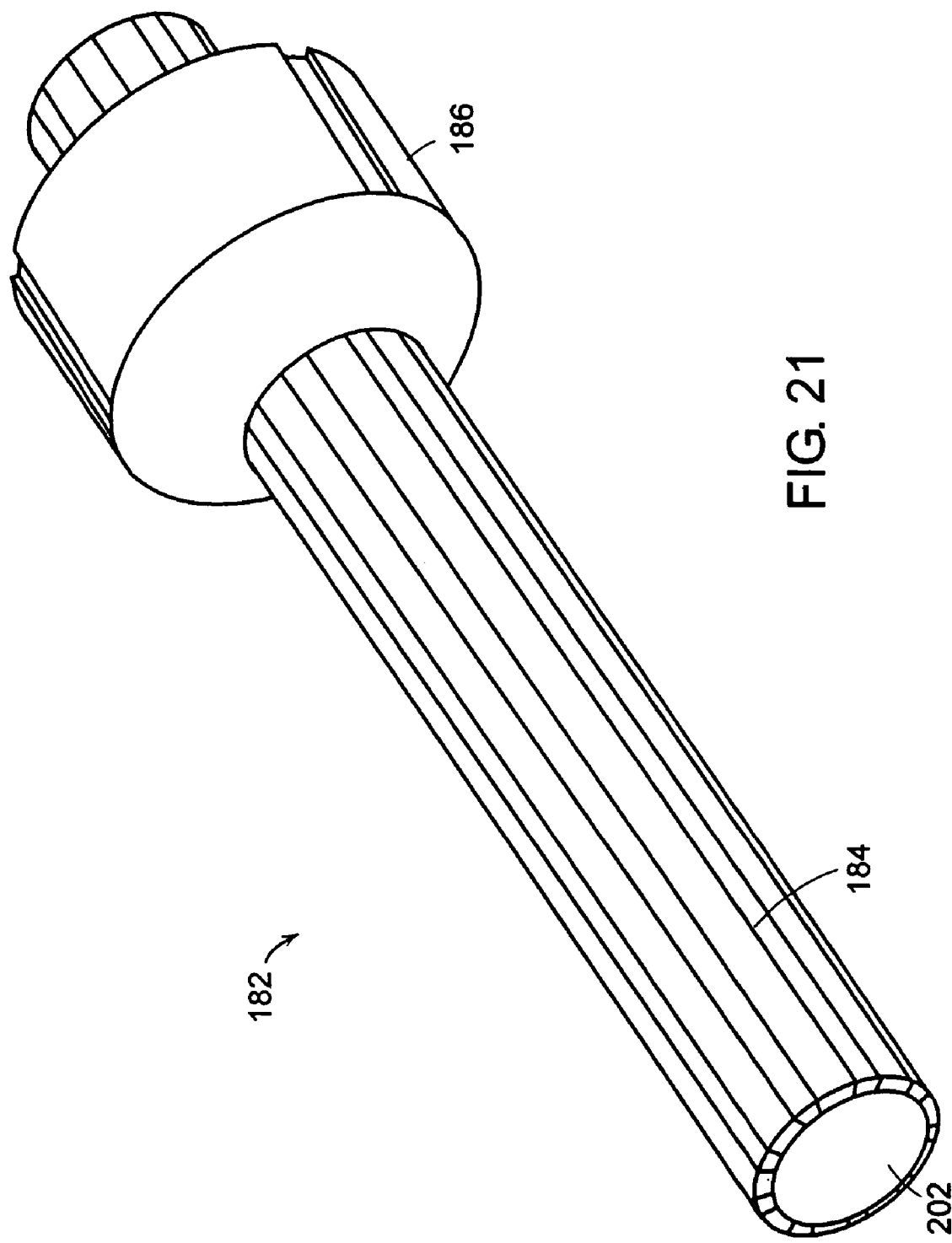
FIG. 21 is a perspective view of another example of a mating connector element that may form part of the connector of FIG. 18.

FIG. 21 illustrates yet another example of a mating connector element 182 that may be used with the connector 170. In this example, the mating connector element may include a dielectric or other non-conducting core 202 that may be formed with one or more grooves, to allow the conductors 184 to be formed therein, such that a top surface of the conductors 184 is substantially flush with an outer surface of the mating connector element.

Figure 22:
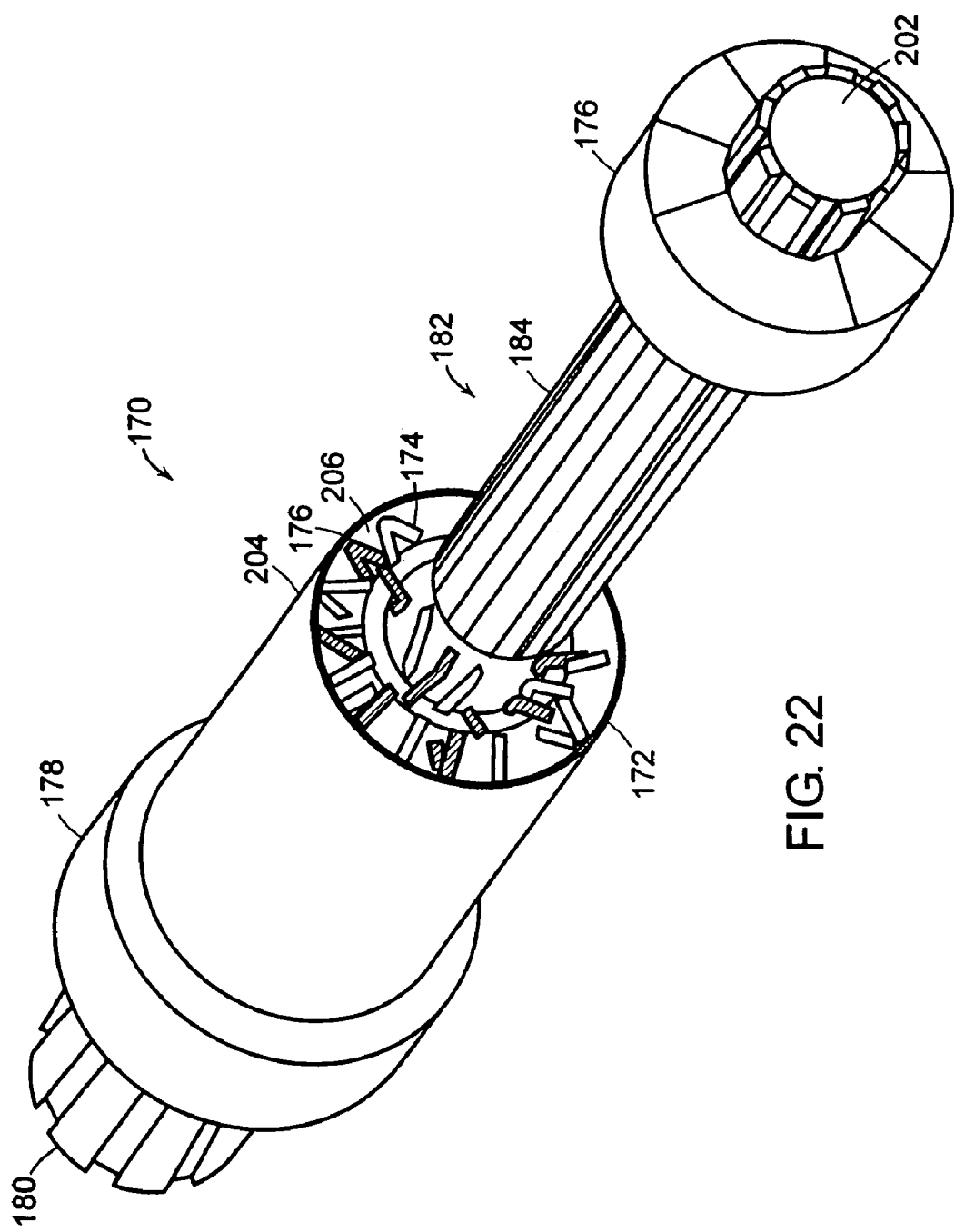
FIG. 22 is a perspective view of another example of a mating connector element, including a shield, that may form part of the connector of FIG. 18.

According to another example, illustrated in FIG. 22, the connector 170 may further comprise an electrical shield 204 that may be placed substantially surrounding the woven tube. The shield may comprise an non-conducting inner layer 206 that may prevent the conductors 174 from contacting the shield and thus being shorted together. In one example, the rod member may comprise a drain wire located within a cavity of the mating connector element, as discussed above, and the drain wire may be electrically connected to the electrical shield 204. The shield 204 may comprise, for example, a foil, a metallic braid, or another type of shield construction known to those of skill in the art.

Figure 23:
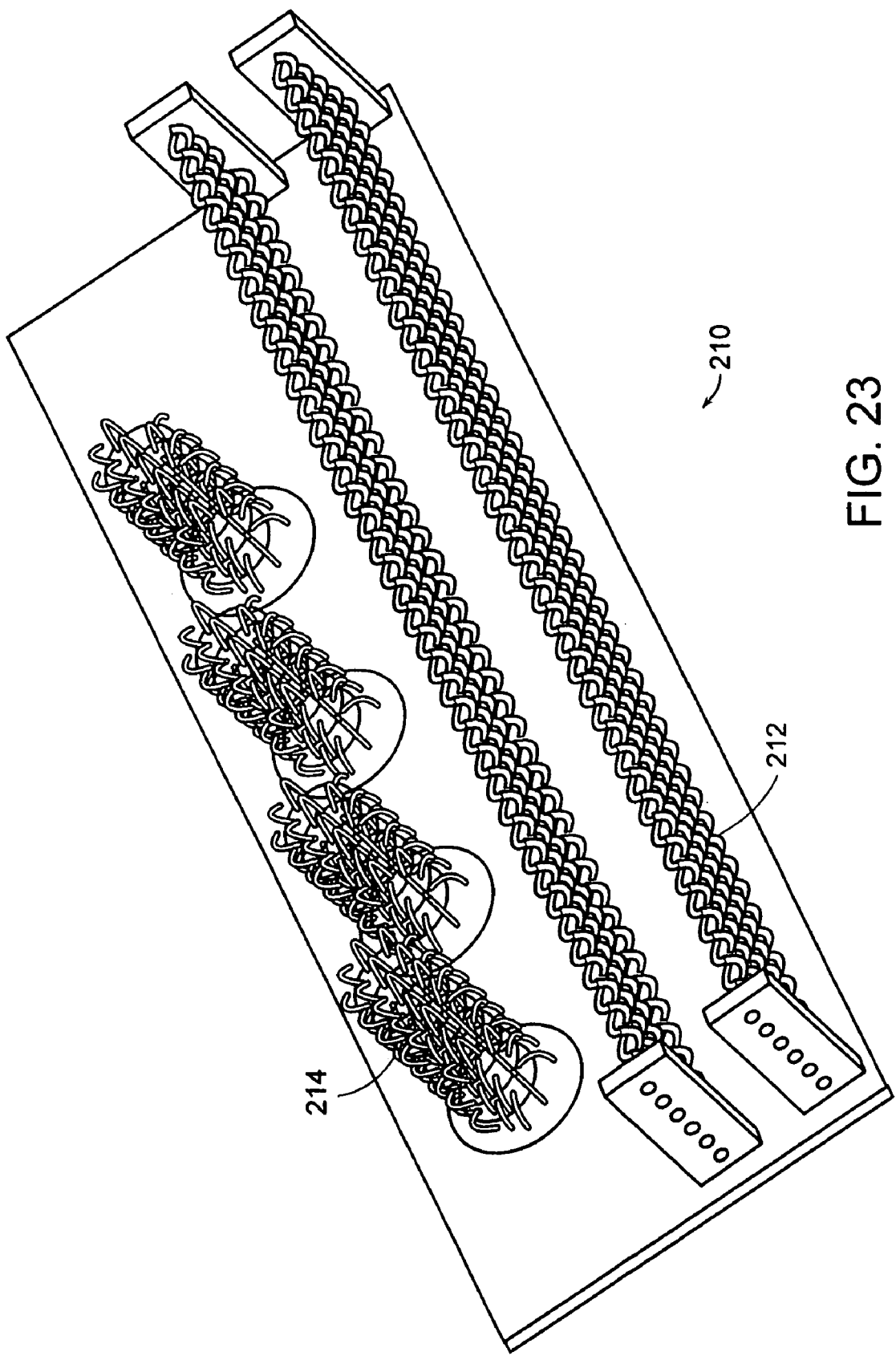
FIG. 23 is a perspective view of an array of woven connectors according to aspects of present disclosure.

Referring to FIG. 23, there is illustrated an example of an array of woven connectors according to aspects of the invention. According to one embodiment, the array 210 may comprise one or more woven connectors 212 of a first type, and one or more woven connectors 214 of a second type. In one example, the woven connectors 212 may be the connector 80 described above in reference to FIGS. 7–15*b*, and may be used to connect signal traces and or components on different circuit boards to one another. The woven connectors 214 may be the connector 170 described above in reference to FIGS. 18–22, and may be used to connect power traces or components on the different circuit boards to one another. In one example where the connector 170 may be used to provide power supply connections, the rod member 180 may be substantially completely conductive. Furthermore, in this example, there may be no need to include insulating fibers 176, and the fibers 172, previously described as being non-conductive, may in fact be conductive so as to provide a larger electrical path between the woven tube and the rod member. The connectors may be mounted to a board 216, as illustrated, which may be, for example, a backplane, a circuit board, etc., which may include electrical traces and components mounted to a reverse side, or positioned between the connectors (not shown).

As discussed herein, the utilization of conductors being woven or intertwined with loading fibers, e.g., non-conductive fibers, can provide particular advantages for electrical connector systems. Designers are constantly struggling to develop (1) smaller electrical connectors and (2) electrical connectors which have minimal electrical resistance. The woven connectors described herein can provide advantages in both of these areas. The total electrical resistance of an assembled electrical connector is generally a function of the electrical resistance properties of the male-side of the connector, the electrical resistance properties of the female-side of the connector, and the electrical resistance of the interface that lies between these two sides of the connector. The electrical resistance properties of both the male and female-sides of the electrical connector are generally dependent upon the physical geometries and material properties of their respective electrical conductors. The electrical resistance of a male-side connector, for example, is typically a function of its conductor's (or conductors') cross-sectional area, length and material properties. The physical geometries and material selections of these conductors are often dictated by the load capabilities of the electrical connector, size constraints, structural and environmental considerations, and manufacturing capabilities.

Figure 24:
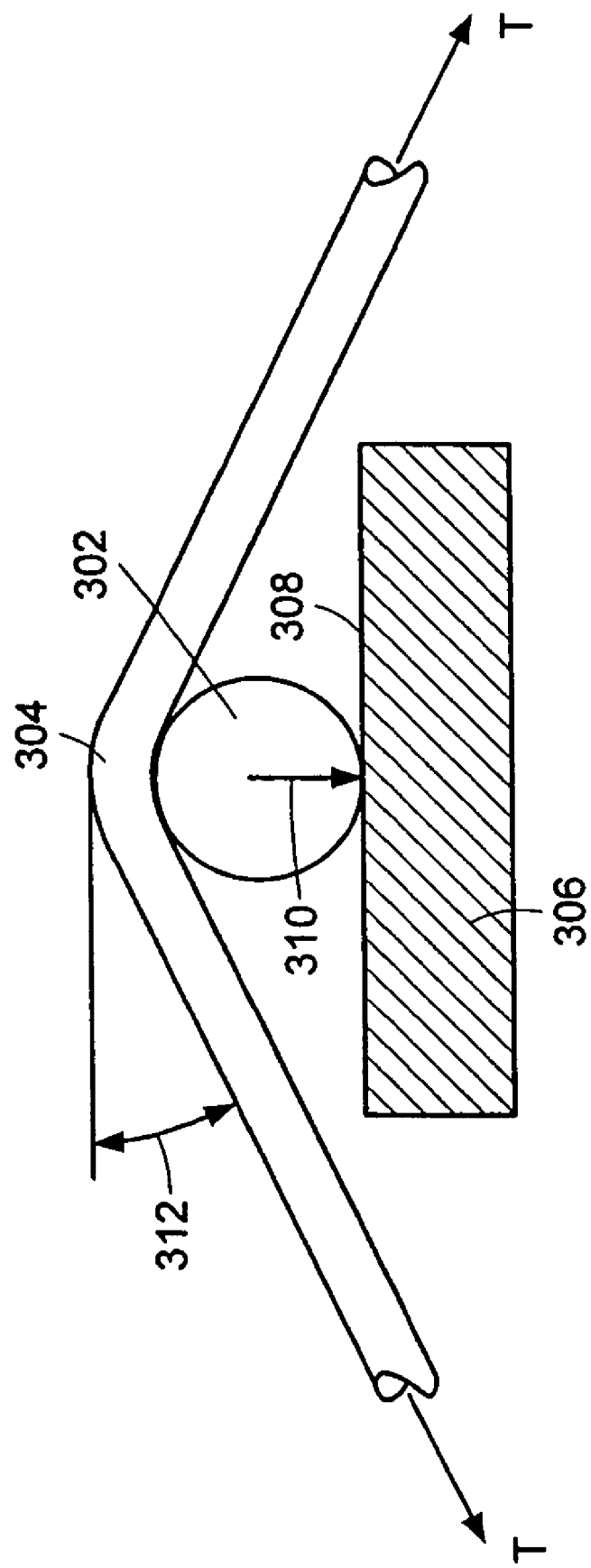
FIG. 24 is a cross-sectional view of an exemplary woven connector embodiment that illustrates the orientation of a conductor and a loading fiber.

Another critical parameter of an electrical connector is to achieve a low and stable separable electrical resistance interface, i.e., electrical contact resistance. The electrical contact resistance between a conductor and a mating conductor in certain loading regions can be a function of the normal contact force that is being exerted between the two conductive surfaces. As can be seen in FIG. 24, the normal contact force 310 of a woven connector is a function of the tension T exerted by the loading fiber 304, the angle 312 that is formed between the loading fiber 304 and the contact mating surface 308 of the mating conductor 306, and the number of conductors 302 of which the tension T is acting upon. As the tension T and/or angle 312 increase, the normal contact force 310 also increases. Moreover, for a desired normal contact force 310 there may be a wide variety of tension T/angle 312 combinations that can produce the desired normal contact force 310.

Figure 25A:
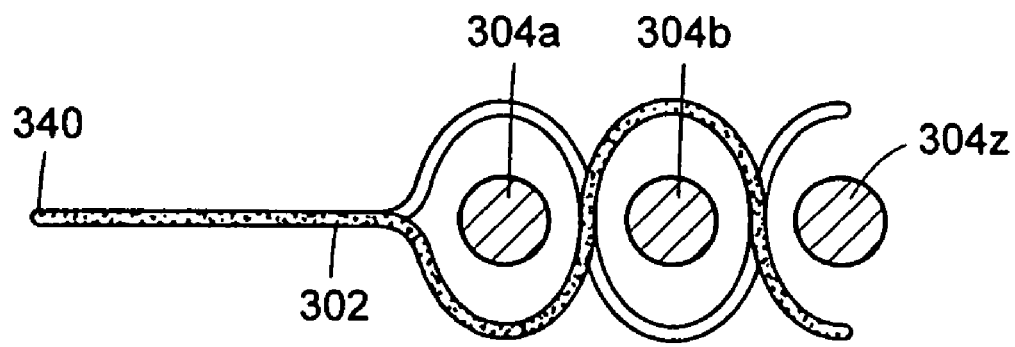
FIGS. 25a–b illustrate conductor woven connector embodiments.
Figure 25B:
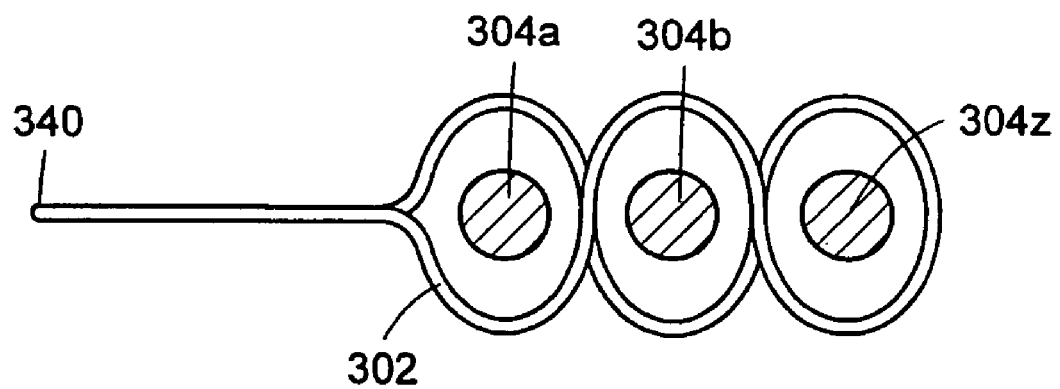

FIGS. 25*a*–*b* illustrate a method for terminating the conductors 302 that are woven onto loading fibers 304. Referring to FIG. 25*a*, conductor 302 winds around a first loading fiber 304*a*, a second loading fiber 304*b* and a last loading fiber 304*z*. The orientation and/or pattern of the conductor 302—loading fiber 304 weave can vary in other embodiments, e.g., a valley formed by a conductor 302 may encompass more than one loading fiber 304, etc. The conductors 302 on one side terminate at a termination point 340. Termination point 340 will generally comprise a termination contact, as previously discussed. In an exemplary embodiment, the conductors 302 may also terminate on the opposite side of the weave at another termination point (not shown) that, unlike termination point 340, will generally not comprise a termination contact. FIG. 25*b* illustrates a preferred embodiment for weaving the conductors 302 onto the loading fibers 304*a*–*z*. In FIG. 25*b*, the conductor 302 is woven around the first and second loading fibers 304*a*, 304*b* in the same manner as discussed above. In this preferred embodiment, however, conductor 302 then wraps around the last loading fiber 304*z* and is then woven around the second loading fiber 304*b* and then the first loading fiber 304*a*. Thus, the conductor 302 begins at termination point 340, is woven around the conductors 304*a*, 304*b*, wrapped around loading fiber 304*z*, woven (again) around loading fibers 304*b*, 304*a*, and terminates at termination point 340. Having a conductor 302 wrap around the last loading fiber 304*z* and becoming the next conductor (thread) in the weave eliminates the need for a second termination point. Consequently, when a conductor 302 is wrapped around the last loading fiber 304*z* in this manner the conductor 302 is referred to as being self-terminating.

Figure 26A:
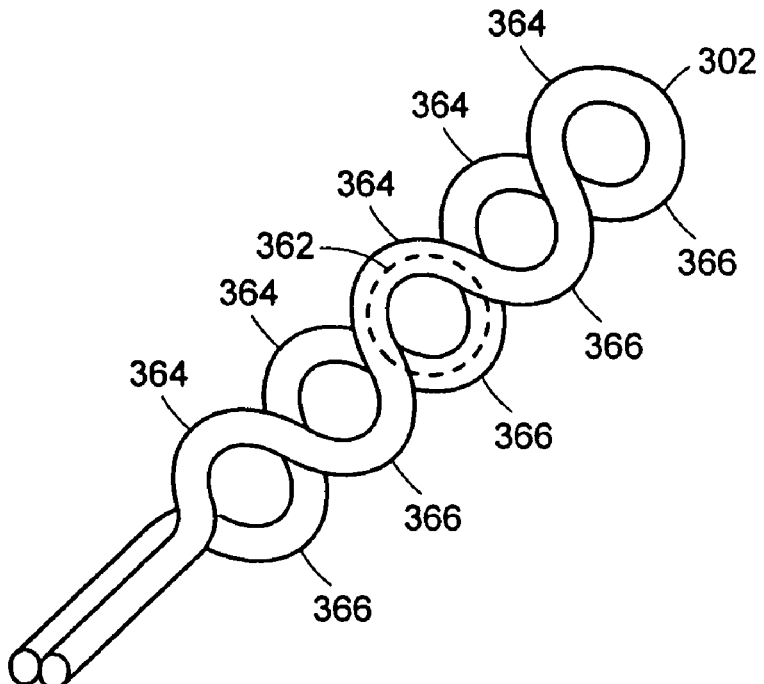
FIG. 26a–c illustrate woven connector embodiments having self-terminating conductors.
Figure 26B:
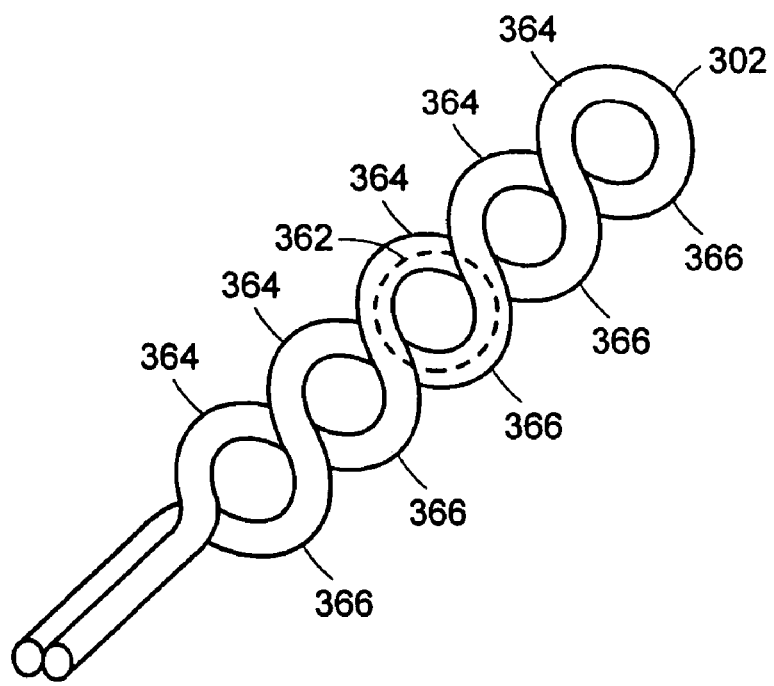
Figure 26C:
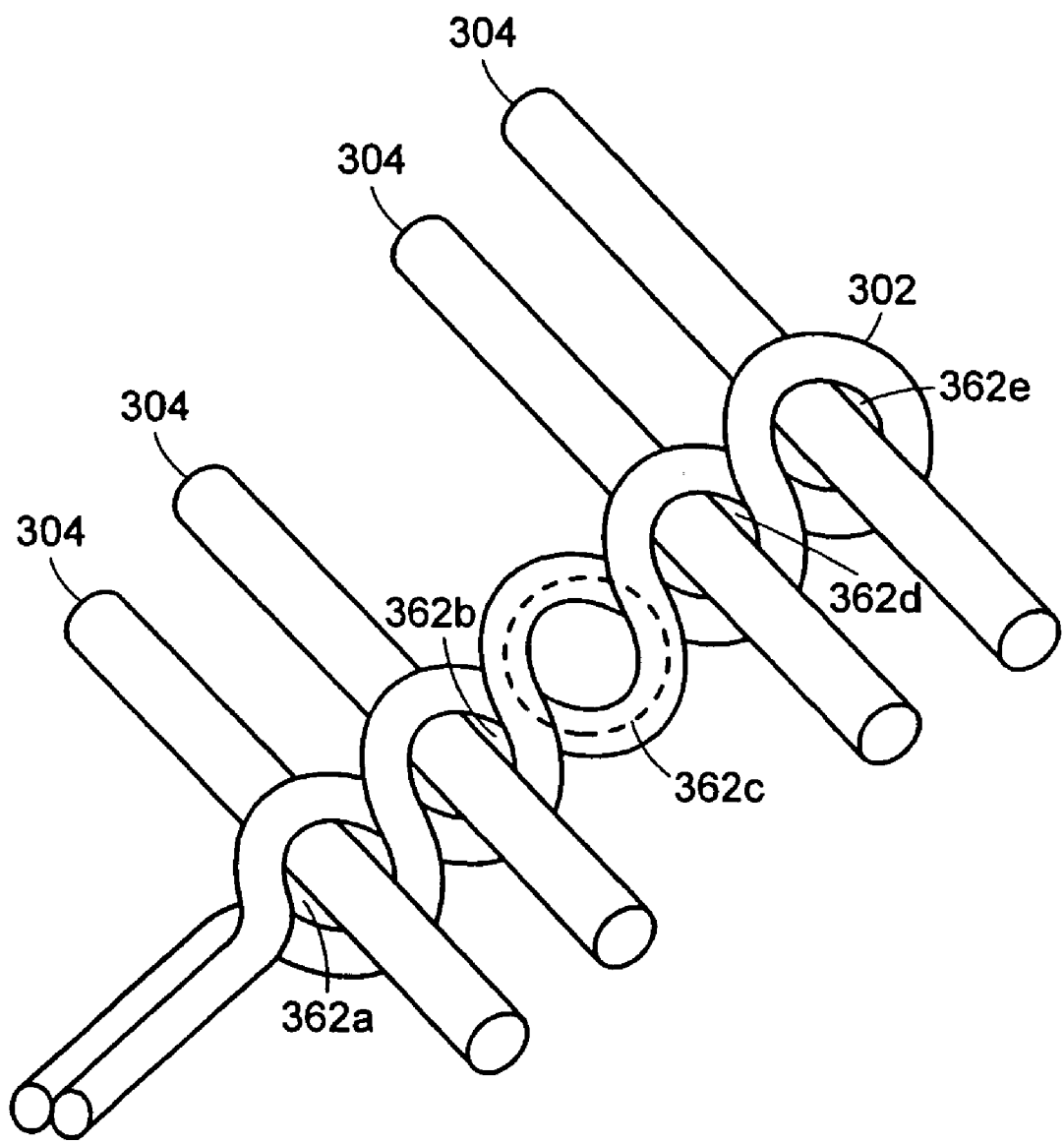

FIGS. 26*a*–*c* illustrate some exemplary embodiments of how conductor(s) 302 can be woven onto loading fibers 304. The conductor 302 of FIGS. 26*a*–*c* is self-terminating and, while only one conductor 302 is shown, persons skilled in the art will readily appreciate that additional conductors 302 will usually be present within the depicted embodiments. FIG. 26*a* illustrates a conductor 302 that is arranged as a straight weave. The conductor 302 forms a first set of peaks 364 and valleys 366, wraps back upon itself (i.e., is self-terminated) and then forms a second set of peaks 364 and valleys 366 that lie adjacent to and are offset from the first set of peaks 364 and valleys 366. A peak 364 from the first set and a valley 366 from the second set (or, alternatively, a valley 366 from the first set and a peak 364 from the second set) together can form a loop 362. Loading fibers 304 can be located within (i.e., be engaged with) the loops 362. While the conductor 302 of FIGS. 26*a*–*c* is shown as being self-terminating, in other exemplary embodiments, the conductors 302 need not be self-terminating. Using non self-terminating conductors 302, to form a straight weave similar to the one disclosed in FIG. 26*a*, a first conductor 302 forms a first set of peaks 364 and valleys 366 while a second conductor 302 forms a second set of peaks 364 and valleys 366 which lie adjacent to and are offset from the first set. The loops 362 are similarly formed from corresponding peaks 364 and valleys 366. FIG. 26*b* illustrates a conductor 302 that is arranged as a crossed weave. The conductor 302 of FIG. 26*b* forms a first set of peaks 364 and valleys 366, wraps back upon itself and then forms a second set of peaks 364 and valleys 366 which are interwoven with, and are offset from, the first set of peaks 364 and valleys 366. Similarly, peaks 364 from the first set and valleys 366 from the second set (or, alternatively, valleys 366 from the first set and peaks 364 from the second set) together can form loops 362, which may be occupied by loading fibers 304. Non self-terminating conductors 302 may also be arranged as a crossed weave.

FIG. 26c depicts a self-terminating conductor 302 that is cross woven onto four loading fibers 304. The conductor 302 of FIG. 26c forms five loops 362a–e. In certain exemplary embodiments, a loading fiber(s) 304 is located within each of the loops 362 that are formed by the conductors 302. However, not all loops 362 need to be occupied by a loading fiber 304. FIG. 26c, for example, illustrates an exemplary embodiment where loop 362c does not contain a loading fiber 304. It may be desirable to include unoccupied loops 362 within certain conductor 302—loading fiber 304 weave embodiments so as to achieve a desired overall weave stiffness (and flexibility). Having unoccupied loops 362 within the weave may also provide improved operations and manufacturing benefits. When the weave structure is mounted to a base, for example, there may be a slight misalignment of the weave relative to the mating conductor. This misalignment may be compensated for due to the presence of the unoccupied loop 362. Thus, by utilizing loops that are unoccupied or "unstitched", i.e., a loading fiber 304 does not contact the loop, compliance of the weave structure to ensure better conductor/mating conductor conductivity while keeping the weave tension to a minimum may be achieved. Utilizing unoccupied loops 362 may also permit greater tolerance allowances during the assembly process. Moreover, the use of unstitched loops 362 may allow the use of common tooling for different connector embodiments (e.g., the same tooling might be used for a weave 8 having eight loops 362 with six "stitched" loading fibers 304 as for a weave having eight loops 362 with eight loading fibers 304. As an alternative to using an unstitched loop 362, a straight (unwoven) conductor 302 may be used instead.

Figure 27:
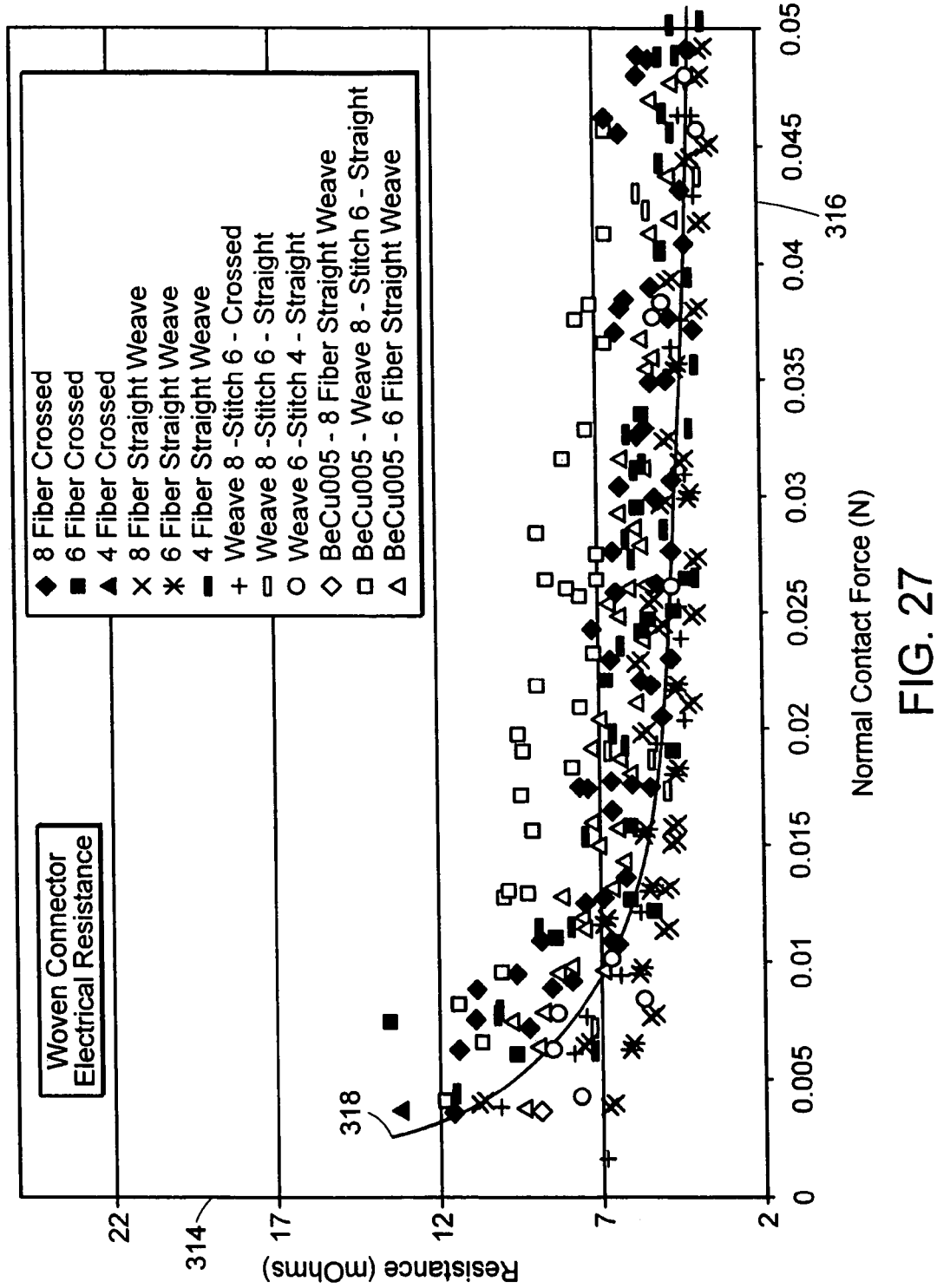
FIG. 27 illustrates the electrical resistance versus normal contact force relationship of several different woven connector embodiments.

Tests of a wide variety of conductor 302—loading fiber 304 weave geometries were performed to determine the relationship between normal contact force 310 and electrical contact resistance. Referring to FIG. 27, the total electrical resistance of the tested woven connector embodiments, as represented on y-axis 314, of the different woven connector embodiments (as listed in the legend) was determined over a range of normal contact forces, as represented on x-axis 316. As represented in FIG. 27, the general trend 318 indicates that as the normal contact force (in Newtons (N)) increases, the contact resistance component of the total electrical resistance (in milli-ohms (mOhms)) generally decreases. Persons skilled in the art will readily recognize, however, that the decrease in contact resistance only extends over a certain range of normal contact forces; any further increases over a threshold normal contact force will produce no further reduction in electrical contact resistance. In other words, trend 318 tends to flatten out as one moves further and further along the x-axis 316.

From the data of FIG. 27, for example, one can then determine a normal contact force (or range thereof) that is sufficient for minimizing a woven connector's electrical contact resistance. To generate these normal contact forces, the preferred operating range of the tension T to be loaded in the loading fiber(s) 304 and the angle 312 (which is indicative of the orientation of the loading fiber(s) 304 relative to the conductor(s) 302) can then be determined for an identified woven connector embodiment. As persons skilled in the art will readily appreciate, the vast majority of the conventional electrical connectors that are available today operate with normal contact forces ranging from about 0.35 to 0.5 N or higher. As is evident by the data represented in FIG. 27, by generating multiple contact points on conductors 302 of a woven connector system, very light loading levels (i.e., normal contact forces) can be used to produce very low and repeatable electrical contact resistances. The data of FIG. 27, for example, demonstrates that for many of the woven connector embodiments tested, normal contact forces of between approximately 0.020 and 0.045 N may be sufficient for minimizing electrical contact resistance. Such normal contact forces thus represent an order of magnitude reduction in the normal contact forces of conventional electrical connectors.

Figure 28A:
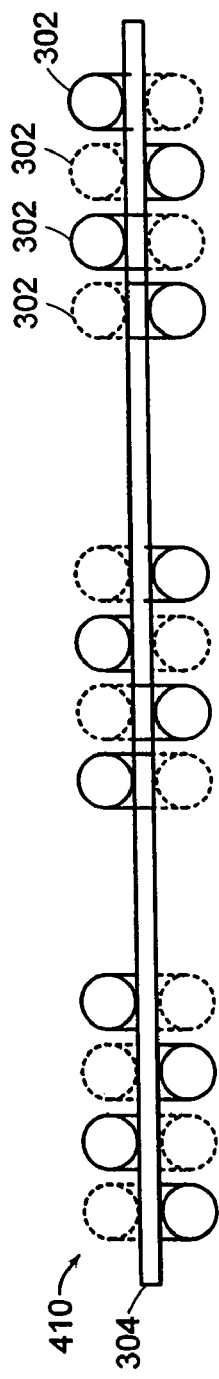
FIGS. 28a and 28b are cross-sectional views of one woven connector embodiment in accordance with the teachings of the present disclosure.
Figure 28B:
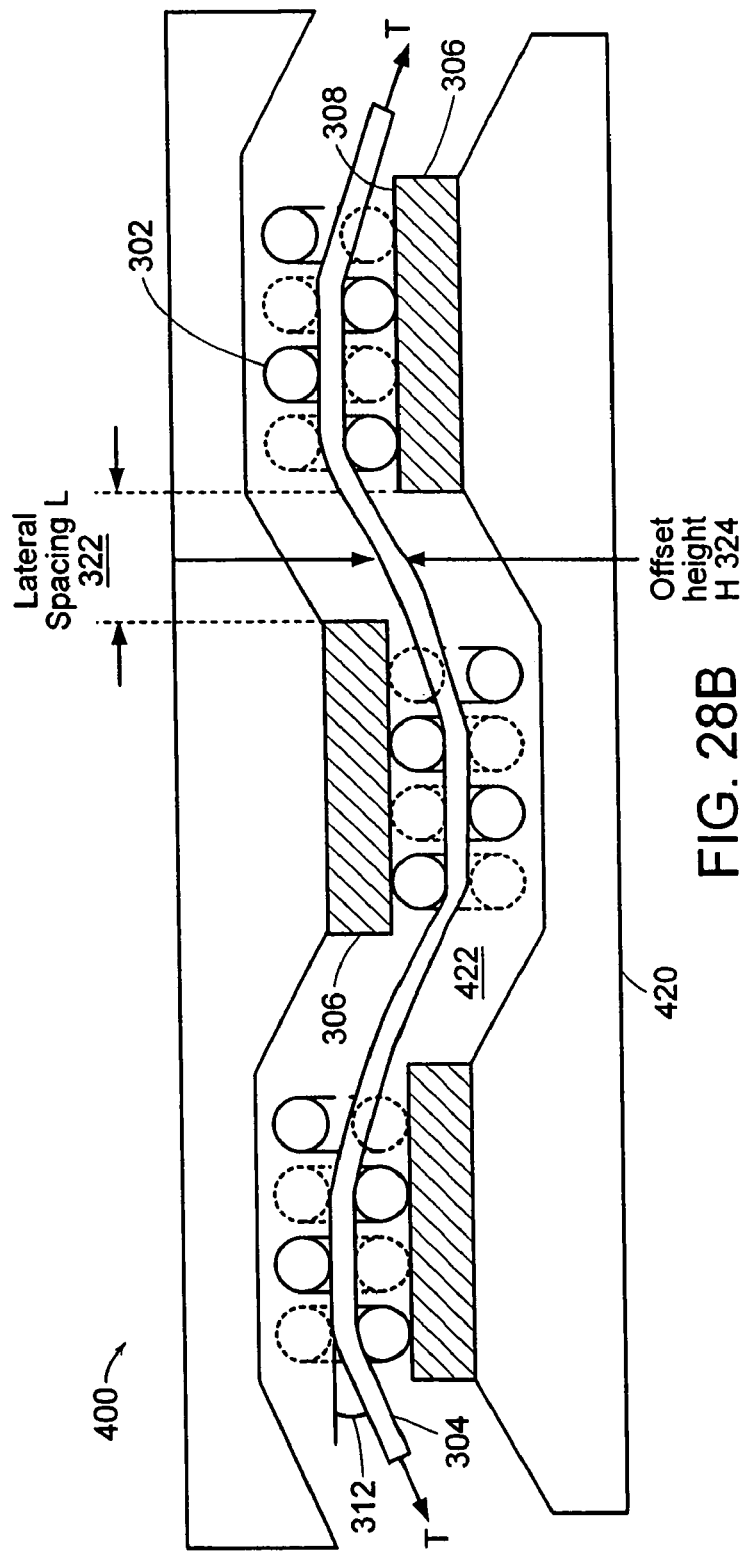

Recognizing that very low normal contact forces can be utilized in these woven multi-contact connectors, the challenge then becomes how to generate these normal contact forces reliably at each of the conductor 302's contact points. The contact points of a conductor 302 are the locations where electrical conductivity is to be established between the conductor 302 and a contact mating surface 308 of a mating conductor 306. FIGS. 28a and 28b depict an exemplary embodiment of a woven multi-contact connector 400 that is capable of generating desired normal contact forces at each of the contact points. FIGS. 26a and 26b depict cross-sectional views of a woven connector 400 having a woven connector element 410 and a mating connector element 420. The woven connector element 410 is comprised of loading fiber(s) 304 and conductors 302. The ends of the loading fibers(s) 304 generally are secured to end plates (not shown) or other fixed structures, as further described below. The loading fiber(s) 304 may be in an unloaded (non-tensioned) or loaded condition prior to the woven connector element 410 being engaged with the mating connector element 420. While only one loading fiber 304 is shown in these cross-sectional views, it should be recognized that additional loading fibers 304 are preferably located behind (or in front of) the depicted loading fiber 304. Woven connector element 410 has three bundles, or arrays, of conductors 302 woven around each loading fiber 304. The hidden-line portions of conductors 302 reflect where the woven conductors' 302 peaks and valleys are out of plane with the particular cross-section shown. Generally, a second loading fiber 304 (not shown) would be utilized in conjunction with these out-of-plane peaks and valleys. Although not shown here, conductors 302 can be placed directly against adjacent conductors 302 so that electrical conductivity between adjacent conductors 302 can be established.

FIG. 28b depicts the woven connector element 410 of FIG. 28a after being engaged with the mating connector element 420. To engage the woven connector element 410, the woven connector element 410 is inserted into cavity 422 of mating connector element 420. In certain embodiments, a front face (not shown) of the mating conductors 306 may be chamfered to better accommodate the insertion of the woven connector element 410. Upon insertion into the mating connector element 420, the loading fibers 304 are displaced to accommodate the profile of the cavity 422 and the presence of the mating conductors 306. In some embodiments, the displacement of the loading fibers 304 can be facilitated through a stretching of the loading fibers 304. In other embodiments, this displacement can be accommodated through the tightening of an otherwise slack (in a pre-engaged condition) loading fiber 304 or, alternatively, a combination of stretching and tightening, which results in a tension T being present in the loading fibers 304. As previously discussed, due to the orientation and arrangement of the loading fibers 304—conductors 302 weave, the tension T in the loading fibers 304 will cause certain normal contact forces to be present at the contact points. As can be seen in FIG. 28b, the woven connector 400 has mating conductors 306 that are alternately located on the interior surfaces (which define the cavity 422) of the mating connector element 420. This alternating contact arrangement produces alternating contacts on opposite parallel planar contact mating surfaces 308.

Instead of utilizing a flat (e.g., substantially planar) contact mating surface 308 as depicted in FIG. 28b, another embodiment uses a curved, e.g., convex, contact mating surface 308. The curvature of the contact mating surface 308 may permit improved tolerance controls for contact between the contact points of the conductors 302 and the mating conductors 306 in the normal direction. The curved surface (of the contact mating surfaces 308) helps maintain a very tightly controlled normal force between these two separable contact surfaces. The curved surface itself, however, does not generally assist in maintaining lateral alignment between the conductors 302 and the mating conductors 306. Insulating fibers (e.g., insulating fibers 104 as shown in FIG. 7) placed parallel with and interspersed between segments of conductors 302 could be utilized to assist with the lateral alignment of adjacent conductors 302. The curvature of the contact mating surface 308 need not be that significant; improved location tolerances can be realized with a relatively small amount of curvature. In some preferred embodiments, contact mating surfaces 308 having a large radius of curvature may be used to achieve some desired manufacturing location tolerances. FIG. 29 illustrates an alternative mating conductor 306 having a curved contact mating surface 308 that could be used in the woven connector 400 of FIG. 28. The curvature of the contact mating surface 308 allows for a very generous positioning tolerance during manufacturing and operation.

Referring to FIG. 29, improved location tolerances can often be achieved by utilizing contact mating surfaces 308 which have a radius of curvature R 336 that is greater than the width W 309 of the mating conductor 306. Specifically, the relationship between the lateral spacing L 332 found between two conductors 302 and the angle a 334 between the two conductors 302 and the radius of curvature R 336 of the contact mating surface 308 is given by the formula L≈a R. The minimum of the lateral spacing L 332 is set by the diameter of the conductors 302 and, thus, the lateral spacing L 332 may be tightly controlled by locating the conductors 302 directly against each other. In other words, in certain exemplary embodiments the conductors 302 are located so that no gap exists between the adjacent conductors 302. Thus, for a very low angle a 334, the required radius of curvature R 336 can then be determined. In an exemplary embodiment having an angle a 334 of 0.25 degrees and conductors 302 having a diameter of 0.005 inches, for example, a preferred contact mating surface's 308 radius of curvature R 336 would thus be on the order of about 2.29 inches. The tolerance on this is also quite generous as the angle a 334 is directly related to the radius of curvature R 336. For example, if the tolerance on the radius of curvature R 336 was set at ±0.10 inches, then the angle a 334 could vary from between 0.261 degrees and 0.239 degrees. To illustrate the benefits of using a curved contact mating surface 308, to maintain a tolerance of 0.03 degrees on the flat array embodiment of FIG. 28 would require a tolerance of 0.0000105 inches on the offset height H 324. Additionally, the introduction of curved contact mating surfaces 308 does not materially affect the overall height of the woven connectors. With a radius of curvature R 336 of 2.29 inches and a mating conductor 306 width W 309 of 0.50 inches, for example, the total height 311 of the arc would only be about 0.014 inches, i.e., the contact mating surface 308 is nearly flat.

Load balancing is an issue with multi-contact electrical connectors, and particularly so with multi-contact electrical power connectors. Load imbalances within electrical connectors can cause the connectors to burn-out and thus become inoperable. In their basic form, electrical connectors simply provide points of electrical contact between male and female conductive pins. In electrical connectors that are load balanced, the incoming currents are evenly distributed through each of the contact points. Thus for a 10 amp connector having four contact points, the connector is balanced if 2.5 amps are delivered through each contact point. If a connector is not load balanced, then more current will pass through one contact than another contact. This imbalance of electrical current may cause overloading at one of the "overloaded" contact points, which can result in localized welding, localized thermal spikes and conductor plating damage, all of which can lead to increased connector wear and/or very rapid system failure. A load imbalance can be caused by having different conductive path lengths in the connector system, high separable interface electrical contact resistance at one point (e.g., due to poor contact geometry), or large thermal gradients in the connector. An advantage of power connectors as taught by this disclosure is that they can be fully (or substantially) load balanced across many contact points. For each conductor 302 (i.e., conductive fiber), the first contact point that is to make electrical contact with the mating conductor 306 can be designed to carry the full current load that is to be allocated for that conductor 302. Subsequent contact points located along the conductor 302 are also generally designed to carry the full current load in case there is a failure (to provide electrical contact) at the first contact point. The additional contact points located downstream of the first contact point on each of the conductors 302 therefore can carry all or some of the allocated current, but their primary purpose is typically to provide contact redundancy. Moreover, as already stated, the multiple contact points help to prevent localized hot spots by producing multiple thermal pathways.

In most exemplary embodiments, the conductors 302 of a connector will generally have similar geometries, electrical properties and electrical path lengths. In some embodiments, however, the conductors 302 of a connector may have dissimilar geometries, electrical properties and/or electrical path lengths. Additionally, in some preferred power connector embodiments, each conductor 302 of a connector is in electrical contact with the adjacent conductor(s) 302. Providing multiple contact points along each conductor 302 and establishing electrical contact between adjacent conductors 302 further ensures that the multi-contact woven power connector embodiments are sufficiently load balanced. Moreover, the geometry and design of the woven connector prohibit a single point interface failure. If the conductors 302 located adjacent to a first conductor 302 are in electrical contact with mating conductors 306, then the first conductor 302 will not cause a failure (despite the fact that the contact points of the first conductor 302 may not be in contact with a mating conductor 306) since the load in the first conductor 302 can be delivered to a mating conductor 306 via the adjacent conductors 302.

Figure 30:
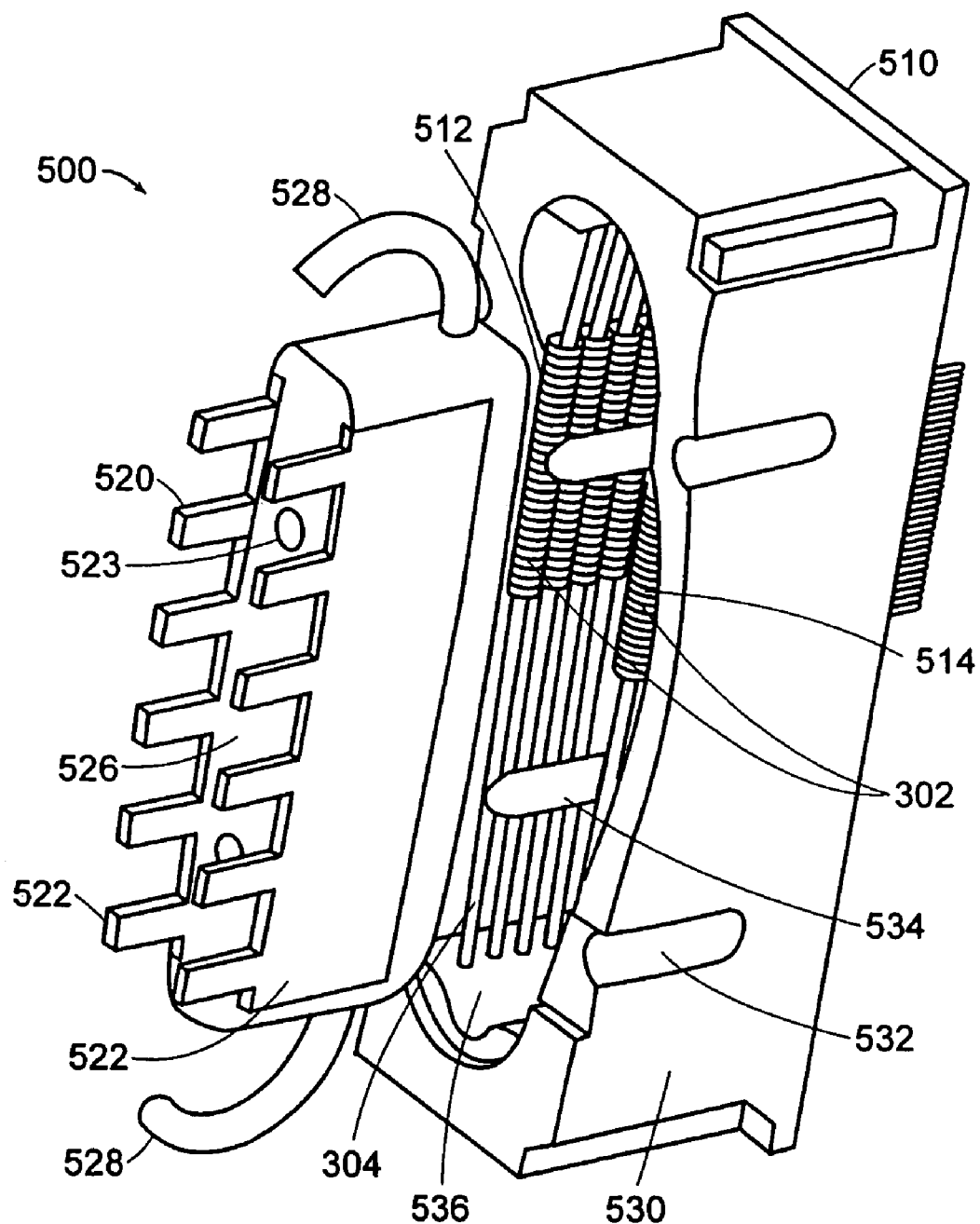
FIG. 30 depicts an exemplary embodiment of a woven power connector in accordance with the teachings of the present disclosure.

FIG. 30 illustrates an exemplary embodiment of a load-balanced multi-contact woven power connector 500. The power connector 500 consists of two extended arrays, a power array and a return array. These arrays provide multiple contact points over a wide area, which can result in high redundancy, lower separable electrical contact resistance, and better thermal dissipation of parasitic electrical losses. The power connector 500 as shown is a 30 amp DC connector having a power circuit 512 and a return (ground) circuit 514. Persons skilled in the art will readily recognize that other power connectors having different arrangements and power capabilities can be constructed without departing from the scope of the present disclosure. The load capabilities of the power connector 500 can be increased by adding additional conductors 302, for example. Referring to FIG. 30, the power connector 500 is comprised of a woven connector element 510 and a mating connector element 520. The mating connector element 520's external housing has been omitted from these figures for clarity. The woven connector element 510 includes a housing 530, a power circuit 512, a return circuit 514, end plates 536, alignment pins 534 and a plurality of loading fibers 304. The housing 530 has several recesses 532 that can facilitate the mating of the mating connector element's external housing (not shown) to the housing 530 of the woven connector element 510. The recesses 532 may accommodate an alignment pin (not shown) or a fastening means (not shown). The power circuit 512 is comprised of several conductors 302 woven around several loading fibers 304 in accordance with the teachings of the present disclosure. To achieve a desired load capacity of 30 amps, the power circuit 512 may have between 20–40 conductors 302 depending upon the diameter of the conductors 302 and their electrical properties, for example.

In certain exemplary embodiments, the conductors 302 can be comprised of copper or copper alloy (e.g., C110 copper, C172 Beryllium Copper alloy) wires having diameters between 0.0002 and 0.010 inches or more. Alternatively, the conductors may also be comprised of copper or copper alloy flat ribbon wires having comparable rectangular cross-section dimensions. The conductors 302 may also be plated to prevent or minimize oxidation, e.g., nickel plated or gold plated. Acceptable conductors 302 for a given woven connector embodiment should be identified based upon the desired load capabilities of the intended connector, the mechanical strength of the candidate conductor 302, the manufacturing issues that might arise if the candidate conductor 302 is used and other system requirements, e.g., the desired tension T. The conductors 302 of the power circuit 512 exit a back portion of the housing 530 and may be coupled to a termination contact or other conductor element through which power can be delivered to the power connector 500. As is discussed in more detail below, the loading fibers 304 of the power circuit 512 are capable of carrying a tension T that ultimately translates into a contact normal force being asserted at the contact points of the conductors 302. In exemplary embodiments, the loading fibers 304 may be comprised of nylon, fluorocarbon, polyaramids and paraaramids (e.g., Kevlar®, Spectra®, Vectran®), polyamids, conductive metals and natural fibers, such as cotton, for example. In most exemplary embodiments, the loading fibers 304 have diameters (or widths) of about 0.010 to 0.002 inches. However, in certain embodiments, the diameter/widths of the loading fibers 304 may be as low as 18 microns when high performance engineered fibers (e.g., Kevlar) are used. In a preferred embodiment, the loading fibers 304 are comprised of a non-conducting material. The return circuit 514 is arranged in the same manner as the power circuit 512, except that the power circuit 512 is coupled to a termination contact that can be connected to a return circuit.

The mating connector element 520 of the power connector 500 consists of an external housing (not shown), an insulating housing 526, two mating conductors 522 and two spring arms 528. The mating conductors 522 are attached to opposite sides of the insulating housing 526 so that when the mating connector element 520 is engaged with the woven connector element 510, the contact points of the conductors 302 (of circuits 512 and 514) will come into electrical contact with the mating conductors 522. Insulating housing 526 serves to provide a structural foundation for the mating conductors 522 and also to electrically isolate the mating conductors 522 from each other. Insulating housing 526 has holes 523 that can accommodate the alignment pins 534 and thus assist in facilitating the coupling of the mating connector element 520 to the woven connector element 510 (or vice versa). Spring arms 528 may act to firmly secure the mating connector element 520 to the woven connector element 510. Additionally, in certain preferred embodiments, spring arms 528 also operate in conjunction with the end plates 536 of the woven connector element 510 to exert a tension load T in the loading fibers 304 of the woven connector element 510.

Figure 31:
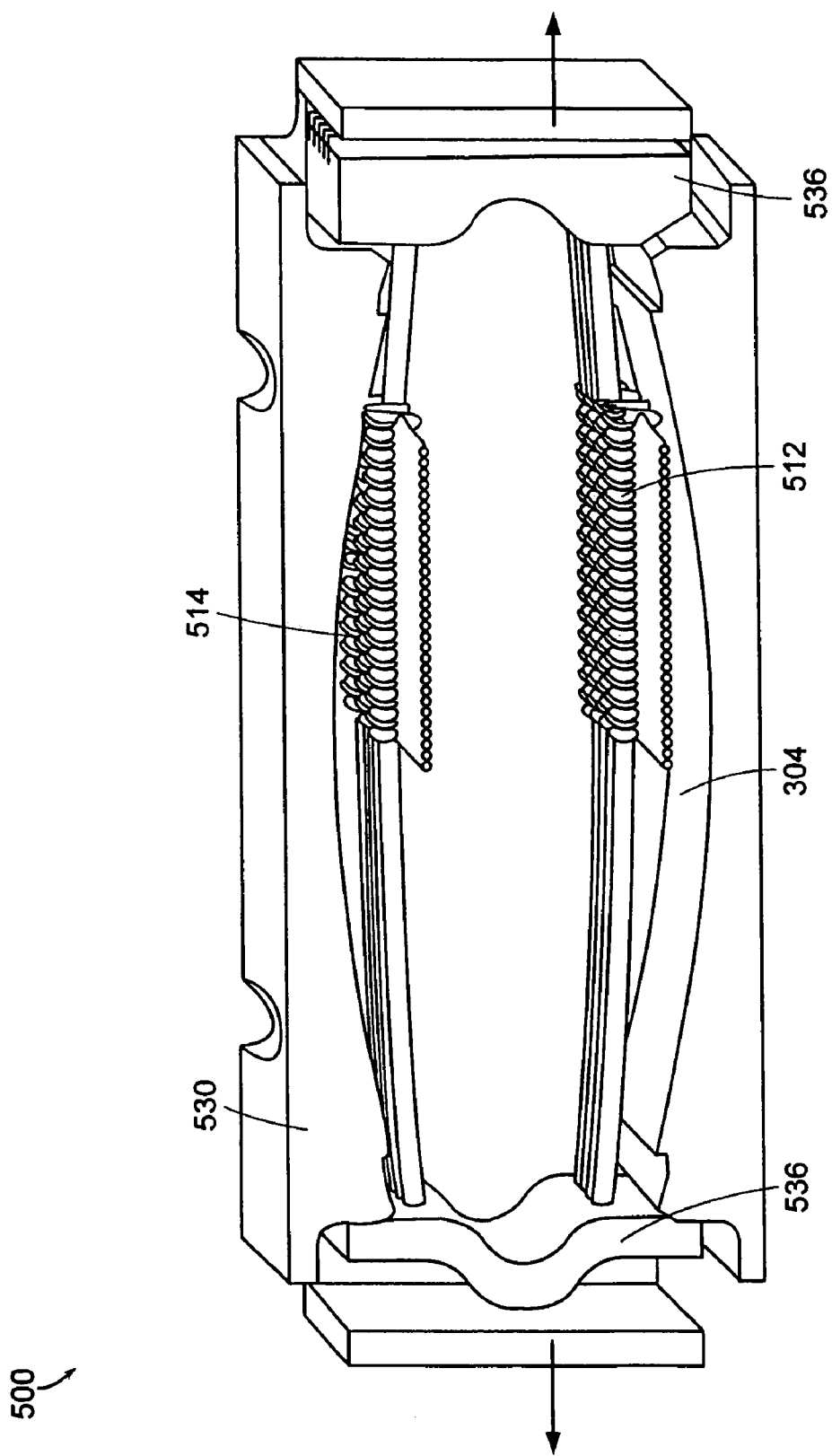
FIG. 31 is rear view of the woven connector embodiment of FIG. 30.

FIG. 31 illustrates an exemplary embodiment of a woven connector element 510 having floating end plates 536 that are capable of generating a tension T in loading fibers 304. FIG. 31 depicts a rear view of the woven connector element 510 of FIG. 30 with a back portion of the housing 530 removed for clarity. Loading fibers 304 are interwoven with the conductors 302 of the power circuit 512 and the return circuit 514. The ends of the loading fibers 304 are coupled to the two opposite floating end plates 536. The ends of the loading fibers 304 can be coupled to the floating end plates through a wide variety means know in the art, for example, by mechanical fastening means or bonding means. The floating end plates 536 may be allowed to float (i.e., remain unconstrained) prior to the installation of mating connector element 520 or, in an alternate embodiment, secondary spring mechanisms (not shown) coupled to the housing 530 and an end plate 536 may be used to control the lateral (e.g., outward) displacement of the end plates 536, i.e., in a direction away from the circuits 512, 514. In some exemplary embodiments, the loading fibers 304 will be in an un-tensioned state prior to the installation of the mating connector element 520. In other exemplary embodiments, however, some tensile load (which will usually be less than the tension T needed to generate a desired normal contact force) may be present in the loading fibers 304 prior to the installation of the mating connector 520. This pre-installation tensile load may be due to the presence of the secondary spring mechanisms or, alternatively, may be pre-loaded onto the loading fibers 304 when the loading fibers 304 are coupled to the end plates 536.

Upon inserting the mating connector element 520 into the woven connector element 510 (or vice versa), the spring arms 528 of the mating connector element 520 engage the floating end plates 536 of the woven connector element 510. Based upon the stiffness of the spring arms 528, the stiffness and/or elasticity of the conductors 302, the stiffness of the secondary spring mechanism (if present) and the pre-installation dimensions/locations of the spring arms 528 and the end plates 536, the end plates 536 will become displaced (move outward) to some degree because of the presence of the spring arms 528. The spring arms 528, of course, may also experience some deflection during this process. This outward displacement of the floating end plates 536 can cause a tension T to be generated in the loading fibers 304. In an exemplary embodiment, the loading fibers 304 are comprised of an elastic material. In such exemplary embodiments, the relative displacement of the two end plates 536 may result in a substantially equal amount of stretching in the load fibers 304. In other exemplary embodiments, spring arms 528 can be mounted directly on the floating end plates 536 of the woven connector element 510 instead of on the mating connector element 520 as depicted in FIG. 30.

Figure 32A:
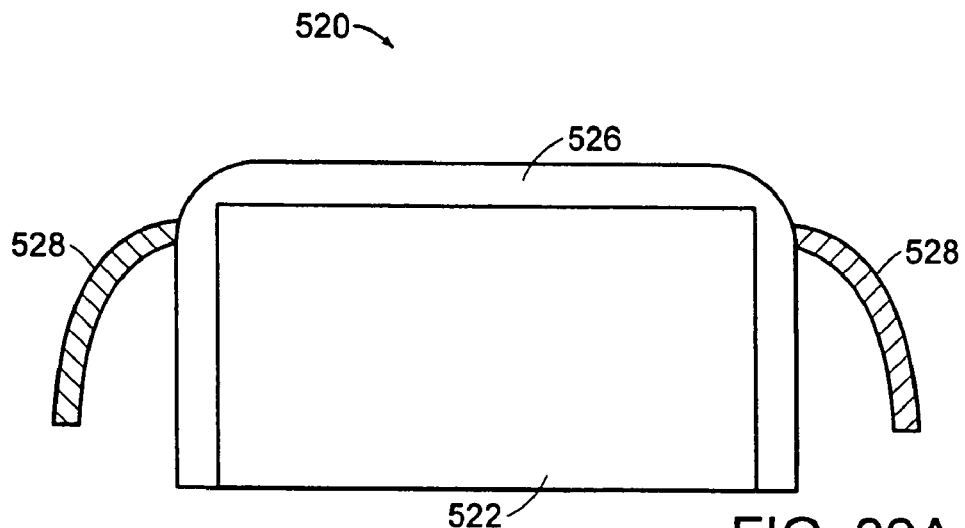
FIG. 32 depicts several exemplary spring arm embodiments.
Figure 32B:
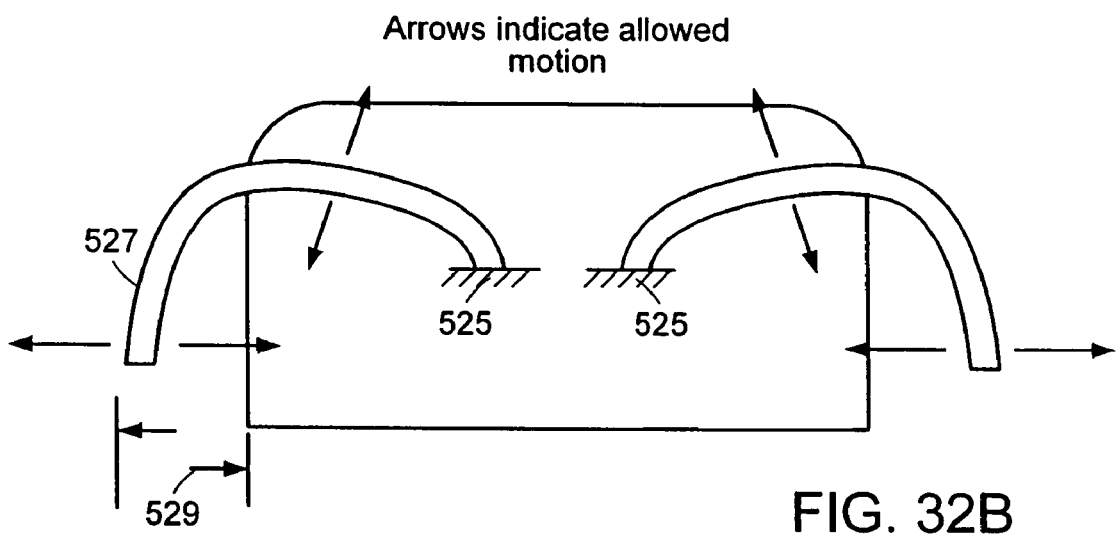
Figure 32C:
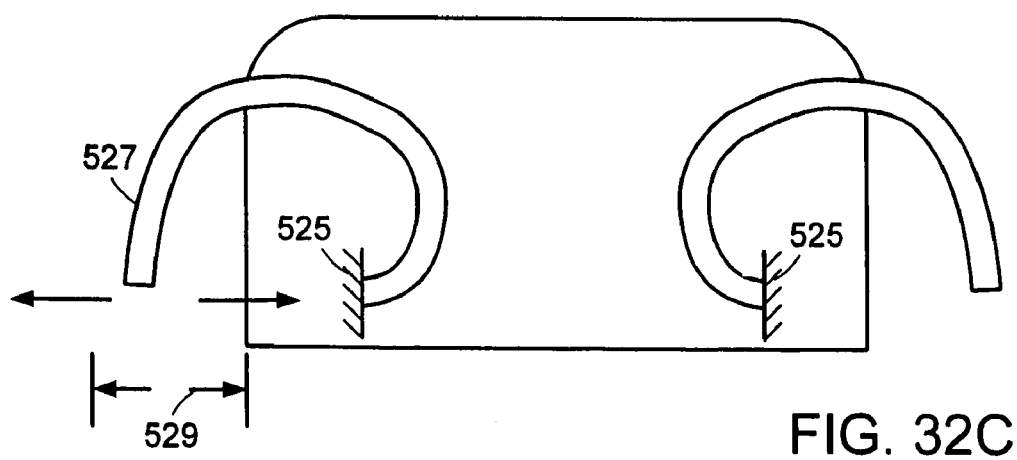

FIGS. 32a–c illustrates some exemplary embodiments of spring arms 528 that are constructed in accordance with the teachings of the present disclosure. The effective spring height 529 of the spring arms 528 can be increased by embedding a portion of the spring arm 528 within the insulating housing 526 of the mating connector element 520. It is desirable that the spring arms 528 be capable of generating a large relative deflection motion (e.g., approximately 0.020 inches) for a given load when the mating connector element 520 is inserted into the woven connector element 510. By generating a large relative motion, the manufacturing and alignment tolerances on the assembly can be loosened (e.g., the loading fiber's 304 length tolerance could be modified from ±0.005 inches to ±0.015 inches) while still keeping the final assembled line tolerance within a specified range. FIG. 32a depicts an exemplary embodiment of spring arms 528 where little or none of the spring arm 528 is embedded into the insulating housing 526 of the mating connector element 520. FIGS. 32b–c illustrate two preferred embodiments of spring arms 528 that have a significant portion of the spring arms 528 embedded into the insulating housing 526 of the mating connector element 520. The portion of the spring arms 528 that are embedded in the insulating housing 526 should be free to move (within the insulating housing 526) except at the anchors 525, where they are fixed. The spring arms 528 of FIG. 32b essentially travel around half a circle and terminate at anchors 525, which are substantially parallel to the effective direction of tip deflection 527. The spring arms 528 of FIG. 32c essentially travel around three-quarters of a circle and terminate at anchors 525 which are substantially orthogonal to the effective direction of tip deflection 527. The spring arm 528 embodiments depicted in FIGS. 32b–c will have longer effective spring heights 529, which yield correspondingly larger tip deflection motions 527 for the same force as compared to the "short" spring arms 528 embodiment of FIG. 32a.

In certain exemplary embodiments, the spring arm 528 can be comprised of a metal or metal alloy, such as nitinol, for example, and can be a wire spring or a ribbon spring, amongst others. Depending on the diameter of the spring arm 528 and connector 500 dimensions, multiple turns of the spring arm 528 may also be possible.

Figure 33:
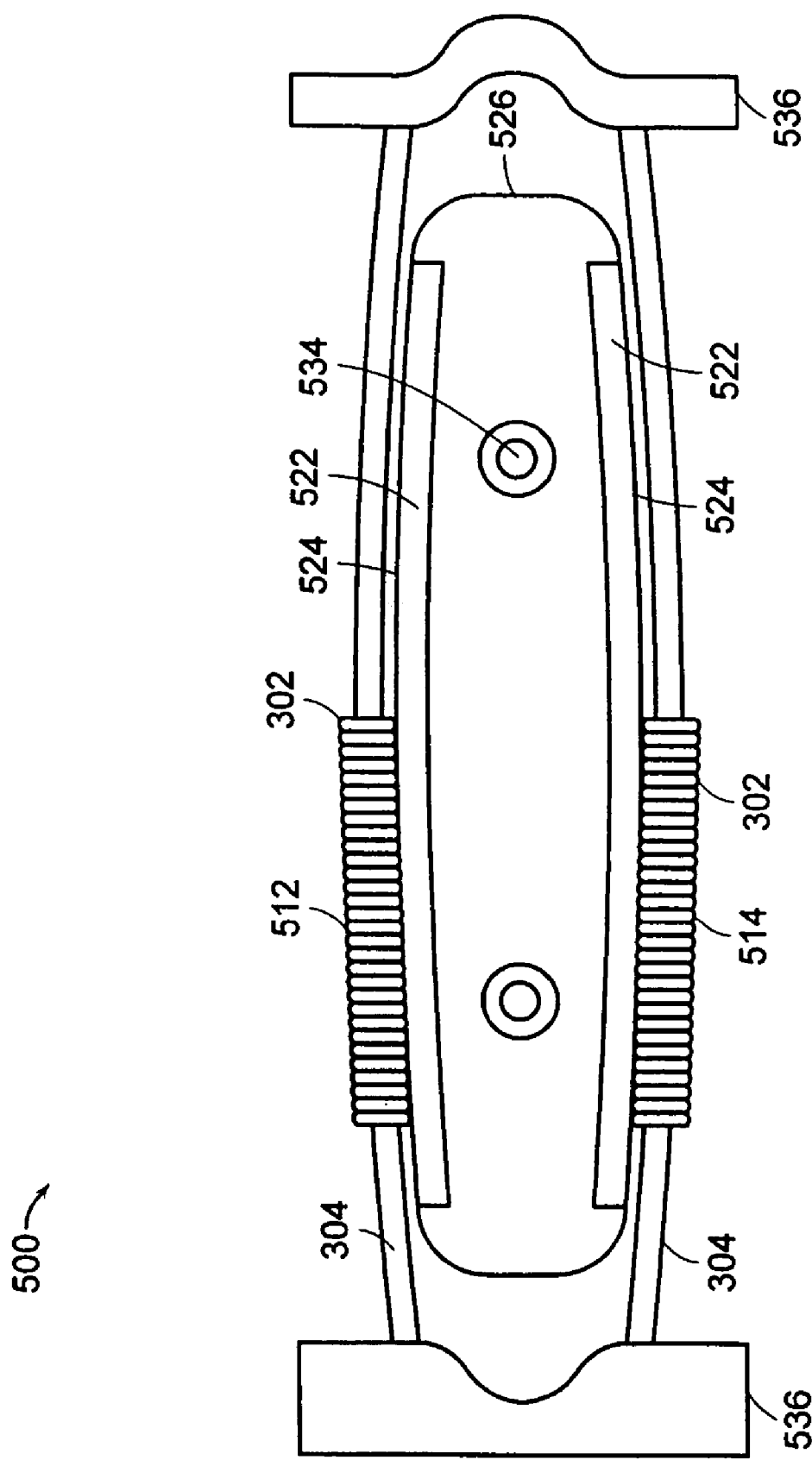
FIG. 33 illustrates the engagement of the conductors and mating conductors of the woven connector embodiment of FIG. 30.

FIG. 33 is a front view of the power connector 500 after the mating connector element 520 has been engaged with the woven connector element 510. The external housing and the spring arms 528 of the mating connector element 520 and the housing 530 of the woven connector element 510, amongst other features, have been removed for clarity. As can be seen in FIG. 33, after the engagement of the mating connector element 520, the contact points of the conductors 302 of the circuits 512, 514 are in electrical contact with the contact mating surface 524 of the mating connector 522. As previously discussed, while the contact mating surface 524 can be substantially planar, in a preferred embodiment the contact mating surface 524 is defined by some radius of curvature R (not shown), e.g., R 336. In some preferred embodiments, this radius of curvature R 336 will be greater than the mating conductor's 522 width W (not shown), e.g., W 309.

Figure 34:
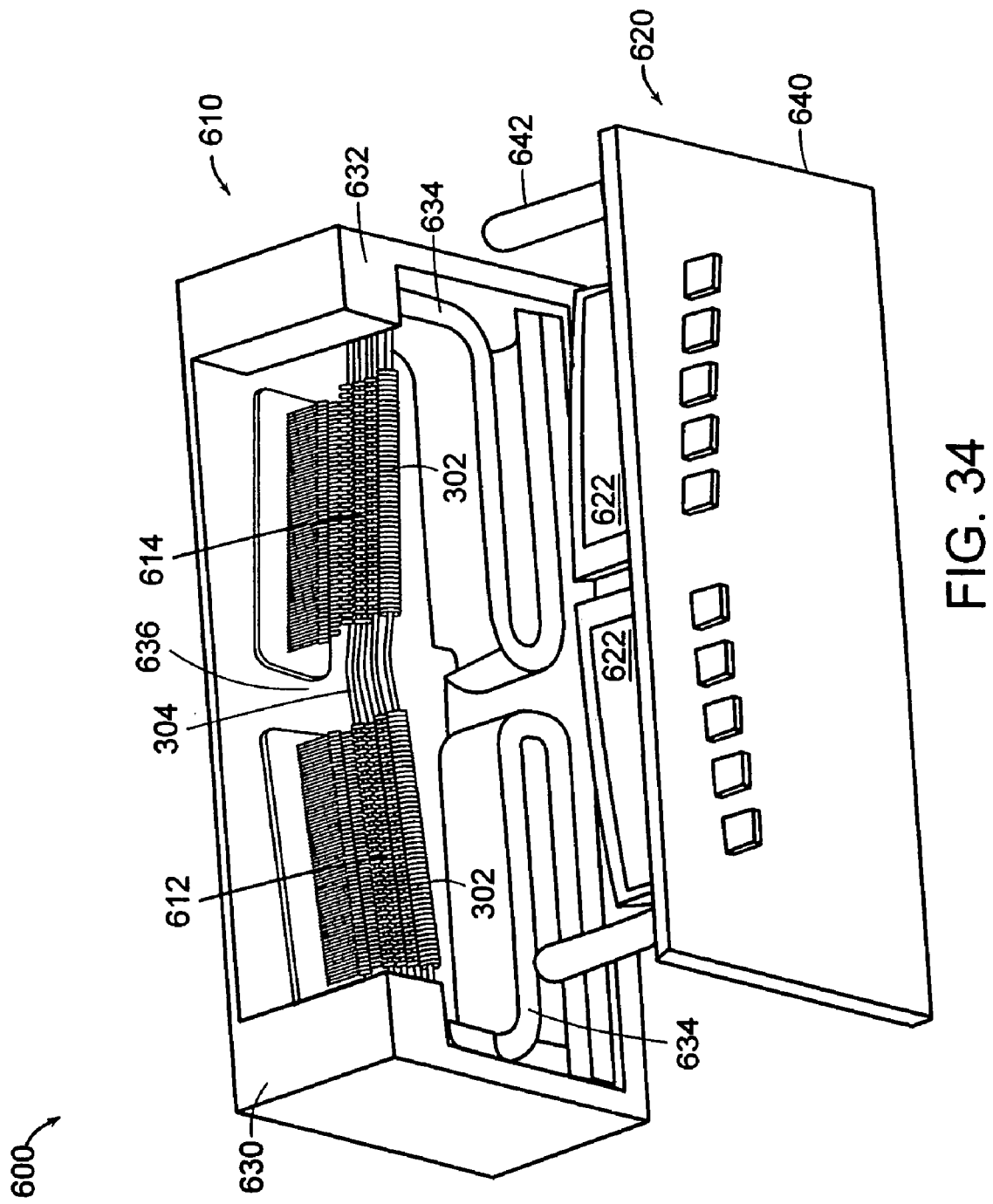
FIG. 34 depicts another exemplary embodiment of a woven power connector in accordance with the teachings of the present disclosure.

FIG. 34 illustrates another exemplary embodiment of a multi-contact woven power connector 600 that is highly balanced. The power connector 600 consists of two extended arrays, a power array 612 and a return array 614. These arrays provide multiple contact points over a wide area, which can result in high redundancy, lower separable electrical contact resistance, and better thermal dissipation of parasitic electrical losses. The power connector 600 could be a 30 amp DC connector. The power connector 600 is comprised of a woven connector element 610 and a mating connector element 620. The woven connector element 610 is comprised of a housing 630, a power circuit 612, a return circuit 614, two spring mounts 634, a guide member 636 and several loading fibers 304. The housing 630 has several holes 632 which can accommodate the alignment pins 642 of the mating connector element 620. The power circuit 612 is comprised of several conductors 302 woven around several loading fibers 304 in accordance with the teachings of the present disclosure. In a preferred embodiment, these conductors 302 are arranged to be self-terminating. The conductors 302 of the power circuit 612 exit a back portion of the housing 630 and may form a termination point where power can be delivered to the power connector 600. As is discussed in more detail below, the loading fibers 304 of the power circuit 612 (and return circuit 614) are capable of carrying a tension T that ultimately translates into a contact normal force being asserted at the contact points of the conductors 302. The return circuit 614 is arranged in the same manner as the power circuit 612. The loading fibers 304 of the power connector 600 are comprised of a non-conducting material, which may or may not be elastic. The guide member 636 is mounted to an inside wall of the housing 630 and is positioned so as to provide structural support for the loading fibers 304 and, indirectly, the power circuit 612 and return circuit 614. The ends of the loading fibers 304 are secured to the spring mounts 634. As is described in greater detail below, the spring mounts 634 are capable of generating a tensile load T in the attached loading fibers 304 of the woven connector element 610.

The mating connector element 620 of the power connector 600 consists of a housing 640, two mating conductors 622 and alignment pins 642. The mating conductors 622 are secured to an inside wall of the housing 640 such that when the mating connector element 620 is engaged with the woven connector element 610, the contact points of the conductors 302 (of circuits 612 and 614) will come into electrical contact with the mating conductors 622. Alignment pins 642 are aligned with the holes 632 of the woven connector element 610 and thus assist in facilitating the coupling of the mating connector element 620 to the woven connector element 610 (or vice versa).

Figure 35:
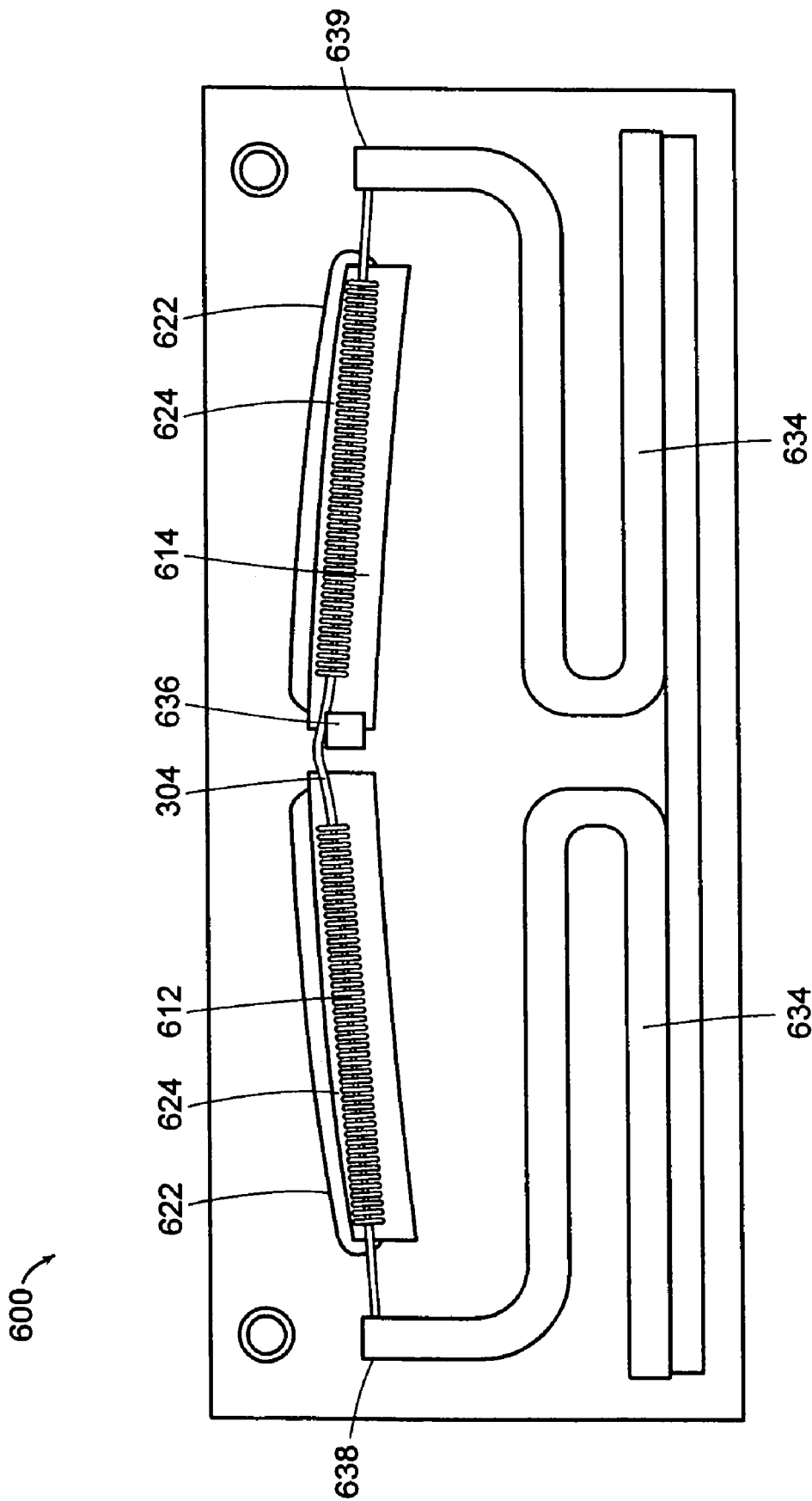
FIG. 35 depicts another view of the connector of FIG. 34.

Power connector 600 has several of the same features of the power connector 500, but uses a different mechanism for producing the tension T (and, thus, the normal contact force) in the conductor 302—loading fiber 304 weave. Rather than using the floating end plates 536 of power connector 500, power connector 600 uses pre-tensioned spring mounts 634 to generate and maintain the required normal contact force between the contact points of the conductors 302 (of the circuits 612, 614) and the mating conductors 622. FIG. 35 depicts the power connector 600 after the mating connector element 620 has been engaged with the woven connector element 610. After engagement, the contact points of the conductors 302 of both the power circuit 612 and return circuit 614 are in electrical contact with the contact mating surfaces 624 of the mating conductors 622.

In a preferred embodiment, the contact mating surfaces 624 are convex surfaces that are defined by a radius of curvature R. As shown in FIG. 35, the convex contact mating surfaces 624 are located on a bottom side of the mating conductors 622, i.e., after engagement, the conductors 302 are located below the mating conductors 622. In an exemplary embodiment, the guide member 636 is positioned such that the upper potion of the guide member 636 is located above the contact mating surfaces 624. After engagement, the loading fibers 304 run from an end 638 of the first spring mount 634, against the convex contact mating surface 624 that corresponds to the power circuit 612, over the top portion of the guide member 636, against the convex contact mating surface 624 that corresponds to the return circuit 612 and then terminates at an end 639 of the second spring mount 634. In other exemplary embodiments, the contact mating surfaces 624 can be located on the top-side of the mating conductors 622, and the loading fibers 304 would therefore extend over these top-located convex contact mating surfaces 624. The locations of the end 638, guide member 636, contact mating surfaces 624 and end 639, working in conjunction with the tension T generated in the loading fibers 304, facilitate the delivery of the contact normal forces at the contact points of the conductors 302.

Figure 36A:
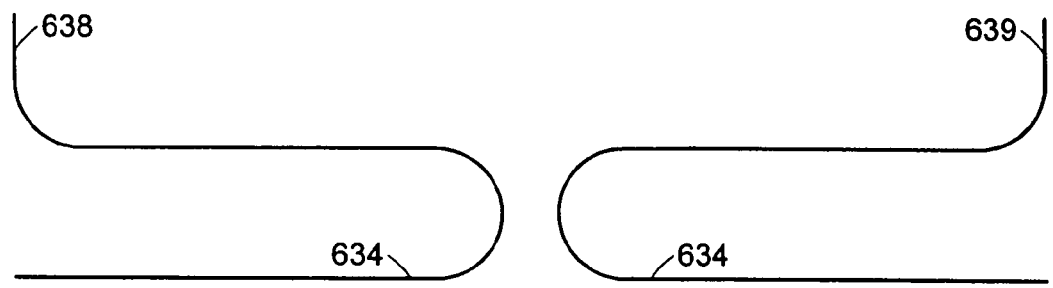
FIG. 36 depicts the woven connector embodiment of FIG. 34 having spring arms that generate a load within the loading fibers.
Figure 36B:
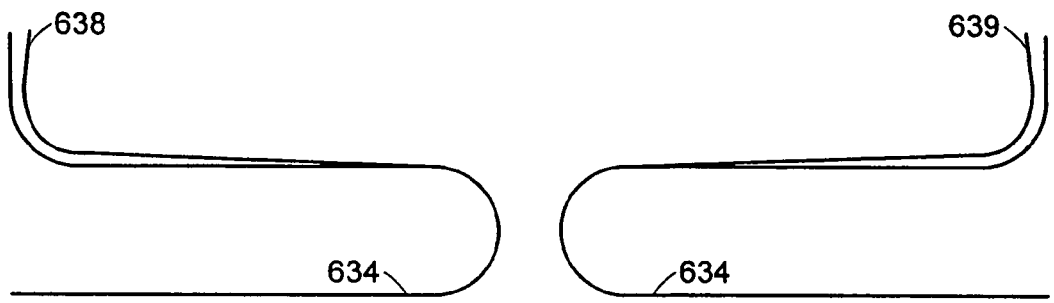
Figure 36C:
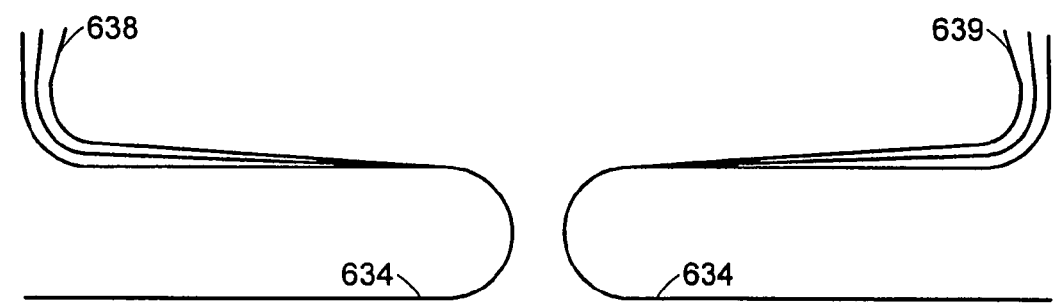

FIGS. 36*a–c* depicts an exemplary embodiment of a pair of spring mounts 634 that could be used in power connector 600. The loading fibers 304 have been omitted for clarity but it should be understood that the ends of the loading fibers 304 are to be attached to the ends 638, 639. Prior to engagement, the loading fibers 304 are supported by a support pin (not shown), such as the guide member 636, for example. During engagement, the loading fibers 304 are aligned with contact mating surfaces 624. FIGS. 36*a–c* illustrate how the spring mounts 638 function in the power connector 600. FIG. 36*a* illustrates the spring mounts 634 in an un-loaded state that occurs prior to the loading fibers being coupled to the ends 638, 639. Referring to FIG. 36*b*, to attach the loading fibers 304 to the ends 638, 639, the ends 638, 639 are slightly moved inward and the loading fibers 304 are then anchored to the ends 638, 639. Persons skilled in the art will readily recognize a wide variety of ways in which the loading fibers 304 can be anchored to the ends 638, 639, e.g., using slots, anchor points, fasteners, clamps, welding, brazing, bonding, etc. After the loading fibers 304 have been anchored to the ends 638, 639 of the spring mounts 634, a small tension force will generally be present in the loading fibers 304. Referring now to FIG. 36*c*, during the insertion of the mating connector element 620 into the woven connector element 610, the loading fibers 304 are pushed under the contact mating surfaces 624 (or, alternatively, pulled over the contact mating surfaces 624, if the surfaces 624 are located on the top side of the mating conductors 622) and the mating of the power connector 600 is then completed. To facilitate the engagement of the loading fibers 304 with the contact mating surfaces 624, the ends 638, 639 of the spring mounts 634 will generally undergo some additional deflection. Thus, the loading fibers 304 will be subjected to an additional tensile load so that a resultant tension T is then present in the loading fibers 304 (and, consequently, contact normal forces are present at the contact points of the conductors 302).

The electrical connectors constructed in accordance with the teachings of the present disclosure are inherently redundant. If any of the loading fibers 304 of these embodiments breaks or looses tension, the remaining loading fibers 304 could be able to continue to assert sufficient tension T so that electrical contact at the contact points of the conductors 302 could be maintained and, thus, the connectors could continue to carry the rated current capacity. In certain exemplary embodiments, a complete failure of all the loading fibers 304 would have to occur for the connector to loose electrical contact. In the case of dirt or a contaminant in the system, the multiple contact points are much more efficient at maintaining contact than a traditional one or two contact point connector. If a single point failure does occur (due to dirt or mechanical failure), then there are generally at least three surrounding local contact points which would be capable of handling the diverted current: the next contact point found in line (or previous in line) on the same conductor 302, and since each conductor 302 is preferably in electrical contact with the conductors 302 that are adjacent to it, the current can also flow into these adjacent conductors 302 and then through the contact points of these conductors 302. The teachings of the present disclosure, furthermore, can be utilized in many woven multi-contact data connector embodiments. In designing such woven multi-contact data connector embodiments, issues that are commonly considered by those skilled in the art when designing data connectors, such as impedance matching, rf shielding and cross-talk issues, amongst others, need to be taken into consideration. In data connector embodiments, a data signal path can be established through a conductor(s) of a woven connector element and a mating conductor of a mating connector element. The primary difference between the woven data and power connector embodiments is the size of the individual circuit. In woven power connector embodiments, the contact surfaces (i.e., the contact points of the conductors and corresponding contact mating surfaces) tend to be much larger than those of the woven data connector embodiments due to the higher current requirements. The woven data connector embodiments, moreover, are more likely to contain multiple isolated circuit (signal) paths mounted on a single conductor 302—loading fibers 304 weave. This allows for a high density of signal paths in the woven data connector embodiments. Additionally, there is much more flexibility in the implementation of the data connector embodiments due to the different pin/ground/signal/power combinations that are possible in order to generate the required impedance, cross talk and signal skew characteristics.

The data connector embodiments of the present disclosure also provide advantages over traditional data connectors that use stamped spring arm contacts. First, it is easier to keep very tight tolerances at very small sizes with the woven data connectors than the traditional stamped spring arm contact methods. Second, drawn wire (e.g., for conductors 302) is available at low costs even at very small sizes, whereas comparable sized conventional stampings having similar tolerances can become quite expensive. Third, signal path stubs at the connector interfaces can be reduced or eliminated in the woven data connectors of the present disclosure. Stubs are present in a circuit when energy propagating through a part of the circuit has no place to go and tends to be reflected back within the circuit. At high frequencies, these interface stubs can produce jitter, signal distortion and attenuation, and the interaction of these stubs with other signal discontinuities in the circuit can cause loss of data, degradation of speed and other problems. The very nature of conventional fork and blade-type connector produces a stub. The length of this stub will generally depend upon the tolerance stack up of the system (e.g., connector tolerance, backplane/daughter card flatness, stamping tolerance, board alignment tolerance, etc.) and the length of the stub may vary by an order of magnitude over a single connector. With the woven data connector embodiments of the present disclosure, there are almost no stubs within the circuits at any time, from full insertion to partial insertion, due to the presence of multiple contact points along a conductor 302. Lastly, the woven data connector embodiments may be more flexible for tuning trace impedances because, in addition to ground placement, the materials that comprise the conductor 302—loading fibers 304 (and insulating fiber 104, if present) weave can be changed to obtain more flexible impedance characteristics without any major retooling of the process line.

Figure 37A:
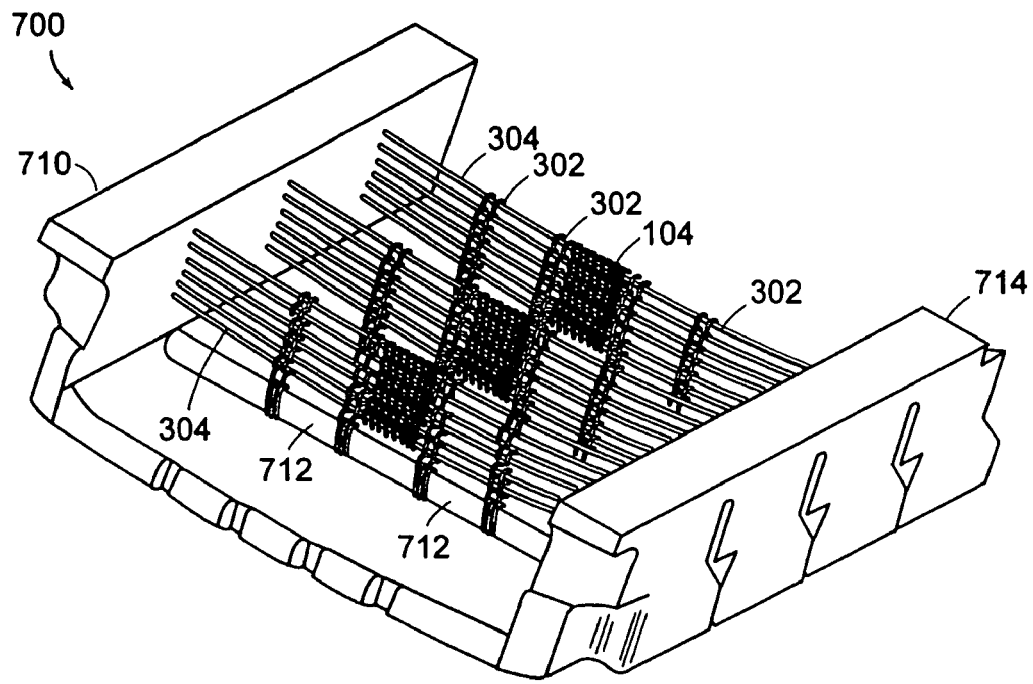
FIGS. 37a and 37b depict an exemplary embodiment of a woven data connector in accordance with the teachings of the present disclosure.
Figure 37B:
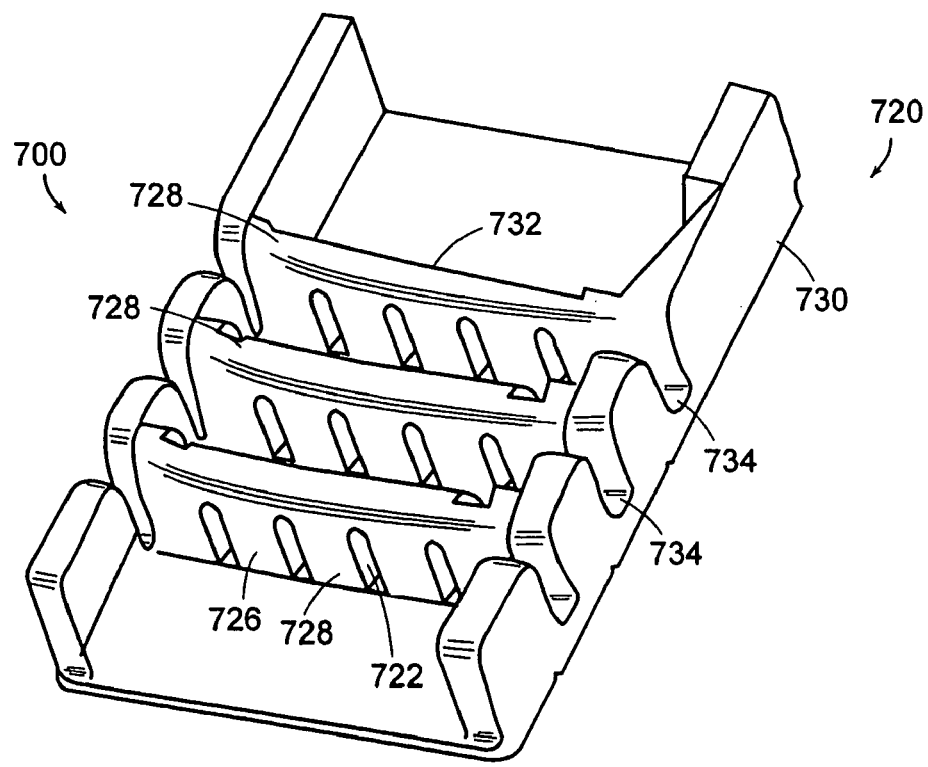

FIGS. 37*a*–*b* illustrates an exemplary embodiment of a multi-contact woven data connector 700. The data connector 700 includes a woven connector element 710 and a mating connector element 720. The woven connector element 710, as seen in FIG. 37*a*, comprises a housing 714, three sets of loading fibers 304 (wherein each set has six loading fibers 304) and conductors 302 that are woven onto each set of loading fibers 304. In certain exemplary embodiments, the woven connector element 710 may further include ground shields 712 and alignment pins and/or holes for receiving alignment pins. In data connector embodiments, each signal path can be comprised of a single conductor 302 or, alternatively, many conductors 302. However, to achieve certain desired signal path electrical properties, e.g., capacitance, inductance and impedance characteristics, in most preferred embodiments each signal path will consist of between one and four conductors 302. The conductors 302 may be self-terminating. In certain further preferred embodiments, a signal path will consist of two self-terminating conductors 302. When more than one (self-terminating or non self-terminating) conductor 302 is used to form a signal path, the conductors 302 forming the signal path should preferably be in electrical contact with each other. The conductors 302 comprising a single signal path generally will form a termination which may be located on the backside of the housing 714. The woven connector element 710 has twelve separate signal paths, four signal paths being located on each of the three sets of loading fibers 304.

The woven connector element 710 further includes insulating fibers 104 that are woven onto the loading fibers 304 between the electrical signal paths (i.e., the conductors 302). The insulating fibers 104 serve to electrically isolate the signal paths from each other in a direction along the loading fibers 304. The woven connector element 710 of FIG. 37*a* only depicts three sets of insulating fibers 104, a single set of insulating fibers 104 being located on each set of loading fibers 304. The sets of insulating fibers 104 have been removed for clarity. In some exemplary embodiments, additional sets of insulating fibers 104 would also be present (i.e., woven) between the other signal paths located on each set of loading fibers 304. In some exemplary embodiments, the insulating fibers 104 may be self-terminating. Furthermore, in certain exemplary embodiments the woven connector element 710 may further comprise tensioning mechanisms (not shown), e.g., spring arms, floating plates, spring mounts, etc., located at or near the ends of the loading fibers 304. These tensioning mechanisms may be capable of generating desired tensile loads in the loading fibers 304, as previously discussed.

The mating connector element 720 of the data connector 700, as seen in FIG. 37*b* comprises a housing 730, ground shields 732 and three insulating housings 728. The grounding shields 732 can be deposed on the backside of the insulating housings 728, i.e., on a side opposite face 726. In certain exemplary embodiments, the mating connector element 720 may further include alignment pins and/or holes for receiving alignment pins. Each insulating housing 728 has four mating conductors 722 located on a face 726. The mating conductors 722 are arranged on the faces 726 so that when the woven connector element 710 engages the mating connector element 720 (or vice versa), electrical connections between the contact points of the conductors 302 and the mating conductors 722 can be established. Thus, the signal paths of the data connector 700 are established via the conductors 302 of the woven connector element 710 and their corresponding mating conductors 722 of the mating connector element 720. The mating conductor 722 generally will form a termination point, e.g., board termination pin, which may be located on the backside of the housing 730. In exemplary embodiments, the shape and orientation of the mating conductors 722, as situated on the face 726, closely matches the shape and orientation of the conductor(s) 302, by which an electrical connection is to be established. During engagement, the faces 726 of the insulating housings 728 engage the conductors 302—loading fiber 304 weave of the woven connector element 710. In an exemplary embodiment, the faces 726 and/or the contact mating surfaces of the mating conductors 722 form a continuous convex surface. In a preferred embodiment, this convex surface can be defined by a constant radius of curvature.

In the depicted exemplary embodiment, housing 730 forms slots 734 which can accommodate the sets of loading fibers 304 when the woven connector element 710 is engaged to the mating connector element 720. After engagement, the ground shields 712 of the woven connector element 710 can help to electrically shield the mating conductors 722 of the mating connector element 720, while the ground shields 732 of the mating connector element 720 similarly can help to electrically shield the conductors 302 of the woven connector element 710. The placement and design of ground shields 712, 732 can change the electrical properties (e.g., capacitance and inductance) of the signal traces and provide a means of shielding adjacent signal lines (or adjacent differential pairs) from cross talk and electromagnetic interference (EMI). By changing the capacitance and inductance of the signal traces at particular points or regions, the impedance of the signal path can be controlled. The higher the speed of the signal, the better control that is required for impedance matching and EMI shielding. The ground planes of the data connector 700 can be on the back face of the insulating housing 728 of the mating connector element 720 and in independent metal shields 712 of the woven connector element 710. Ground pins/planes must be a conductive material and are preferably, but not necessarily, solid. In preferred embodiments, each signal path is contained within a conductive ground shield (coaxial or twinaxial) structure. This can provide the optimum signal isolation with possibilities for reducing signal attenuation and distortion. The ground shields 712, 732 of the woven connector element 710 and mating connector element 720, respectively, may or may not be in contact with each other after engagement but, preferably, some continuous ground connection should be established between the two halves of the connector 700. This can be done by forcing the ground shields 712 and 732 to contact each other or, alternatively, using one or more data pins as a ground connection between the two halves.

In addition to the above embodiments, the weave technology described herein and as described in U.S. patent application Ser. No. 10/603,047, filed Jun. 24, 2003, U.S. patent application Ser. No. 10/375,481, filed Feb. 27, 2003, U.S. patent application Ser. No. 10/273,241, filed Oct. 17, 2002 and U.S. Provisional Patent Application Ser. No.

60/348,588, filed Jan. 15, 2002, the entireties of which are herein incorporated by reference, can also be utilized in novel socket types of electrical connections. In accordance with the teachings of the present disclosure, the novel sockets described herein can be used for electrically connecting one electrical component (or device) to another electrical component (or device). These novel sockets can be used in a wide variety of applications (e.g., PCs, laptops, PDAs, cell phones, telecommunication systems, transportation vehicles, avionics equipment, etc.) and may be used, for example, to mount processor units, memory units and small expansion cards (often called mezzanine cards) to other electrical components or devices. The novel contact interfaces described herein can provide particular advantages to electrical components (or devices) that are intended to be removable or replaceable.

The novel contact interfaces described herein, also can be utilized in devices that test the electrical integrity or functionality of an electrical component. During the manufacturing of an electrical device it is not uncommon that the electrical contacts of one electrical component will need to be joined to the electrical contacts of another component of the device. Unlike a connector, however, in the final assembly of a device these electrical contacts may be permanently joined together, i.e., the contacts may be joined together via soldering, welding, bonding, crimping, etc. Discovering electrical or functional problems with the assembled device after the contacts have been permanently attached necessitates the disassembling of the joined electrical contacts. Disassembling the previously mated electrical contacts can involve a substantial amount of time and manufacturing expense and may cause collateral damage to the underlying electrical components. Therefore, it is desirable that the electrical integrity and functionality of the electrical components of an assembled device be tested prior to being permanently mated to the contacts of another component. Devices for testing the electrical integrity of an electrical component before the contacts of the electrical component have been permanently mated to the contacts of another component are well known in the art. Common examples of such test devices include burn-in sockets and test sockets.

Burn-in sockets are used for the extended testing of electrical components or devices to detect infant mortality defects of the electronic circuitry. The device(s) under test (DUT) are then inserted into burn-in sockets on a test board and inserted into a controlled environment, such as an oven, for a fixed period of time while undergoing low-level real-time electrical testing. The burn-in test may be run for 2–48 hrs, for example. Multiple test boards are typically resident in the test chamber at any one time. After the test, the electrical components are removed from the test device and new electrical components are then inserted for testing. The burn-in sockets, e.g., test device, must provide a high cycle, reliable connection to the contacts of the devices being tested. The devices to be tested may utilize a pin grid array, ball grid array (BGA), or surface mount technology (SMT) pads (sometimes referred to as land grid arrays—LGA's), as explained in more detail below, which is located on a base of the DUTs. The test device should not damage or otherwise adversely affect the contacts of the DUT yet be able to maintain reliable electrical contacts with the contacts of the DUT. Conventional burn-in sockets typically use spring pins, pogo pins, pin contacts, etc. to make the individual contacts with the contacts of the DUT. Burn-in sockets often have some type of latching device to retain the DUT in the socket while the test is being performed.

Test sockets are similar to burn-in sockets, but the application is slightly different; test sockets are used for functionally testing electrical components or devices. The electrical component may be cycled through the functional test in a few seconds to a few minutes, rather than several hours. The electrical component to be tested is usually held in place by a test handler, and a latching mechanism is generally not used.

The novel contact interfaces of the present disclosure can be used to electrically connect one electrical component (or device) to another electrical component (or device). The loading fibers of an exemplary device can generate normal contact forces at the contact points of the conductors. The normal contact forces maintain the contacts of the device to the contacts of an electrical component, e.g., a device under test. In exemplary embodiments, the device has a contact interface that has the same contact circuit pitch (i.e., same arrangement and spacing of conductors) as the electrical component to which the device is to be connected. Loading fibers can be run across the grid structure and the conductors can be coupled to the loading fiber(s) at a desired contact location. The loading fibers may be tensioned using an external mechanism, e.g., extension spring, cantilevered arm, cam mechanism, tensioning spring, floating end plate, etc., and may be placed in tension during the manufacturing process, or may become tensioned when the device is engaged with an electrical component. Devices that utilize the described contact interface may have certain advantages over traditional devices and electrical components: the contact interface provides a contact array which is locally compliant, is highly redundant and yet exerts relatively low normal contact forces on the contacts of the coupled electrical component. Since such devices exert a relatively low normal contact force, the devices of the present disclosure are therefore less apt to damage or otherwise adversely affect the contacts of the electrical components. Moreover, the devices of the present disclosures are generally able to sustain a greater level of miniaturization without having the problems of contact buckling or tolerance stack-up due to non-planarity of the electrical components' contact interfaces, e.g., there may be manufacturing tolerance issues with the contacts of the electrical components.

FIGS. 38 and 39 depict electrical components that have their electrical contacts arranged as a ball grid array and as a surface mount array, respectively. The electrical components depicted in FIGS. 38 and 39 may be coupled to a device as part of the manufacturing process or, prior to final assembly, may be tested with a testing device such as a Burn-In socket or a Test socket. Referring to FIG. 38, electrical component 270 includes an electrical contact ball grid array (BGA) 272 that is disposed upon a base 275 of the electrical component 270. The BGA 272 consists of a plurality of solder ball contacts 274. Electrical component 276 of FIG. 39 includes an electrical contact surface mount (SMT) array 278 that is disposed upon a base 281 of the electrical component 276. The SMT array 278 consists of a plurality of contact pads 280.

In addition to ball grid arrays and surface mount arrays, there are also other types of connection interfaces, such as pin grid arrays, etc., which are well known in the art. Pin grid arrays are similar to the BGA interface, except that the solder ball contacts 274 are replaced with solid pins. Pin grid array interfaces are generally used for mounting of components that may need to be removed, e.g., repaired or upgraded, without have to tear an entire system apart for desoldering or to pass pieces through a reflow oven. Pin grid arrays are typically used in conjunction with clam-shell type sockets that make individual connections to each pin. The sockets are usually large and expensive compared to the hard mounting of BGA or SMT devices. The test devices of the present disclosure may be used to test electrical components and devices which utilize a wide variety of multi-contact connector arrangements including, but not limited to electrical components which have BGA, SMT and pin grid arrays.

Figure 40:
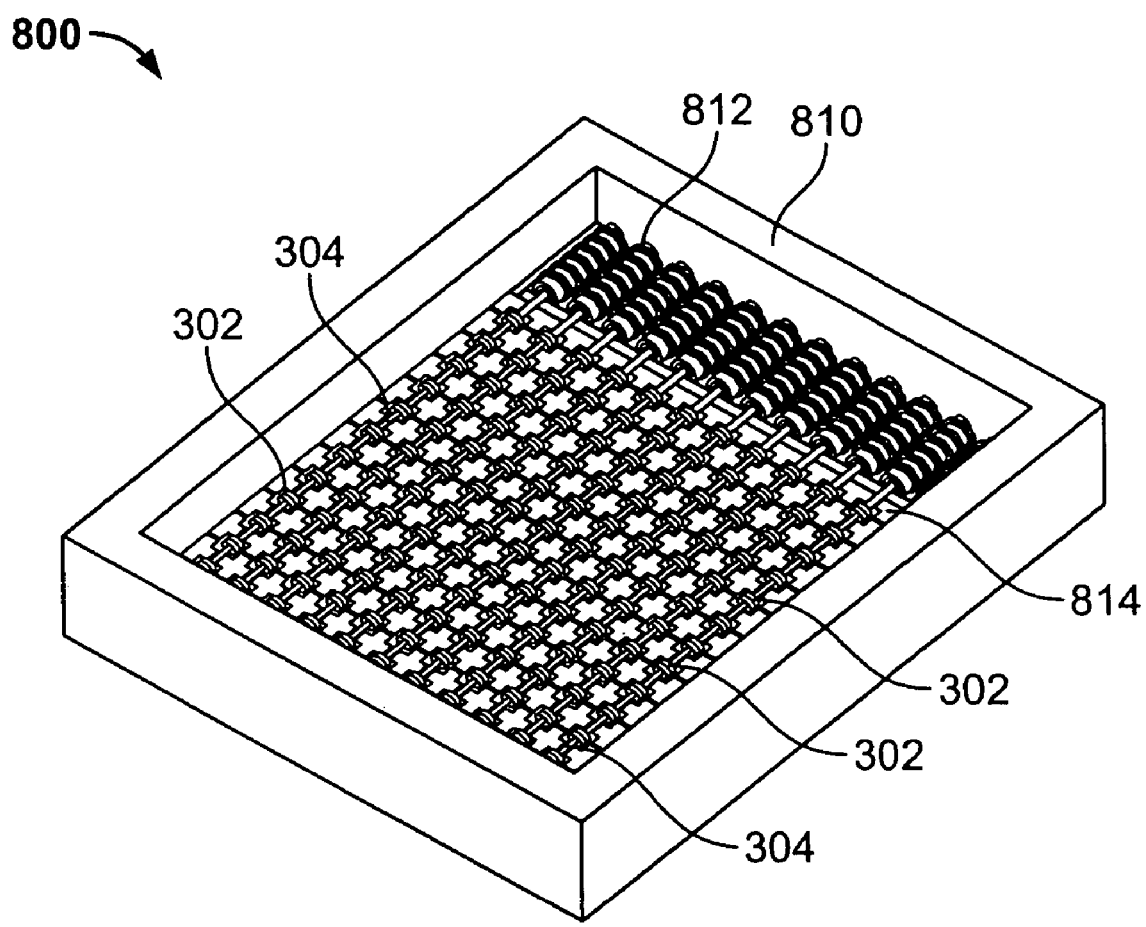
FIG. 40 depicts an exemplary device in accordance with the teachings of the present disclosure.

An exemplary device 800 constructed in accordance with the present disclosure is shown in FIG. 40. Device 800 includes a housing 810, conductors 302, loading fibers 304, tensioning springs 812 and a faceplate 814. Device 800 may further include tensioning guides, as is discussed in more detail below, or alternatively, the faceplate 814 itself may act as a tensioning guide. The loading fibers 304 of device 800 are arranged from one side of the housing 810 to the opposite side of the housing 810 where the tension springs 812 are located. Thus, in an exemplary embodiment, one end of a loading fiber 304 is attached to a portion of the housing 810 while the other end of the loading fiber 304 is coupled to a tensioning spring 812, which itself may be attached to the housing 810. The tensioning springs 812 generate or maintain the tensile loads within the loading fibers 304. While the device 800 of FIG. 40 utilizes a tensioning spring 812 for each loading fiber 304, in other exemplary embodiments the test device may utilize fewer or more (or no) tensioning springs 812. For example, in another exemplary embodiment, each end of a loading fiber 304 may be coupled to a tensioning spring 812. The tensioning springs 812 may take on a wide variety of forms and shapes. Furthermore, in certain exemplary embodiments, the tensioning springs 812 may be attached to a cam device (not shown) which may tension the loading fibers 304 when an electrical component, e.g., electrical component 270 or 276, is engaged, e.g., latched, with device 800.

Each conductor 302 of exemplary device 800 penetrates up through the faceplate 814, is wound around a loading fiber 304 and then terminates below the faceplate 814. Each conductor 302 shown above the faceplate 814 of FIG. 40 thus represents a single electrical path that can be placed in contact with an electrical contact of an electrical component. Device 800 is configured as a 12×12 square contact grid array (for a total of 144 separate and independent conductors 302), where twelve conductors 302 are wound upon each loading fiber 304. The pitch and configuration of the contacts, i.e., the conductors 302, of the device 800 are established so as to match the pitch and configuration of the contacts of the electrical component(s). Device 800 can be coupled to a single electrical component or several electrical components at the same time. Not all of the conductors 302 need to be utilized when the device 800 is engaged with an electrical component(s).

In one exemplary embodiment of a test device, device 800 is a Burn-in Socket. In another exemplary embodiment, device 800 is a Test Socket. In other exemplary embodiments, device 800 is a device that is to be connected to an electrical component(s) during the manufacturing process.

As is discussed in more detail below, when the electrical component is engaged with the device 800, the contacts of the electrical component are pushed down into the weave and come into contact with the contact points of the conductors 302. The downward deflection of the conductors 302, in combination with the tensile load that is present within the loading fibers 304, produces a normal contact force at each contact point of the conductors 302. The presence of the normal contact force at a contact point(s) of a conductor 302 maintains the conductor 302 in electrical contact with a corresponding contact of the tested electrical component. The normal contact force that is generated between each contact point of a conductor 302 and the associated contact on a tested component can be a function of the loading fiber tension T, the shape of the contacts and the depth that the electrical component is inserted into the weave of the device 800 (which is effectively indicated by the deflection angle of the loading fiber 104). By changing these parameters, the normal contact forces that act at the contact points can be controlled to produce reliable electrical connections while minimizing the risk that the contact interface of device 800 will damage the contacts of the electrical component 270 or 276 (during a test procedure, for example).

Figure 41:
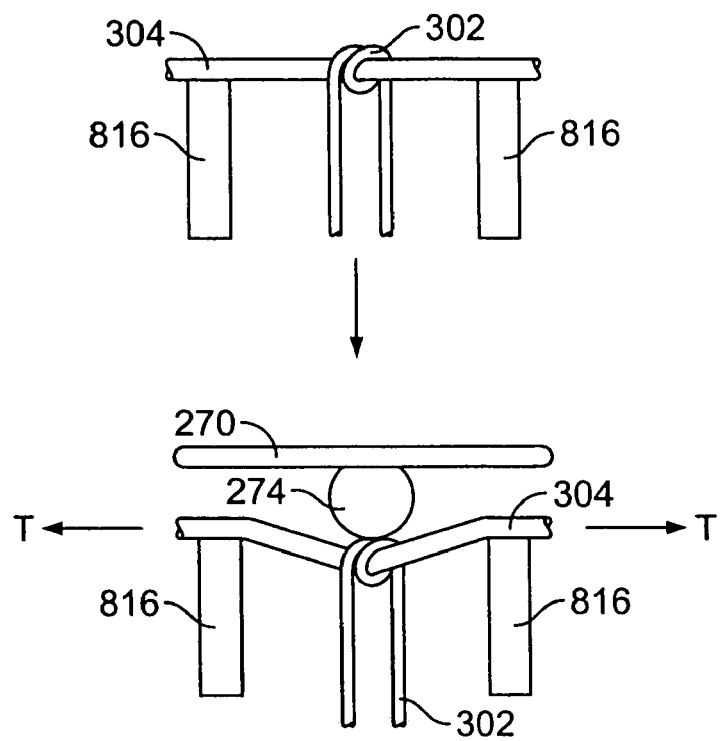
FIG. 41 depicts an exemplary conductor of a device in accordance with the teachings of the present disclosure.

FIG. 41 illustrates how the contact points of a conductor 302 can be maintained against a contact of an electrical component. FIG. 41 shows an embodiment of a device 800 both before and after it is engaged with an electrical component 270 or 276. As can be seen in FIG. 41, a conductor 302 is wound around a loading fiber 304. Both ends of the conductor 302 are then pulled down to the base (not shown) of the device 800 were they can be terminated into press fit pins, solder pins, or surface mount terminations (BGA, SMT), etc. These terminations can be connected to other components (not shown) of the device 800. In certain exemplary embodiments, the portions of the conductor 302 which lie below the loading fiber 304 are coated with an insulator. Conductor 302 can be comprised of round wire, flat wire, flex circuit, or any other suitable conductor which can be coupled to or wrapped around the loading fiber 304. Flex circuits can include any flexible film which is made from a flexible insulating material (e.g., Kapton or Mylar) where a circuit trace is produced on one or both sides of the film using techniques similar to those used for laying out a printed circuit board, such as photolithography, etching, etc, for example. The traces are then typically covered with another layer of insulating film over most of the trace. Small sections may be left open for connection to other components. The resulting circuit is flexible but has the capability of very complex circuit structures due to the processing techniques. Loading fiber 304 is supported by two tensioning guides 816 which are placed some distance away from the conductor 302. The tensioning guides 816 can provide local support of the loading fibers 304 adjacent to the contact points of the conductors 302.

In this embodiment, the tensioning guides 816 support the loading fiber 304 before the electrical component 270 is engaged with the 800. In other exemplary embodiments, however, the tensioning guides 816 do not support the loading fiber 304 until the electrical component 270 becomes engaged with device 800. The loading fiber 304 may be elastic or inelastic. In the embodiment depicted, little or no tension is present in the loading fiber 304 before engagement. In other exemplary embodiments, however, a substantial amount of tension may be present in the loading fiber(s) 304 before the test device is engaged with an electrical component.

When the electrical component 270 is coupled to device 800, the solder ball contact 274 of the electrical component 270 forces a portion of the weave down into the device 800. Specifically, since the location of the solder ball contact 274 is matched with the location of the conductor 302, the presence of the solder ball contact 274 causes the conductor 302 and that portion of the loading fiber 304 which is disposed between the two tensioning guides 816 to be deflected downward, i.e., away from the electrical component 270. The deflection of this portion of the loading fiber 304 causes the desired normal contact force to be present at the contact points of the conductor 302.

Figure 42:
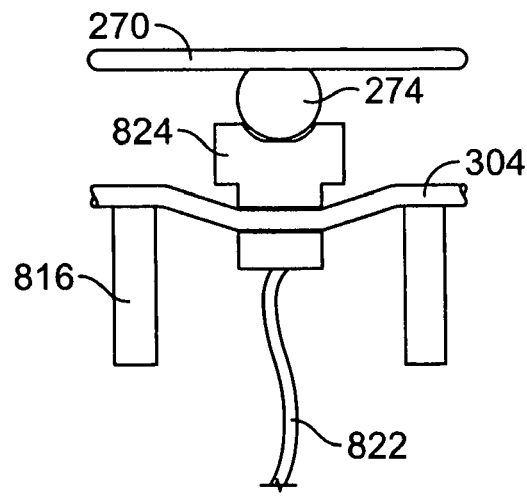
FIG. 42 depicts another exemplary conductor of a device in accordance with the teachings of the present disclosure.

FIG. 42 illustrates another exemplary embodiment of a conductor that can be coupled to a loading fiber 304. The conductor of FIG. 42 consists of a conductive lead 822 and a shaped contact 824. One end of the conductive lead 822 is coupled to the shaped contact 824 while the other end of the conductive lead 822 can be terminated into a press fit pin, solder pin, or a surface mount termination (e.g., BGA, SMT), etc, which is located at the base (not shown) of the device 800. These terminations can be connected to other components (not shown) of the device 800. In certain exemplary embodiments, the conductive lead 822 is covered with an insulated material. The shaped contact 824 is coupled to the loading fiber 304. The contact surface of the shaped contact 824 is shaped so as to suitably mate with the contact surface of the contact of the electrical component 270. Thus, when the device 800 is intended to test an electrical component 270 that has a solder ball contact 274 (such as those used in BGA devices), the contact surface of the shaped contact 824 is preferably shaped so as to closely match the diameter of the solder ball contact 274. Similarly, when testing electrical components 276 that have flat contact pads 280 (such as those used in SMT devices), the contact surface of the shaped contact 824 is preferably flat. When a shaped contact 824 is used, it is preferable that the contact surface of the shaped contact 824 be located above the loading fibers 304 and the tensioning guides 816 (if present). Otherwise, when the electrical component is engaged with the device 800, the loading fibers 304 may not experience a sufficient amount of downward deflection. Using an appropriate shaped contacts 824 can minimize the risk that the contacts of the electrical component (to be tested) will be damaged when the electrical component is engaged and disengaged with the device 800. As can be seen in FIG. 42, upon engagement the presence of the solder ball contact 274 causes the shaped contact 824 and that portion of the loading fiber 304 which is disposed between the two tensioning guides 816 to be deflected downward. The deflection of the loading fiber 304 causes the desired normal contact force to be present at the contact points of the shaped contact 824.

In those embodiments which utilize a conductor 302 that is comprised of a coiled wire, such as the embodiment depicted in FIG. 41, larger diameter coiled wires may be used to minimize the risk of damaging the contacts of the electrical component that is to be tested. Using larger diameter conductors, however, can have adverse affects on the performance of the weave. For example, larger diameter conductors may be stiffer and thus greater normal contact forces mat be required to maintain an electrical connection between the contacts.

Figure 43:
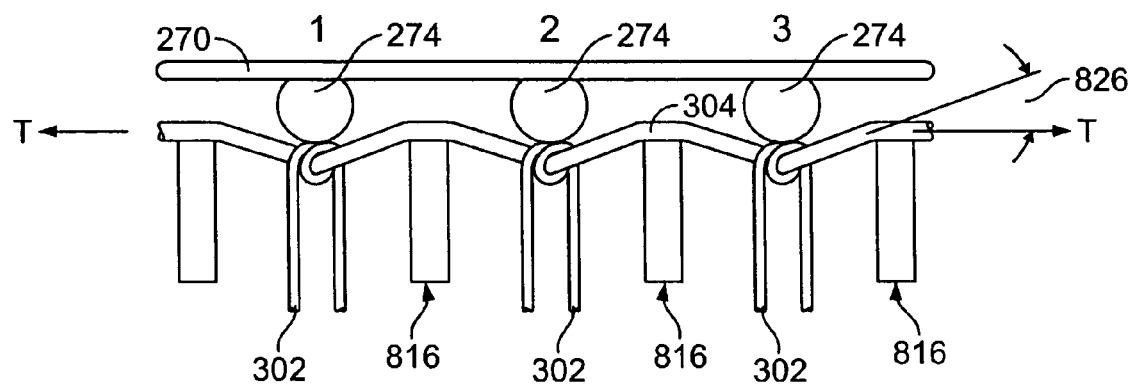
FIG. 43 depicts an exemplary conductor array in accordance with the teachings of the present disclosure.

The uses of the tensioning guides 816 will now be described in more detail. Referring to FIG. 43, the tensioning guides 816 of FIG. 43 are arranged between each conductor 302 so as to form a grid structure for supporting the loading fibers 304 which are disposed above the tensioning guides 816. In the embodiment depicted in FIG. 43, the tensioning guides 816 are solid support columns that support the loading fibers 304. When the loading fibers 304 are allowed to run fully parallel with the orientation of the device that is to be tested, e.g., electrical component 270, which can be the case if no tensioning guides 816 are present within the device 800, little or no normal contact force component may be generated by the tensile loads T which are present within the loading fibers 304. The tensioning guides 816, therefore, ensure that the loading fibers 304 do not fully run parallel with the orientation of the device that is to be tested. This thereby ensures that the loading fibers 304 are capable of generating a normal contact force at the contact points of the conductors 302.

Figure 44:
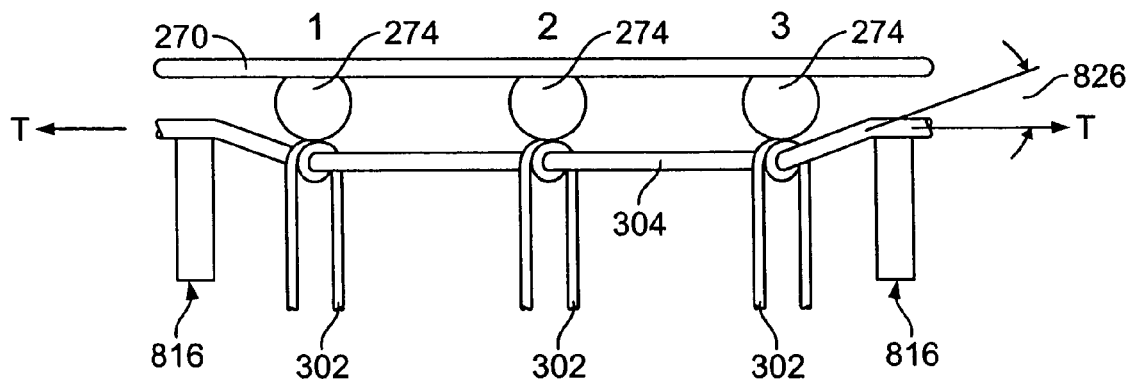
FIG. 44 depicts another exemplary conductor array.

A comparison of the embodiment depicted in FIG. 43 with the embodiment depicted in FIG. 44 clearly demonstrates this point. In the two embodiments depicted in FIGS. 43 and 44, a portion of a test device is engaged with an electrical component 270 that has three solder ball contacts 274. In both cases, a conductor 302 is to be maintained in electrical contact with each of the solder ball contacts 274. The three conductors 302 are wound around a single loading fiber 304. The test device of FIG. 43, however, includes four tensioning guides 816 while the test device of FIG. 44 only includes two tensioning guides 816. In FIG. 43, tensioning guides 816 are disposed both at the ends of the loading fiber 304 and between the conductors 302. The tensioning guides 816 of FIG. 44 are only disposed at the ends of the loading fiber 304. In FIG. 43, the effective normal contact force (Fn) being exerted by the loading fiber 304 between the contact points of each conductor 302 and its corresponding solder ball contact 274 is identical (since the geometry is identical at each contact point) and can be calculated as follows:

$$F_1 = F_2 = F_3 = F_n = 2 \cdot T \cdot \sin(\alpha)$$

where F1 is the normal contact force present at the interface of the first solder ball contact 274 and its corresponding conductor 302, etc., T is the tension in the loading fiber 304 and a is the angle 826 present between the loading fiber 304 (in the area of the contact points) and a plane which is parallel to the orientation of the electrical component 270.

If tensioning guides 816 are not located between the first and second conductors 302 and between the second and third conductors 302, as shown in FIG. 44, then the effective normal contact forces (Fn) being exerted by the loading fiber 304 between the contact points of each conductor 302 and their corresponding solder ball contact 274 are no longer identical. In the embodiment depicted in FIG. 44, the effective normal contact force at each contact interface then becomes:

$$F_1 = F_3 = T \cdot \sin(\alpha)$$

$$F_2 = 0$$

Thus, with only one tensioning guide 816 being located adjacent to the first and third conductors 302, contact normal forces are being exerted by the loading fiber 304 between the contact point of these conductors 302 and their corresponding solder ball contacts 274. For example, if the tensile load T and angle 826 of loading fiber 304 of both FIGS. 43 and 44 are the same, the contact normal force being asserted at the contact point of the first conductor 302 of FIG. 43 would be about twice the contact normal force that is being asserted at the contact point of the first conductor 302 of FIG. 44. However, with no tensioning guides 816 (or walls) being present adjacent to the second conductor 302 of FIG. 44, the contact normal force being exerted by the loading fiber 304 between the contact point of this conductor 302 and its corresponding solder ball contact 274 effectively becomes zero. With little or no contact normal force being present here, an electrical connection across this contact interface may not be maintained. Accordingly, in certain exemplary embodiments, device 800 includes tensioning springs 816 that are disposed on at least one side of each conductor 302. In a preferred embodiment, however, device 800 includes tensioning guides 816 which are disposed adjacent to and between each conductor 302, i.e., disposed on both sides of a conductor 302.

In addition to these advantages, the tensioning guides 816 also can assist in the alignment and placement of the conductors 302 thereby ensuring that the conductors 302 are coupled to the loading fibers 304 in the correct locations. In most exemplary embodiments, the tensioning guides 816 are comprised of a non-conducting material. In certain exemplary embodiments, instead of using support columns, the grid structure formed by the tensioning guides can be comprised of a plurality of high-tensioned fibers, similar to loading fibers 304, for example. The high-tensioned fibers of the grid structure underlie the loading fibers 304 and are generally arranged at some angle relative to the orientation(s) of the upper loading fibers 304. In one exemplary embodiment, for example, the high-tensioned fibers of the grid structured are oriented orthogonally to the orientation of the loading fibers 304. In an alternate exemplary embodiment, the high-tensioned fibers of the grid structured are oriented 45° from the orientation(s) of the loading fibers 304. Since the grid structure needs to support the loading fibers 304 when an electrical component is engaged with the device 800, the high-tensioned fibers of the grid structure should have higher tensile loads than that which is found in the loading fibers 304, i.e., the high-tensioned fibers should be more resistant to downward deflection than the loading fibers 304.

In an alternative exemplary embodiment, the grid structure formed by the tensioning guides is comprised of a combination of support columns (such as tensioning guides 816, for example) and high-tensioned fibers. In one such embodiment, for example, solid support columns can be utilized in every third row of conductors 302 (wherein a row can be defined by those conductors 302 which are arranged in the same direction as the loading fibers 304) and be placed adjacent to every other conductor 302 located within these rows. The high-tensioned fibers can then be run from (e.g., attached to, or rested upon) one solid support column to another so that the high-tensioned fibers are oriented with some angle (i.e., non-parallel) relative to the orientation of the loading fibers 304.

Figure 45:
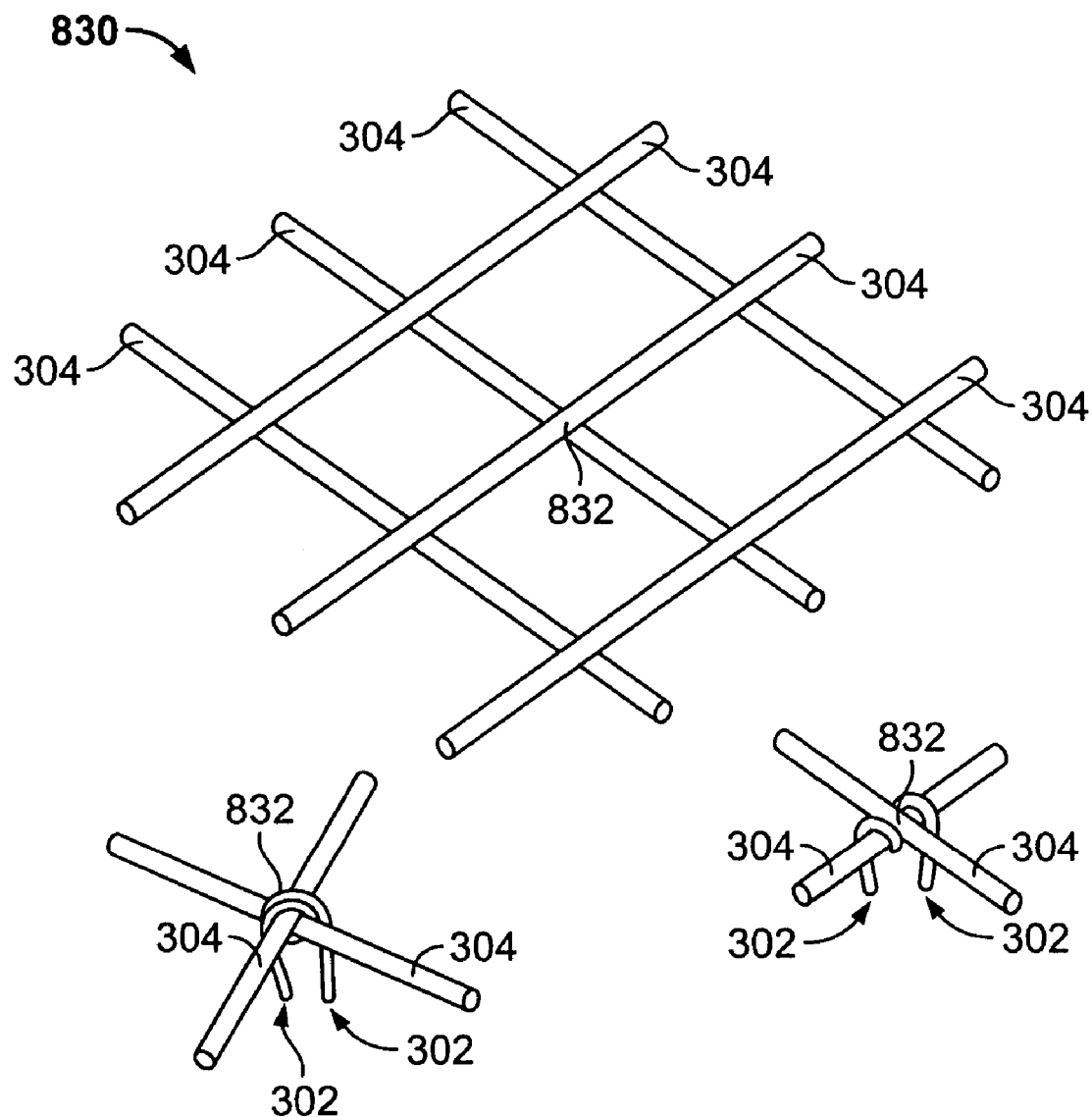
FIG. 45 depicts another exemplary device in accordance with the teachings of the present disclosure.

The loading fibers 304 of device 800 of FIG. 40 only run in a single direction. In other exemplary embodiments, however, device 800 may include loading fibers 304 that run in more than one direction. FIG. 45 depicts an embodiment having a first set of loading fibers 304 which run in a first direction and a second set of loading fibers 304 which run in a second direction. The two sets of loading fibers 304 thus form a grid 830 that has a plurality of intersections 832. Other embodiments may use more than two sets of loading fibers 304. In a preferred embodiment, conductors 302 are wound around or coupled to the loading fiber(s) 304 at the intersections 832. At the intersection 832, as can be seen in FIG. 45, the conductor 302 may be wound around a single loading fiber 304 or around both loading fibers 304. Alternatively, a shaped contact 824 of a conductor (see FIG. 42) may be coupled to a loading fiber 304 (or loading fibers 304) at or near the intersection 832. The grid 830 provides an additional layer of contact redundancy since both loading fibers 304 at a given intersection 832 would have to fail before the conductor located at that intersection 832 would lose electrical contact with its corresponding contact (of the electrical component being tested). The intersections 832 of grid 830 also can serve as location points for locating the conductors of the device 800. In one embodiment, the first set of loading fibers 304 is arranged orthogonally to the second set of loading fibers 304. In other exemplary embodiments, however, the first set of loading fibers 304 need not be arranged orthogonally to the second set of loading fibers 304. In certain exemplary embodiments, the loading fibers 304 of the first set are interwoven with the loading fibers 304 of the second set, while in other exemplary embodiments the loading fibers 304 of the two sets are not interwoven. Moreover, the loading fibers 304 of grid 830 may be coupled to tensioning springs 812 (see FIG. 40).

FIG. 46 depicts another embodiment of the arrangement of the loading fibers 304 and the conductors 302 within the device 800. The embodiment depicted in FIG. 46, like FIG. 45, includes two sets of loading fibers 304. However, unlike FIG. 45, the two sets of loading fibers 304 are not arranged as a grid but instead are arranged as a vertical array 840 that has two different layers of loading fibers 304. Conductors 302 are wound around or coupled to a loading fiber 304 of the first layer and a loading fiber 304 of the second layer, as can be seen in FIG. 46. The multi-layer vertical array 840 has the ability to provide accurate vertical positioning of the contact interface and contact force redundancy in case of loading fiber failure. This multilayer array 840 can also help with positive alignment with shaped contacts 824 (see FIG. 42), and the array 840 can be multi-layered in the horizontal direction as well as the vertical direction shown. For example, a horizontal array 840 could provide greater redundancy and lower tension in each adjacent loading fiber 304 (both coupled to a conductor 302) for the same effective normal contact force.

One of the inherent problems with contact sockets is the tendency for dirt and solder contaminants to build up on the contact interface. Cleaning this interface can be very difficult and time consuming. In certain exemplary embodiments, the loading fibers 304 of device 800 are coupled to a high-frequency modulator that is capable of exciting the loading fibers 304 (and thus the conductors 302 which are coupled to the loading fibers 304) at a fundamental frequency. The high-frequency modulator, for example, could be comprised of a frequency generator which is coupled to a small piezoelectric actuator. The resulting vibration can clean contamination build up from the contact points of device 800. The cleaning may be done after a fixed number of cycles depending on the type of devices and interface quality.

In accordance with teachings of the present disclosure, devices can be implemented as burn-in sockets, test sockets or in any application where frequent replacement of the electrical component may be required. Furthermore, the devices of the present disclosure can be utilized to test and/or mounted integrated circuits and cable-to-board and board-to-board connection systems, amongst others.

Having thus described various illustrative embodiments and aspects thereof, modifications and alterations may be apparent to those of skill in the art. Such modifications and alterations are intended to be included in this disclosure, which is for the purpose of illustration only, and is not intended to be limiting. The scope of the invention should be determined from proper construction of the appended claims, and their equivalents.

What is claimed is:

1. A method for establishing electrical connections between a first electrical component and a second electrical component, wherein said first electrical component includes at least one conductor and at least one loading fiber and said second electrical component includes at least one contact, said method comprising:

coupling said at least one conductor to said at least one loading fiber;

placing a tensioning guide between and mechanically separate from a first conductor and a second conductor, wherein said at least one loading fiber is in contact with said tensioning guide when said first electrical component is engaged with said second electrical component; and engaging said first electrical component with said second electrical component so that said at least one contact of said second electrical component causes a deflection of at least a portion of said at least one loading fiber of said first electrical component, wherein said deflection causes said at least one loading fiber to exert a force that maintains said at least one conductor against said at least one contact.

2. The method of claim 1, wherein said coupling of said at least one conductor to said at least one loading fiber comprises winding said at least one conductor around a portion of said at least one loading fiber.

3. The method of claim 1, further comprising:
coupling an end of said at least one loading fiber to a tensioning spring.

4. The method of claim 1, further comprising:
arranging a plurality of loading fibers as a grid having a plurality of intersections, wherein said at least one conductor is coupled to at least one loading fiber at or near an intersection.

5. The method of claim 1, further comprising:
arranging a plurality of loading fibers as an array having at least two layers of loading fibers, wherein said at least one conductor is coupled to a loading fiber of a first layer and to a loading fiber of a second layer.

6. The method of claim 1, further comprising:
disposing an insulator between a first conductor and a second conductor.

7. A method for establishing electrical connections between a test device and an electrical component, wherein said test device includes a plurality of conductors and at least one loading fiber and said electrical component includes a plurality of contacts, said method comprising:

coupling said plurality of conductors to said at least one loading fiber;

placing a tensioning guide between and mechanically separate from a first conductor and a second conductor, wherein said at least one loading fiber is in contact with said tensioning guide when said test device is engaged with said electrical component; and engaging said test device with said electrical component so that said plurality of contacts of said electrical component causes a deflection of at least a portion of said at least one loading fiber of said test device, wherein said deflection causes said at least one loading fiber to exert a force that maintains said plurality of conductors against said plurality of contacts.

8. The method of claim 7, wherein said test device is capable of testing the electrical integrity or functionality of said electrical component.

9. The method of claim 7, wherein said coupling of said plurality of conductors to said at least one loading fiber comprises winding said plurality of conductors around a portion of said at least one loading fiber.

10. The method of claim 7, further comprising:
coupling an end of said at least one loading fiber to a tensioning spring.

11. The method of claim 7, further comprising:
arranging a plurality of loading fibers as a grid having a plurality of intersections, wherein said plurality of conductors are coupled to at least one loading fiber at or near an intersection.

12. The method of claim 7, further comprising:
arranging a plurality of loading fibers as an array having at least two layers of loading fibers, wherein each conductor is coupled to a loading fiber of a first layer and to a loading fiber of a second layer.

* * * * *